US010748479B2

(12) United States Patent
Kurokawa

(10) Patent No.: US 10,748,479 B2
(45) Date of Patent: Aug. 18, 2020

(54) SEMICONDUCTOR DEVICE, DISPLAY SYSTEM, AND ELECTRONIC DEVICE

(71) Applicant: Semiconductor Energy Laboratory Co., Ltd., Kanagawa-ken (JP)

(72) Inventor: Yoshiyuki Kurokawa, Kanagawa (JP)

(73) Assignee: Semiconductor Energy Laboratories Co., Ltd. (JP)

( * ) Notice: Subject to any disclaimer, the term of this patent is extended or adjusted under 35 U.S.C. 154(b) by 0 days.

(21) Appl. No.: 16/465,244

(22) PCT Filed: Nov. 29, 2017

(86) PCT No.: PCT/IB2017/057473
§ 371 (c)(1),
(2) Date: May 30, 2019

(87) PCT Pub. No.: WO2018/104824
PCT Pub. Date: Jun. 14, 2018

(65) Prior Publication Data
US 2019/0333445 A1    Oct. 31, 2019

(30) Foreign Application Priority Data

Dec. 7, 2016    (JP) .................................. 2016-237876

(51) Int. Cl.
*G09G 3/3225*    (2016.01)
*G09G 3/3266*    (2016.01)
(Continued)

(52) U.S. Cl.
CPC ......... *G09G 3/3225* (2013.01); *G09G 3/3266* (2013.01); *G09G 3/3275* (2013.01);
(Continued)

(58) Field of Classification Search
CPC .. G09G 3/3225; G09G 3/3266; G09G 3/3275; G09G 3/20; G09G 2300/0408;
(Continued)

(56) References Cited

U.S. PATENT DOCUMENTS

2004/0041762 A1\* 3/2004 Naiki ................... G09G 3/3696
345/87
2006/0139296 A1 6/2006 Naiki et al.
(Continued)

FOREIGN PATENT DOCUMENTS

CN     001489124 A    4/2004
CN     101950532 A    1/2011
(Continued)

OTHER PUBLICATIONS

International Serach Report re Application No. PCT/IB2017/057473, dated Mar. 27, 2018.
(Continued)

*Primary Examiner* — Ryan A Lubit
(74) *Attorney, Agent, or Firm* — Husch Blackwell LLP

(57) ABSTRACT

A novel semiconductor device or a novel display system is provided. A signal generation portion monitors display conditions and controls the potentials output from a power supply circuit, in accordance with the display conditions. Specifically, a controller changes the parameter stored in a memory device when display conditions change. Then, the power supply circuit generates the potentials with the use of the changed parameter. Accordingly, the voltage applied to a light-emitting element can be controlled in accordance with the display conditions, which reduces the power consumption in a display portion.

7 Claims, 28 Drawing Sheets

(51) Int. Cl.
*G09G 3/3275* (2016.01)
*H01L 27/02* (2006.01)
*H01L 29/786* (2006.01)

(52) U.S. Cl.
CPC ........ *H01L 27/0203* (2013.01); *H01L 29/786* (2013.01); *G09G 2300/0408* (2013.01); *G09G 2300/0439* (2013.01); *G09G 2310/0286* (2013.01); *G09G 2320/0673* (2013.01); *G09G 2360/144* (2013.01)

(58) Field of Classification Search
CPC ... G09G 2300/0439; G09G 2310/0286; G09G 2310/0294; G09G 2320/0673; G09G 2360/144; G09G 2230/00; G09G 2330/021; H01L 27/0203; H01L 27/1225; H01L 29/786
See application file for complete search history.

(56) References Cited

U.S. PATENT DOCUMENTS

| | | | |
|---|---|---|---|
| 2007/0072439 A1 | 3/2007 | Akimoto et al. | |
| 2011/0007101 A1* | 1/2011 | Mori | G09G 3/3208 345/690 |
| 2013/0038790 A1* | 2/2013 | Seetzen | H04N 9/67 348/453 |
| 2013/0120656 A1* | 5/2013 | Wilson | G06F 3/1462 348/563 |
| 2013/0134416 A1 | 5/2013 | Nishijima et al. | |
| 2016/0195916 A1* | 7/2016 | Shiozaki | G06F 1/3265 348/333.13 |
| 2017/0039970 A1 | 2/2017 | Nishijima et al. | |

FOREIGN PATENT DOCUMENTS

| | | |
|---|---|---|
| EP | 2 284 824 A2 | 2/2011 |
| JP | 2003-098984 A | 4/2003 |
| JP | 2004-085858 A | 3/2004 |
| JP | 2007-096055 | 4/2007 |
| JP | 2007-123861 | 5/2007 |
| JP | 2008-083085 A | 4/2008 |
| JP | 2009-109876 A | 5/2009 |
| JP | 2011-017997 A | 1/2011 |
| JP | 2013-137532 A | 7/2013 |
| KR | 2011-0005639 A | 1/2011 |
| KR | 2014-0096330 A | 8/2014 |
| WO | WO 2013/080931 A1 | 6/2013 |

OTHER PUBLICATIONS

Written Opinion re Application No. PCT/IB2017/057473, dated Mar. 27, 2018.

* cited by examiner

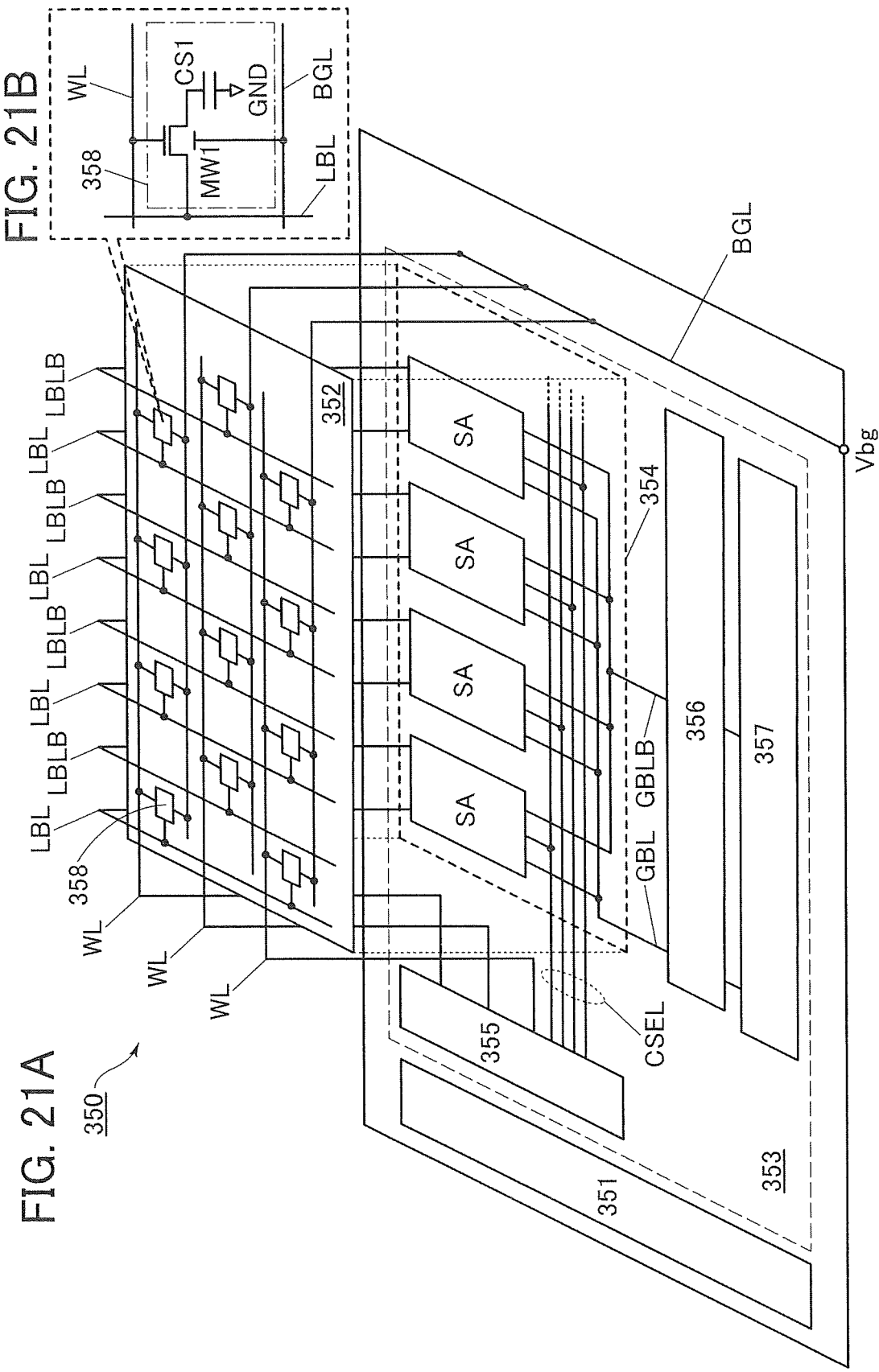

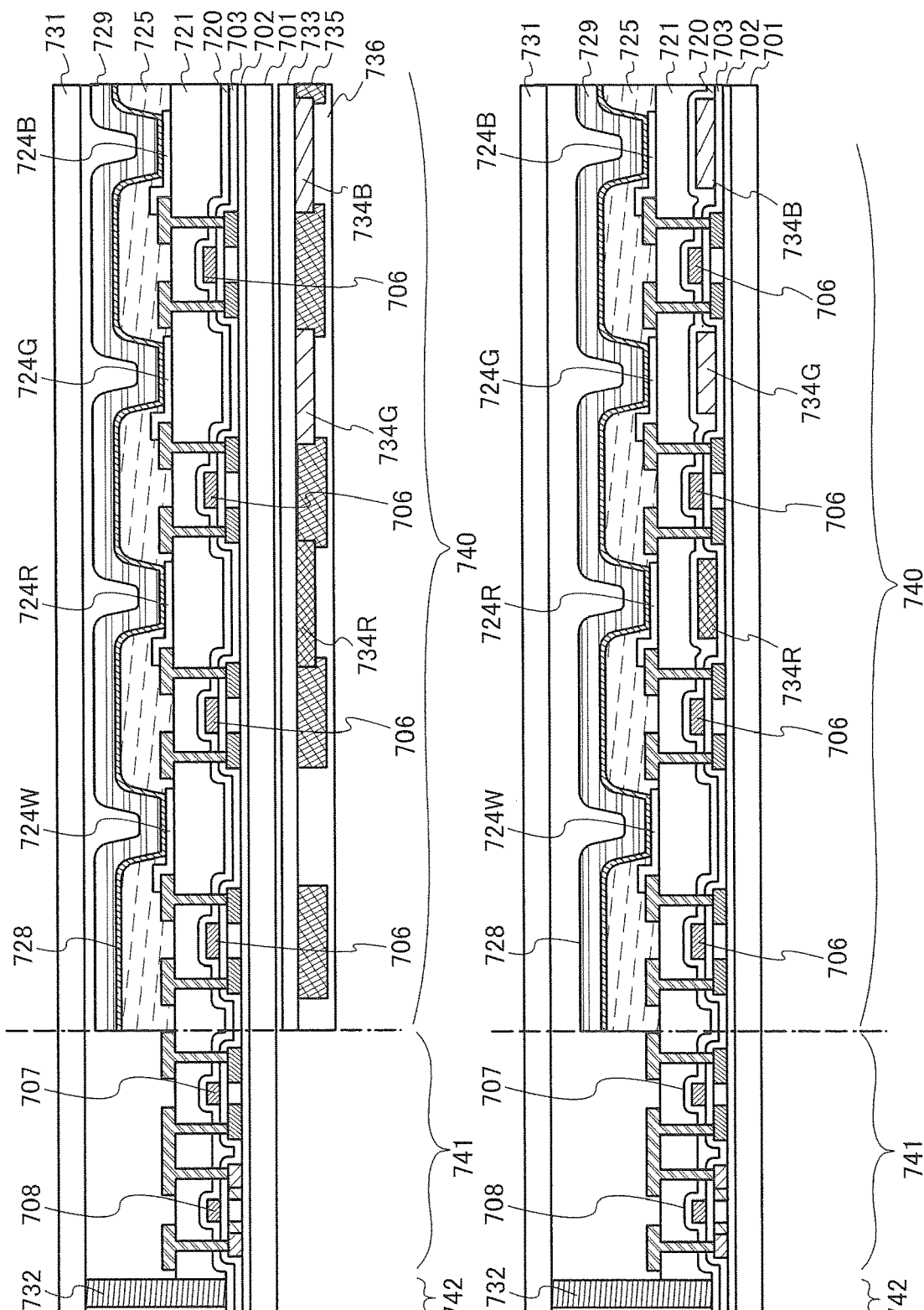

FIG. 26A
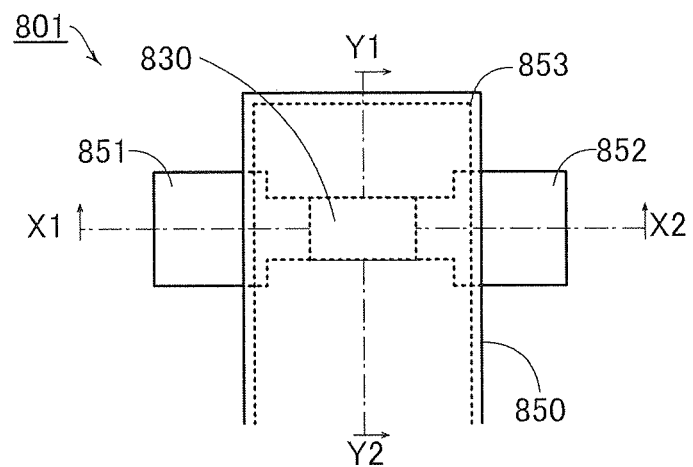
FIG. 26B
FIG. 26C
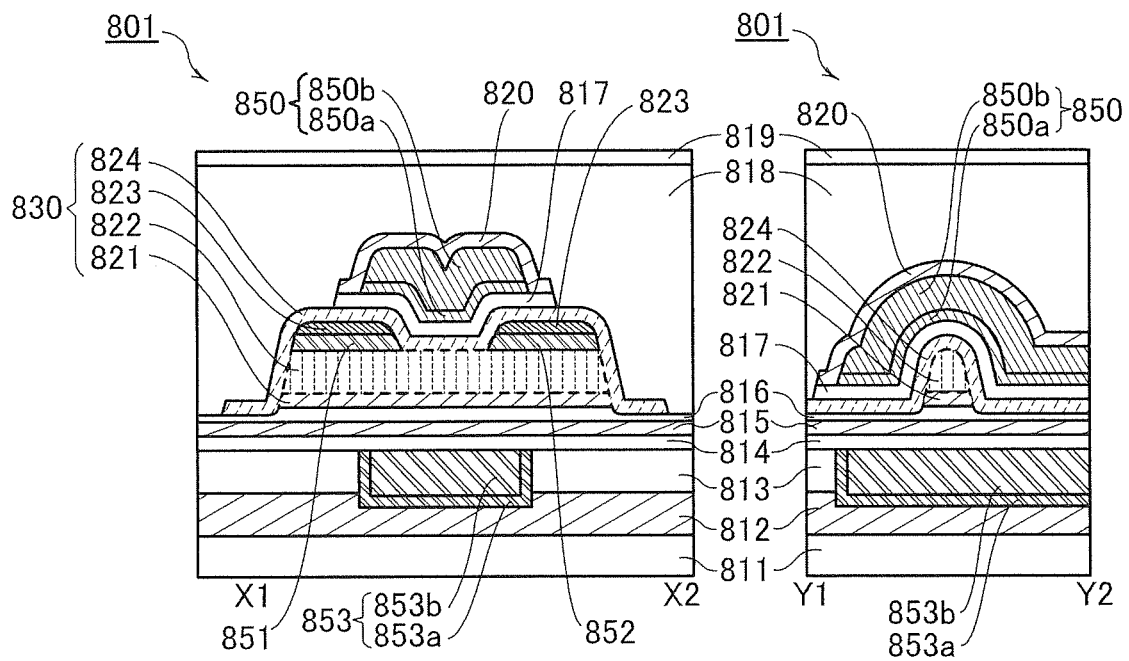

SEMICONDUCTOR DEVICE, DISPLAY SYSTEM, AND ELECTRONIC DEVICE

This application is a 371 of international application PCT/IB2017/057473 filed on Nov. 29, 2017 which is incorporated herein by reference.

TECHNICAL FIELD

One embodiment of the present invention relates to a semiconductor device, a display system, and an electronic device.

One embodiment of the present invention is not limited to the above technical field. Examples of the technical field of one embodiment of the present invention disclosed in this specification and the like include a semiconductor device, a display device, a light-emitting device, a power storage device, a memory device, a display system, an electronic device, a lighting device, an input device, an input/output device, a driving method thereof, and a manufacturing method thereof.

In this specification and the like, a semiconductor device generally means a device that can function by utilizing semiconductor characteristics. A transistor, a semiconductor circuit, an arithmetic device, a memory device, and the like are each an embodiment of the semiconductor device. In addition, an imaging device, an electro-optical device, a power generation device (e.g., a thin film solar cell and an organic thin film solar cell), and an electronic device each may include a semiconductor device.

BACKGROUND ART

Flat panel displays typified by liquid crystal display devices and light-emitting display devices are widely used for displaying images. Although the transistors used in these display devices are mainly manufactured using silicon semiconductors, attention has been recently drawn to a transistor manufacturing technique that uses a metal oxide exhibiting semiconductor characteristics instead of a silicon semiconductor. For example, in Patent Documents 1 and 2, a technique is disclosed in which a transistor manufactured using zinc oxide or an In—Ga—Zn-based oxide as a semiconductor layer is used in a pixel of a display device.

REFERENCE

Patent Document

[Patent Document 1] Japanese Published Patent Application No. 2007-096055
[Patent Document 2] Japanese Published Patent Application No. 2007-123861

DISCLOSURE OF INVENTION

An object of one embodiment of the present invention is to provide a novel semiconductor device or a novel display system. Another object of one embodiment of the present invention is to provide a semiconductor device or a display system which has low power consumption. Another object of one embodiment of the present invention is to provide a semiconductor device or a display system capable of displaying an image with high visibility.

One embodiment of the present invention does not necessarily achieve all the objects listed above and only needs to achieve at least one of the objects. The description of the above objects does not preclude the existence of other objects. Other objects will be apparent from and can be derived from the description of the specification, the drawings, the claims, and the like.

One embodiment of the present invention is a semiconductor device that includes a signal generation portion including a power supply circuit, an image processing circuit, a memory device, and a controller, and a display portion. The power supply circuit has a function of generating a potential to be supplied to a light-emitting element provided in the display portion. The image processing circuit has a function of performing image processing on image data. The memory device has a function of storing a first parameter and a second parameter. The controller has a function of changing the first parameter and the second parameter stored in the memory device, in accordance with a display condition of an image displayed on the display portion. The power supply circuit has a function of generating the potential with use of the first parameter output from the memory device. The image processing circuit has a function of performing the image processing with use of the second parameter output from the memory device.

In the semiconductor device of one embodiment of the present invention, the memory device may include a first register portion and a second register portion. First data corresponding to the first parameter and second data corresponding to the second parameter may be sequentially input to the second register portion. The second register portion may have a function of transmitting the first data and the second data to the first register portion at one time. The first register portion may have a function of outputting the first data to the power supply circuit and outputting the second data to the image processing circuit at one time.

In the semiconductor device of one embodiment of the present invention, the second register portion may include a transistor and a capacitor. One of a source and a drain of the transistor may be electrically connected to the capacitor. The transistor may include a metal oxide in a channel formation region.

In the semiconductor device of one embodiment of the present invention, the image processing circuit may have a function of performing the image processing with use of a dimming circuit, a toning circuit, and a gamma correction circuit. The second parameter may be used in the dimming circuit, the toning circuit, and the gamma correction circuit.

In the semiconductor device of one embodiment of the present invention, each of the first parameter and the second parameter may be changed in accordance with at least one of the intensity of external light, the content of an image displayed on the display portion, and setting by the user who views the image.

Another embodiment of the present invention is a display system that includes the above semiconductor device. The display portion includes a first display unit including a first pixel and a second display unit including a second pixel. The first pixel includes the light-emitting element. The second pixel includes a reflective liquid crystal element.

Another embodiment of the present invention is an electronic device that includes the above display system and a host. The host includes a processor having a function of controlling operation of the signal generation portion.

According to one embodiment of the present invention, a novel semiconductor device or a novel display system can be provided. According to one embodiment of the present invention, a semiconductor device or a display system which has low power consumption can be provided. According to one embodiment of the present invention, a semiconductor device or a display system capable of displaying an image with high visibility can be provided.

Note that the description of these effects does not preclude the existence of other effects. One embodiment of the present invention does not necessarily have all of these effects. Other effects will be apparent from and can be derived from the description of the specification, the claims, the drawings, and the like.

BRIEF DESCRIPTION OF DRAWINGS

FIGS. 21A and 21B illustrate a configuration example of a memory device.

FIGS. 23A and 23B each illustrate a structure example of a display device.

FIGS. 26A to 26C illustrate a structure example of a transistor.

BEST MODE FOR CARRYING OUT THE INVENTION

Figure 1:
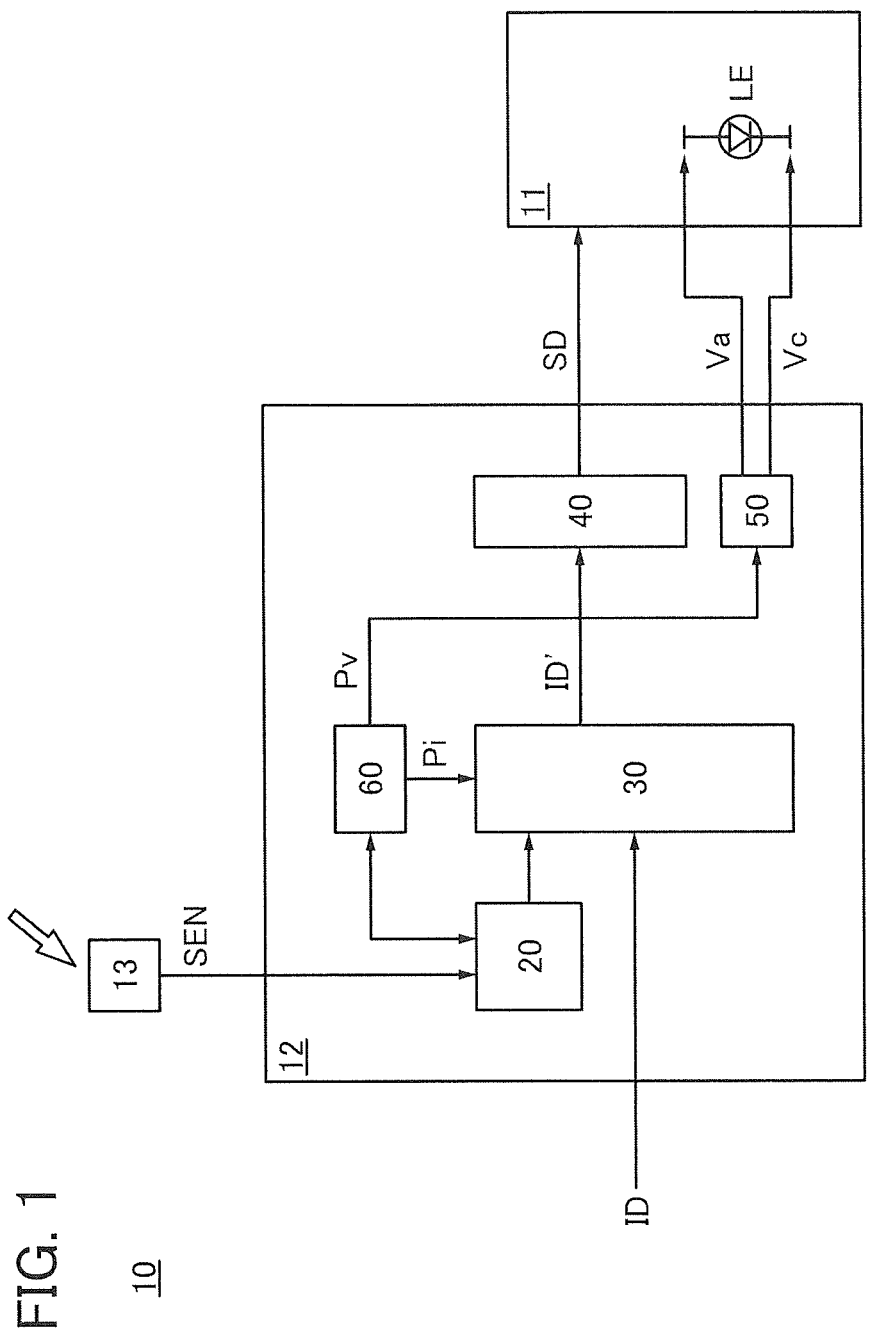
FIG. 1 illustrates a configuration example of a display system.

Embodiments of the present invention will be described below in detail with reference to the accompanying drawings. Note that one embodiment of the present invention is not limited to the following description of the embodiments and it is easily understood by those skilled in the art that the mode and details can be variously changed without departing from the spirit and scope of the present invention. Therefore, the present invention should not be interpreted as being limited to the description of the embodiments below.

One embodiment of the present invention includes, in its category, devices such as a semiconductor device, a memory device, a display device, an imaging device, and a radio frequency (RF) tag. The display device includes, in its category, a liquid crystal display device, a light-emitting device including pixels each provided with a light-emitting element typified by an organic light-emitting element, electronic paper, a digital micromirror device (DMD), a plasma display panel (PDP), a field emission display (FED), and the like.

In this specification and the like, a metal oxide means an oxide of a metal in a broad sense. Metal oxides are classified into an oxide insulator, an oxide conductor (including a transparent oxide conductor), an oxide semiconductor (also simply referred to as an OS), and the like. For example, a metal oxide used in a channel formation region of a transistor is called an oxide semiconductor in some cases. That is, a metal oxide that has at least one of an amplifying function, a rectifying function, and a switching function can be called a metal oxide semiconductor, or OS for short. In the following description, a transistor including a metal oxide in a channel formation region is also referred to as an OS transistor.

In this specification and the like, a metal oxide including nitrogen is also called a metal oxide in some cases. Moreover, a metal oxide including nitrogen may be called a metal oxynitride. The details of a metal oxide are described later.

Furthermore, in this specification and the like, an explicit description "X and Y are connected" means that X and Y are electrically connected, X and Y are functionally connected, and X and Y are directly connected. Accordingly, the connection relation is not limited to a predetermined connection relation, for example, a connection relation shown in drawings or text, and a different connection relation is also indicated by the drawings or the text. Here, X and Y each denote an object (e.g., a device, an element, a circuit, a wiring, an electrode, a terminal, a conductive film, or a layer).

Examples of the case where X and Y are directly connected include the case where an element that allows an electrical connection between X and Y (e.g., a switch, a transistor, a capacitor, an inductor, a resistor, a diode, a display element, a light-emitting element, or a load) is not connected between X and Y, and the case where X and Y are connected without the element that allows the electrical connection between X and Y provided therebetween.

For example, in the case where X and Y are electrically connected, one or more elements that enable an electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, the switch has a function of controlling the flow of current when turned on and off. Alternatively, the switch has a function of selecting and changing a current path. Note that the case where X and Y are electrically connected includes the case where X and Y are directly connected.

For example, in the case where X and Y are functionally connected, one or more circuits that enable a functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up converter circuit or a step-down converter circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. For example, even when another circuit is interposed between X and Y, X and Y are functionally connected if a signal output from X is transmitted to Y. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

In addition, components denoted by the same reference numerals in different drawings represent the same components unless otherwise specified.

Even when independent components are electrically connected to each other in the drawing, one component has functions of a plurality of components in some cases. For example, when part of a wiring also functions as an electrode, one conductive film functions as a wiring and an electrode. Thus, "electrical connection" in this specification includes, in its category, such a case where one conductive film has functions of a plurality of components.

Embodiment 1

In this embodiment, a semiconductor device and a display system of one embodiment of the present invention are described.

<Configuration Example of Display System>

FIG. 1 illustrates a configuration example of a display system 10. The display system 10 generates a signal for displaying an image on the basis of data input from the outside (hereinafter this signal is also referred to as a video signal) and displays an image on the basis of the video signal. The display system 10 includes a display portion 11 and a signal generation portion 12.

The display portion 11 displays an image on the basis of a video signal (a signal SD) input from the signal generation portion 12. Specifically, the display portion 11 includes a plurality of light-emitting elements LE. The plurality of light-emitting elements LE emit light with the respective luminances, i.e., display the respective gray levels, so that an image is displayed on the display portion 11.

Examples of the light-emitting element LE include self-luminous elements such as an organic light-emitting diode (OLED), a light-emitting diode (LED), a quantum-dot light-emitting diode (QLED), and a semiconductor laser.

The light-emitting element LE has a pair of electrodes. A potential Va and a potential Vc (<Va) are supplied to one electrode of the light-emitting element LE and the other electrode of the light-emitting element LE, respectively, from the signal generation portion 12. By application of the voltage Va-Vc between the pair of electrodes, current flows in the light-emitting element LE to make the light-emitting element LE emit light. The amount of current flowing in the light-emitting element LE is controlled on the basis of the signal SD, whereby the light-emitting element LE displays a predetermined gray level.

Note that the amount of current flowing in the light-emitting element LE can be controlled with the use of a transistor. For example, one of a source and a drain of the transistor is connected to one electrode of the light-emitting element LE and the voltage Va-Vc is applied between the other of the source and the drain of the transistor and the other electrode of the light-emitting element LE. When a potential corresponding to the signal SD is applied to a gate of the transistor, current corresponding to the signal SD can flow in the light-emitting element LE. In that case, the transistor preferably operates in a saturation region.

The signal generation portion 12 generates a video signal on the basis of data ID (hereinafter also referred to as image data) corresponding to an image to be displayed on the display portion 11 and outputs the video signal to the display portion 11 as the signal SD. The signal generation portion 12 includes a controller 20, an image processing circuit 30, a driver circuit 40, a power supply circuit 50, and a memory circuit 60. Note that the signal generation portion 12 can include a semiconductor device and can be called a semiconductor device. The circuits included in the signal generation portion 12 can be integrated into one integrated circuit. In that case, the signal generation portion 12 can be called an integrated circuit.

The controller 20 controls operation of the circuits included in the signal generation portion 12. Specifically, the controller 20 generates a control signal for controlling operation of the image processing circuit 30, the memory circuit 60, and the like.

The image processing circuit 30 performs image processing on the data ID that is input as image data. Specifically, the image processing circuit 30 corrects the data ID by performing various kinds of correction on the data ID. The image data corrected by the image processing circuit 30 is output to the driver circuit 40 as data ID'. Examples of the correction processing by the image processing circuit 30 include processing for adjusting the brightness of an image displayed on the display portion 11 (dimming), processing for adjusting the tone of an image displayed on the display portion 11 (toning), and gamma correction.

The driver circuit 40 generates a video signal on the basis of the data ID' input from the image processing circuit 30. Specifically, the driver circuit 40 generates the signal SD in accordance with a standard for data transmission between the driver circuit 40 and the display portion 11, such as LVDS, MIPI, and eDP. The signal SD generated by the driver circuit 40 is output to the display portion 11 and is used to control light emission by the light-emitting element LE.

In the case where the data ID' is input to the driver circuit 40 as digital data, the driver circuit 40 may have a function of converting the data ID' into an analog signal with the use of a digital analog (D/A) converter circuit. The driver circuit 40 may have a function of amplifying the analog signal with the use of an analog buffer or the like.

The power supply circuit 50 generates a potential to be supplied to the light-emitting element LE. Specifically, the power supply circuit 50 generates the potentials Va and Vc on the basis of data input from the memory circuit 60 and supplies these potentials to the light-emitting element LE. For example, the potential Va is supplied to an anode of the light-emitting element LE and the potential Vc is supplied to a cathode of the light-emitting element LE.

The memory circuit 60 stores data that is used for operation of the signal generation portion 12, and is used as a register. Specifically, the memory circuit 60 stores, for example, data that is used for various kinds of processing by the controller 20, a parameter that is used for image processing by the image processing circuit 30, and a parameter that is used for generation of the potentials Va and Vc by the power supply circuit 50.

The memory circuit 60 outputs the parameter used for image processing to the image processing circuit 30 as data Pi. The image processing circuit 30 performs image processing on the data ID on the basis of the data Pi. Furthermore, the memory circuit 60 outputs the parameter used for generating the potentials Va and Vc to the power supply circuit 50 as data Pv. The power supply circuit 50 generates the potentials Va and Vc on the basis of the data Pv. Thus, by changing the parameters stored in the memory circuit 60, the content of the image processing by the image processing circuit 30 and the potentials Va and Vc generated by the power supply circuit 50 can be controlled.

The voltage Va-Vc between the pair of electrodes of the light-emitting element LE needs to be set to a value that allows the light-emitting element LE to display all the gray levels that may be specified with the signal SD. That is, the potentials Va and Vc are set to values that allow the light-emitting element LE to emit light with the highest luminance of all the possible luminances for displaying an image. Furthermore, the luminance of the light-emitting element LE used to display an image depends on the conditions under which the image is displayed (hereinafter referred to as "display conditions"), such as the intensity of the external light, the content of an image (e.g., a background, a photograph, or a moving image), and setting by the user who views the image. Therefore, when set to specific values, the potentials Va and Vc need to be set to the values that allow the light-emitting element LE to display the maximum gray level regardless of display conditions. In that case, the light-emitting element LE keeps on being supplied with the potential Va and the potential Vc for achieving a high luminance that is actually rarely used in displaying an image, increasing the power consumption in the display portion 11.

Here, the signal generation portion 12 in one embodiment of the present invention monitors the display conditions and controls the potentials Va and Vc output from the power supply circuit 50, in accordance with the display conditions. Specifically, the controller 20 changes the parameter stored in the memory circuit 60 when the display conditions change. Then, the power supply circuit 50 generates the potentials Va and Vc with the use of the changed parameter. Accordingly, the voltage applied to the light-emitting element LE can be controlled in accordance with the display conditions, which reduces the power consumption in the display portion 11.

The method for monitoring the display conditions is not limited. For example, the display conditions can be monitored by detecting the intensity of the external light or by determining the content of an image with the use of the controller 20 on the basis of a signal (e.g., the data ID) input from the outside. In the case where the potentials Va and Vc are controlled in accordance with the intensity of the external light, in response to an increase in the intensity of the external light, the voltage Va-Vc is raised so that the light-emitting element LE can emit light with a higher luminance; in response to a decrease in the intensity of the external light, the voltage Va-Vc is lowered since the luminance of the light emitted by the light-emitting element LE does not need to be so high. When still images such as a background and a photograph are displayed, the highest luminance used for display is determined for each still image, so that the voltage Va-Vc can be set for each still image. When a moving image is displayed, the highest luminance used for display is determined for each predetermined display period, so that the voltage Va-Vc can be switched every predetermined display period. Furthermore, when certain conditions (e.g., lightness, chroma, and contrast) are specified in accordance with the preference of the user who views an image, the voltage Va-Vc can be set under the specified conditions.

As an example, the configuration in which the controller 20 controls the potentials Va and Vc in accordance with the intensity of the external light is described. The display system 10 illustrated in FIG. 1 includes a sensor portion 13. The sensor portion 13 detects light intensity. Specifically, the sensor portion 13 detects the external light and outputs a signal SEN that depends on the intensity of the external light to the signal generation portion 12. The signal SEN is input to the controller 20, and the controller 20 recognizes a change in the intensity of the external light in accordance with the signal SEN.

In response to a change in the intensity of the external light, the controller 20 changes the parameter stored in the memory circuit 60 in accordance with the intensity of the external light. In response to the change in the parameter stored in the memory circuit 60, the data Pv that depends on the intensity of the external light is supplied to the power supply circuit 50. Then, the power supply circuit 50 generates the potentials Va and Vc in accordance with the newly input data Pv. In this manner, the voltage applied to the light-emitting element LE is changed in accordance with the intensity of the external light.

When the intensity of the external light increases, e.g., when the display system 10 is brought from indoors to outdoors in the daytime, the voltage Va-Vc is increased to widen the range of the luminance of the light-emitting element LE, whereby an image can be displayed with a high luminance. In this manner, a highly viewable image can be displayed even in the outdoors under intense external light. In contrast, when the intensity of the external light decreases, e.g., when the display system 10 is brought from outdoors to indoors in the daytime, the voltage Va-Vc is decreased to reduce the voltage applied to the light-emitting element LE, leading to reduced power consumption.

So that an image can be appropriately displayed at the time of switching the potentials Va and Vc, the parameter of the image processing by the image processing circuit 30 needs to be modified in accordance with the changed potentials Va and Vc. For this reason, the controller 20 also changes the parameter to be used in the image processing circuit 30 in accordance with the changed parameter to be used in the power supply circuit 50. Accordingly, the image processing circuit 30 can perform image processing in accordance with the changed potentials Va and Vc. Examples of the parameter of the image processing include those used for dimming, toning, and gamma correction. Note that when a transistor that operates in a saturation region is used to control the light-emitting element LE, the potentials Va and Vc can be switched without modifying the parameter of the image processing.

As described above, in the display system 10, the voltage applied to the light-emitting element LE can be controlled in accordance with a change in display conditions. Thus, power consumption can be reduced without compromising image viewability.

<Operation Example of Display System>

Figure 2:
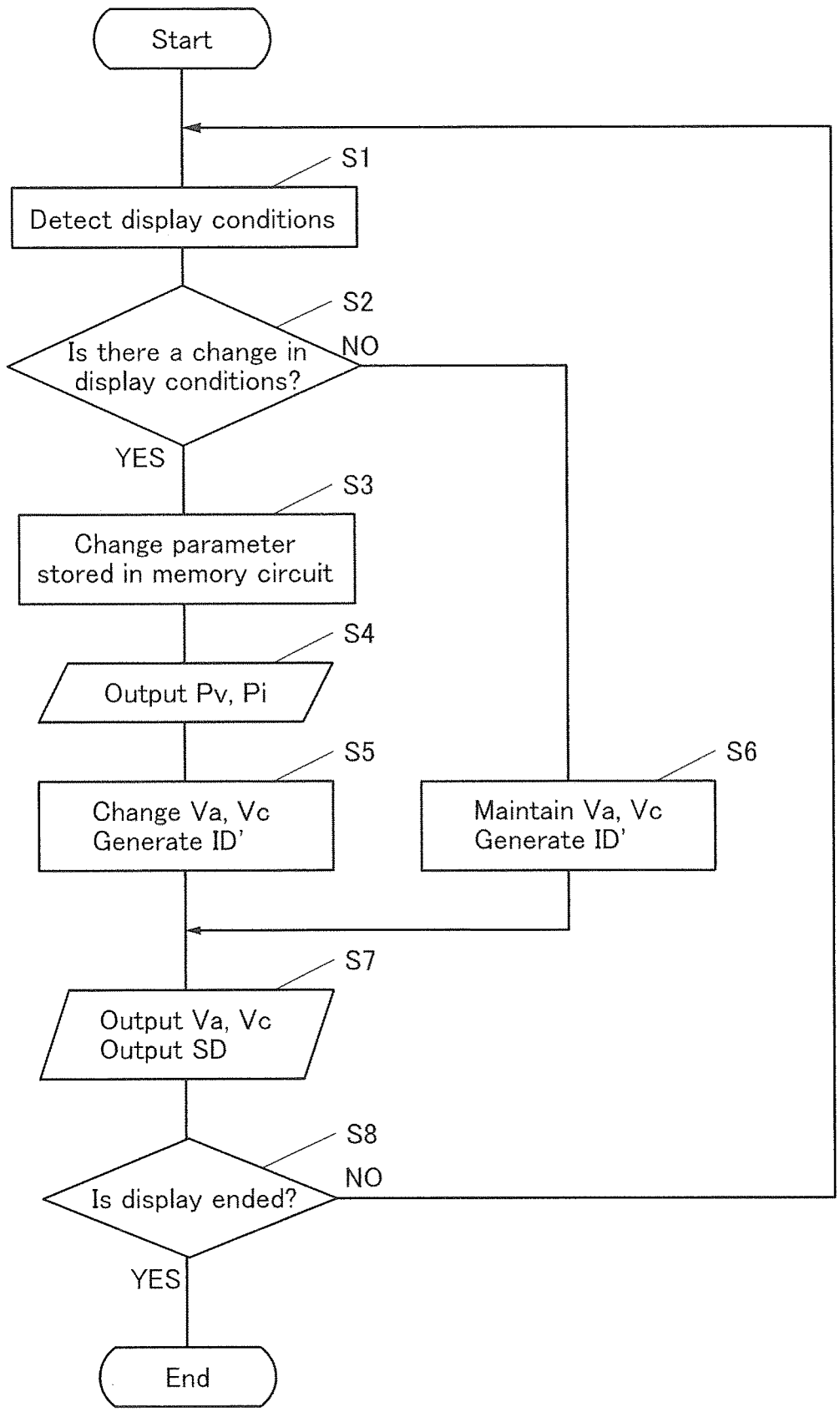
FIG. 2 is a flow chart.

Next, a specific operation example of the display system 10 is described. FIG. 2 is a flow chart showing an operation example of the display system 10.

First, display conditions are detected with the use of the controller 20, the sensor portion 13, or the like (step S1). When there is a change in the display conditions or when the amount of change in the display conditions is larger than or equal to a reference value (YES in step S2), the controller 20 changes the parameter stored in the memory circuit 60 in accordance with the display conditions (step S3).

Here, the controller 20 changes the parameter to be used in the image processing circuit 30 as well as the parameter to be used in the power supply circuit 50. The parameter to be used in the image processing circuit 30 is changed in accordance with the change in the parameter to be used in the power supply circuit 50.

When the parameter stored in the memory circuit 60 is changed, the data Pv corresponding to the changed parameter is output from the memory circuit 60 to the power supply circuit 50, and the data Pi corresponding to the changed parameter is output from the memory circuit 60 to the image processing circuit 30 (step S4). Then, the power supply circuit 50 changes the potentials Va and Vc in accordance with the data Pv, and the image processing circuit 30 corrects the data ID in accordance with the data Pi to generate the data ID' (step S5).

In contrast, when there is no change in the display conditions or when the amount of change in the display conditions is smaller than the reference value (NO in step S2), no parameter stored in the memory circuit 60 is changed. Accordingly, the potentials Va and Vc generated by the power supply circuit 50 are maintained and the image processing circuit 30 generates the data ID' with the use of the unchanged parameter (step S6).

Then, the potentials Va and Vc and the signal SD that is generated in accordance with the data ID' are output from the signal generation portion 12 to the display portion 11 (step S7). As a result, the voltage Va-Vc is applied to the light-emitting element LE and the current flowing in the light-emitting element LE is controlled with the signal SD.

After that, when the image display continues (NO in step S8), the display conditions are detected again (step S1).

By the above-described operation, the display system 10 can control the voltage applied to the light-emitting element LE in accordance with the display conditions and modify the content of image processing in accordance with the controlled voltage. Therefore, power consumption can be reduced while high viewability of images is maintained.

<Image Processing Circuit>

Next, a specific example of correction processing in the image processing circuit 30 is described. In the correction processing in the image processing circuit 30, input image data X is corrected (e.g., dimmed, toned, or gamma corrected) and correction data Y is generated. Although any method can be employed for the correction depending on the content or accuracy of the correction, correction by a table method and correction by a function approximation method are described here as examples.

Figure 3A:
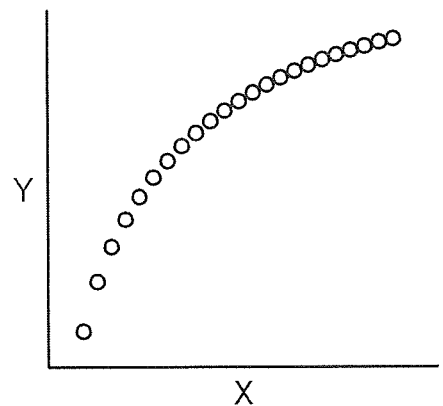
FIGS. 3A and 3B show examples of correction.

In a table method, as illustrated in FIG. 3A, the correction data Y corresponding to the image data X that may be input to the image processing circuit 30 is prepared in advance, and the correction data Y corresponding to the input image data X is output. When this method is employed, a look-up table that lists the correspondence between the image data X and the correction data Y is stored in the memory circuit 60 as a parameter.

Since a look-up table is used in a table method, a relatively large number of parameters are necessary for correction. However, the correction data Y corresponding to the image data X can be independently set, which leads to high-accuracy correction. Note that upon determination of the look-up table used for correction, the maximum value of correction data is determined (the maximum value of Y in FIG. 3A). The potentials Va and Vc can be determined in accordance with the maximum value of the correction data. In this manner, at the time when the look-up table is changed in accordance with display conditions, the potentials Va and Vc can be determined at the same time.

Figure 3B:
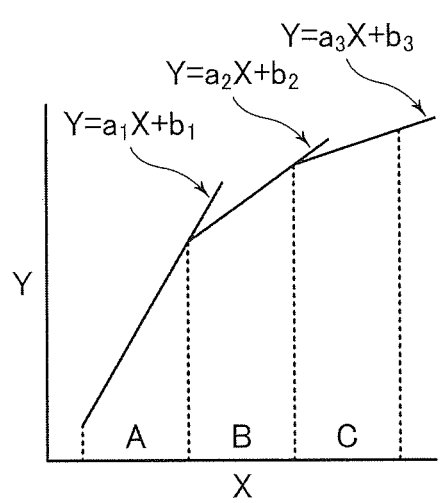

When the correction data Y corresponding to the image data X can be empirically determined in advance, in contrast, a function approximation method can be used. In a function approximation method, the range of the image data X that may be input to the image processing circuit 30 is divided into a plurality of regions, and the relation between the image data X and the correction data Y is defined with an approximate expression in each region. In FIG. 3B, the range of X is divided into regions A, B, and C, and the relation between the image data X and the correction data Y in each region is approximated with a straight line. When the image data X is input to the image processing circuit 30, the correction data Y is calculated on the basis of an approximate line of the region where the input image data X belongs.

When a function approximation method is used, which is shown in FIG. 3B, the number of divided regions, values $a_1$, $a_2$, $a_3$, $b_1$, $b_2$, and $b_3$ for defining straight lines, and the like are stored in the memory circuit 60 as correction parameters.

In a function approximation method, the correction data Y is calculated by approximation; thus, the accuracy of the correction by a function approximation method is lower than that of the correction by a table method. However, the number of parameters necessary for correction is smaller in a function approximation method than in a table approximation method, which can reduce the amount of data stored in the memory circuit 60 and reduce the area of the memory circuit 60, for example.

Note that the number of divided regions used in a function approximation method is not limited. The larger the number of divided regions is, the higher the accuracy of correction can be; the smaller the number of divided regions is, the easier the correction can be. Although approximation using a linear function is described here, approximation using a nonlinear function may be employed. Note that upon determination of the parameters $a_1$, $a_2$, $a_3$, $b_1$, $b_2$, and $b_3$ that define functions, the maximum value of correction data is determined (the maximum value of Y in FIG. 3B). Thus, the potentials Va and Vc can be determined in accordance with the maximum value of the correction data. In this manner, at the time when the parameters $a_1$, $a_2$, $a_3$, $b_1$, $b_2$, and $b_3$ and the like are changed in accordance with display conditions, the potentials Va and Vc can be determined at the same time.

As described above, the image processing circuit 30 performs correction processing with the use of the parameters stored in the memory circuit 60. Accordingly, by changing the parameters stored in the memory circuit 60 in accordance with display conditions, the content of the correction processing by the image processing circuit 30 can be modified.

<Power Supply Circuit>

Figure 4A:
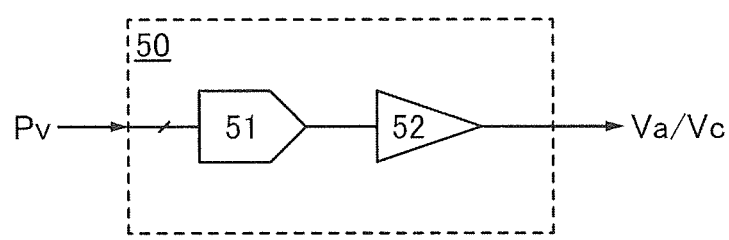
FIGS. 4A and 4B each illustrate a configuration example of a power supply circuit.

Next, a configuration example of the power supply circuit 50 is described. FIG. 4A illustrates a configuration example of the power supply circuit 50. The power supply circuit 50 includes a converter circuit 51 and an amplifier circuit 52, and generates a potential that corresponds to the data Pv input from the memory circuit 60.

The converter circuit 51 is a D/A converter circuit that converts the data Pv input as digital data into an analog potential. The potential generated by the converter circuit 51 is output to the amplifier circuit 52.

The amplifier circuit 52 amplifies the analog potential input from the converter circuit 51 and outputs the amplified analog potential. The potential output from the amplifier circuit 52 is supplied to the light-emitting element LE as the potential Va or the potential Vc.

The power supply circuit 50 may be a circuit that generates one of the potential Va and the potential Vc in accordance with the data Pv. In the case where the power supply circuit 50 controls one of the potentials Va and Vc, the other is fixed at a predetermined value, so that the voltage Va-Vc applied to the light-emitting element LE is controlled in accordance with an increase or a decrease in the one potential.

Figure 4B:
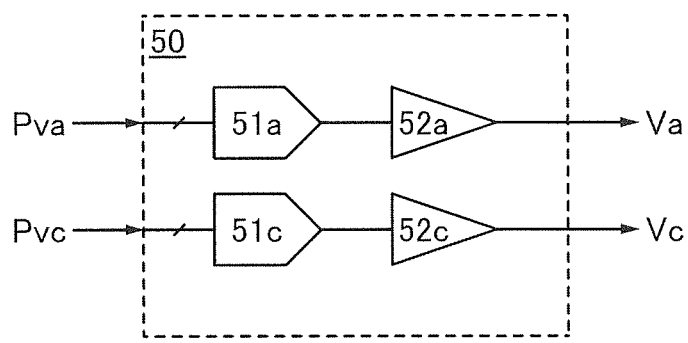

The power supply circuit 50 may be a circuit that generates both the potential Va and the potential Vc in accordance with the data Pv. In that case, the power supply circuit 50 can have the configuration of FIG. 4B, for example. The amplifier circuit illustrated in FIG. 4B includes converter circuits 51*a* and 51*b* and amplifier circuits 52*a* and 52*b*. The data Pv (Pva) for generating the potential Va is input to the converter circuit 51*a*, and the potential Va is output from the amplifier circuit 52*a*. The data Pv (Pvc) for generating the potential Vc is input to the converter circuit 51*b*, and the potential Vc is output from the amplifier circuit 52*b*. With the use of such a configuration, the potential Va and the potential Vc can be independently controlled.

<Configuration Example of Memory Circuit>

Figure 5:
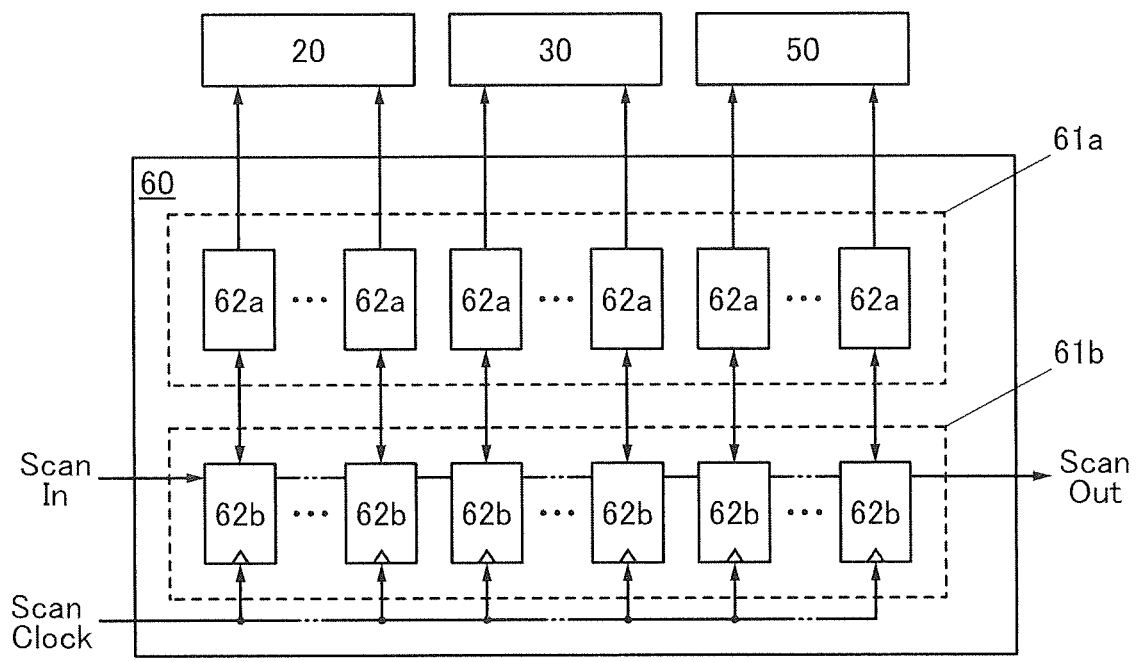
FIG. 5 illustrates a configuration example of a memory device.

Next, a configuration example of the memory circuit 60 is described. FIG. 5 illustrates a specific configuration example of the memory circuit 60 that stores parameters to be used in the image processing circuit 30 and the power supply circuit 50.

The memory circuit 60 illustrated in FIG. 5 includes a register portion 61*a* and a register portion 61*b*. The register portion 61*a* includes a plurality of registers 62*a*. The register portion 61*b* includes a plurality of registers 62*b*. The scan chain register is formed by the plurality of registers 62*b*. Input data ("Scan In") and a scan clock signal ("Scan Clock") are input to the register portion 61*b*.

The register 62*a* is a volatile register. There is no particular limitation on the circuit configuration of the register 62*a*, and a latch circuit, a flip-flop circuit, or the like is used as long as data can be stored. The image processing circuit 30 and the power supply circuit 50 receive data from the corresponding registers 62*a*. The content of processing by the image processing circuit 30 and the power supply circuit 50 is controlled in accordance with the data supplied from the register portion 61*a*.

The register 62*b* is preferably a nonvolatile register that does not lose data even when power supply is stopped. Here, the register 62*b* is provided with a memory circuit including an OS transistor to be nonvolatile.

Here, the off-state current of an OS transistor is extremely low because a metal oxide has a larger energy gap and a lower minority carrier density than a semiconductor such as silicon. Accordingly, when an OS transistor is used for the register 62*b*, a potential can be retained for an extremely long time in the register 62*b* as compared to the case where a transistor whose channel formation region includes silicon (such a transistor is also referred to as a Si transistor) is used. Thus, the data stored in the register 62*b* can be retained even in a period during which the power supply to the register 62*b* is stopped.

To update data stored in the memory circuit 60, first, data in the register portion 61*b* is changed. After the data in the registers 62*b* in the register portion 61*b* is rewritten, the data in the registers 62*b* in the register portion 61*b* is loaded in the registers 62*a* in the register portion 61*a* at one time. Accordingly, the controller 20, the image processing circuit 30, and the power supply circuit 50 can perform various kinds of processing using the data updated at one time. The operation of the signal generation portion 12 can be stable because simultaneity can be maintained in updating data.

For example, when the potentials Va and Vc are changed in accordance with a change in display conditions, the data that corresponds to the parameters calculated by the controller 20 (specifically, the parameter to be used in the image processing circuit 30 and that to be used in the power supply circuit 50) is sequentially input to the register portion 61*b* as data Scan In. These parameters are stored in the registers 62*b* and then transferred to the register portion 61*a* at one time. Thus, the parameters stored in the memory circuit 60 are output from the register portion 61*a* to the image processing circuit 30 and the power supply circuit 50 at the same time. Accordingly, the parameter to be used in the power supply circuit 50 and that to be used in the image processing circuit 30 can be updated at the same time. The potentials Va and Vc can be changed at the same time as setting of the parameter of the image processing that is suitable for the changed potentials Va and Vc, which prevents image distortion at the time of switching the voltage applied to the light-emitting element LE.

In addition, owing to the register portion 61*a* and the register portion 61*b*, data in the register portion 61*b* can be updated even during operation of the image processing circuit 30 and the power supply circuit 50. Thus, the parameter stored in the memory circuit 60 can be changed in accordance with display conditions on a real-time basis, which leads to an effective reduction in power consumption.

When the register 62*b* is a nonvolatile register, a parameter can be retained in the memory circuit 60 even in a period during which the power supply to the memory circuit 60 is stopped. Power supply to the memory circuit 60 is stopped only after data is saved in the register 62*b*. After power supply resumes, the data saved in the register 62*b* is recovered (loaded) in the register 62*a* and normal operation resumes. Note that if the data stored in the register 62*a* does not match with the data stored in the register 62*b*, the data in the register 62*a* is preferably saved in the register 62*b*, and then the data is preferably stored again in a retention circuit of the register 62*b*. For example, while updated data is being inserted in the register portion 61*b*, the data do not match with each other.

Figure 6:
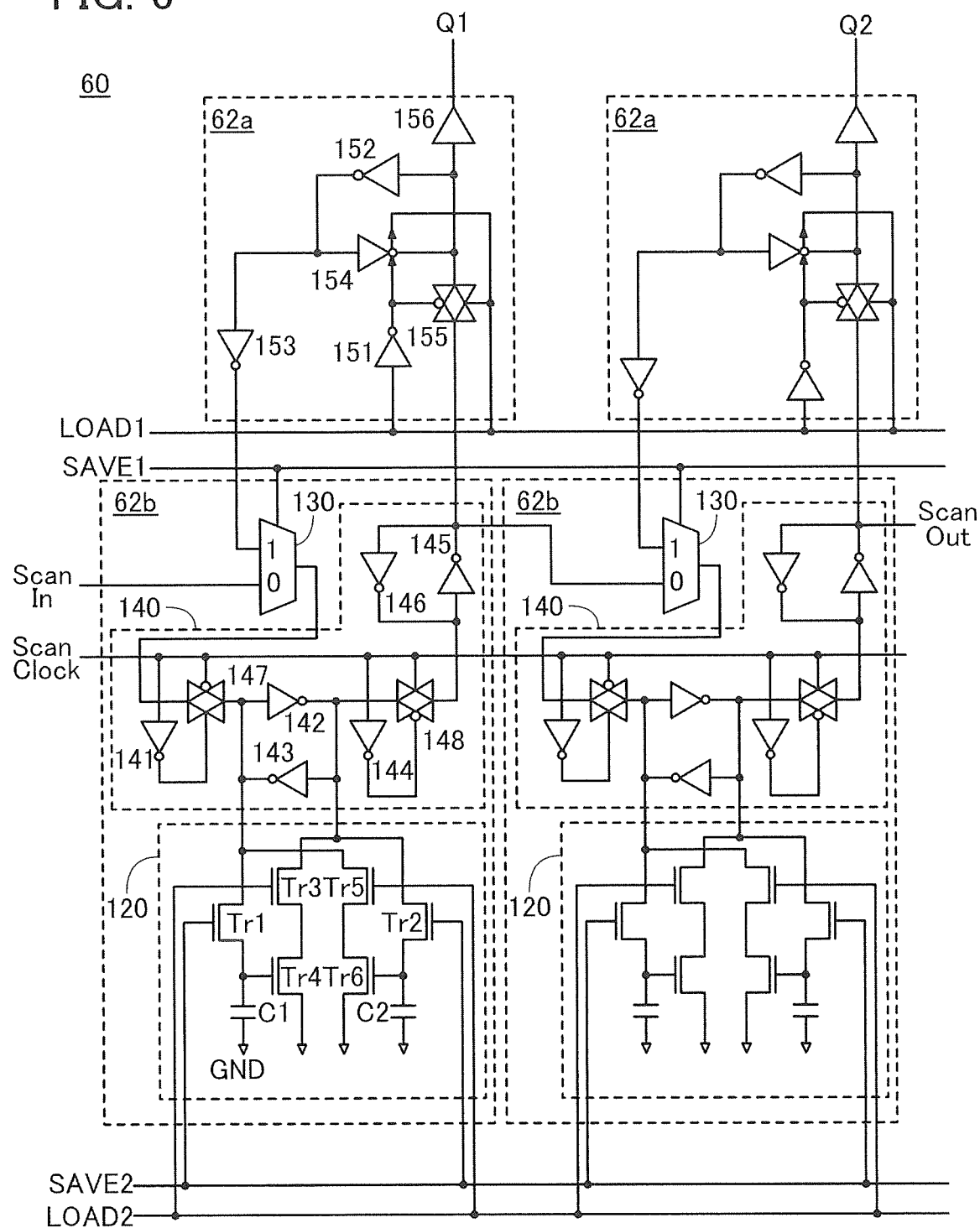
FIG. 6 illustrates a configuration example of a memory device.

FIG. 6 illustrates circuit configuration examples of the register 62*a* and the register 62*b*. FIG. 6 illustrates two registers 62*b* of the register portion 61*b* and corresponding two registers 62*a*.

The register 62b includes a retention circuit 120, a selector 130, and a flip-flop circuit 140. The selector 130 and the flip-flop circuit 140 form a scan flip-flop circuit.

A signal SAVE2 and a signal LOAD2 are input to the retention circuit 120. The retention circuit 120 includes transistors Tr1 to Tr6 and capacitors C1 and C2. The transistors Tr1 and Tr2 are OS transistors. The OS transistors used as the transistors Tr1 and Tr2 may have back gates.

A 3-transistor gain cell is formed by the transistors Tr1, Tr3, and Tr4 and the capacitor C1. In a similar manner, another 3-transistor gain cell is formed by the transistors Tr2, Tr5, and Tr6 and the capacitor C2. The two gain cells store complementary data retained in the flip-flop circuit 140. One of a source and a drain of the transistor Tr1 is connected to the capacitor C1, and one of a source and a drain of the transistor Tr2 is connected to the capacitor C2. When the transistors Tr1 and Tr2, which are OS transistors here, are turned off, the charges accumulated in the capacitors C1 and C2 can be retained for a long time. Thus, the data retained in the memory circuit 60 is saved in the capacitors C1 and C2, whereby the data can be retained for a long time in the memory circuit 60 even when power supply is stopped. Note that in the register 62b, the transistors other than the transistor Tr1 and the transistor Tr2 may be Si transistors.

The retention circuit 120 stores complementary data retained in the flip-flop circuit 140 in response to the signal SAVE2 and loads the retained data in the flip-flop circuit 140 in response to the signal LOAD2.

An output terminal of the selector 130 is connected to an input terminal of the flip-flop circuit 140, and an input terminal of the register 62a is connected to a data output terminal of the flip-flop circuit 140. The flip-flop circuit 140 includes inverters 141, 142, 143, 144, 145, and 146 and analog switches 147 and 148. The conduction of the analog switches 147 and 148 is controlled with the signal Scan Clock. The flip-flop circuit 140 is not limited to the circuit configuration in FIG. 6 and a variety of flip-flop circuits 140 can be employed.

An output terminal of the register 62a is connected to one of two input terminals of the selector 130. An output terminal of the flip-flop circuit 140 in the previous stage is connected to the other of the two input terminals of the selector 130. Note that data is input from outside the memory circuit 60 to an input terminal of the selector 130 in the first stage in the register portion 61b.

The register 62a includes an inverter 151, an inverter 152, an inverter 153, a clocked inverter 154, an analog switch 155, and a buffer 156. The register 62a loads the data of the flip-flop circuit 140 on the basis of a signal LOAD1. The transistors of the register 62a may be Si transistors.

Figure 7:
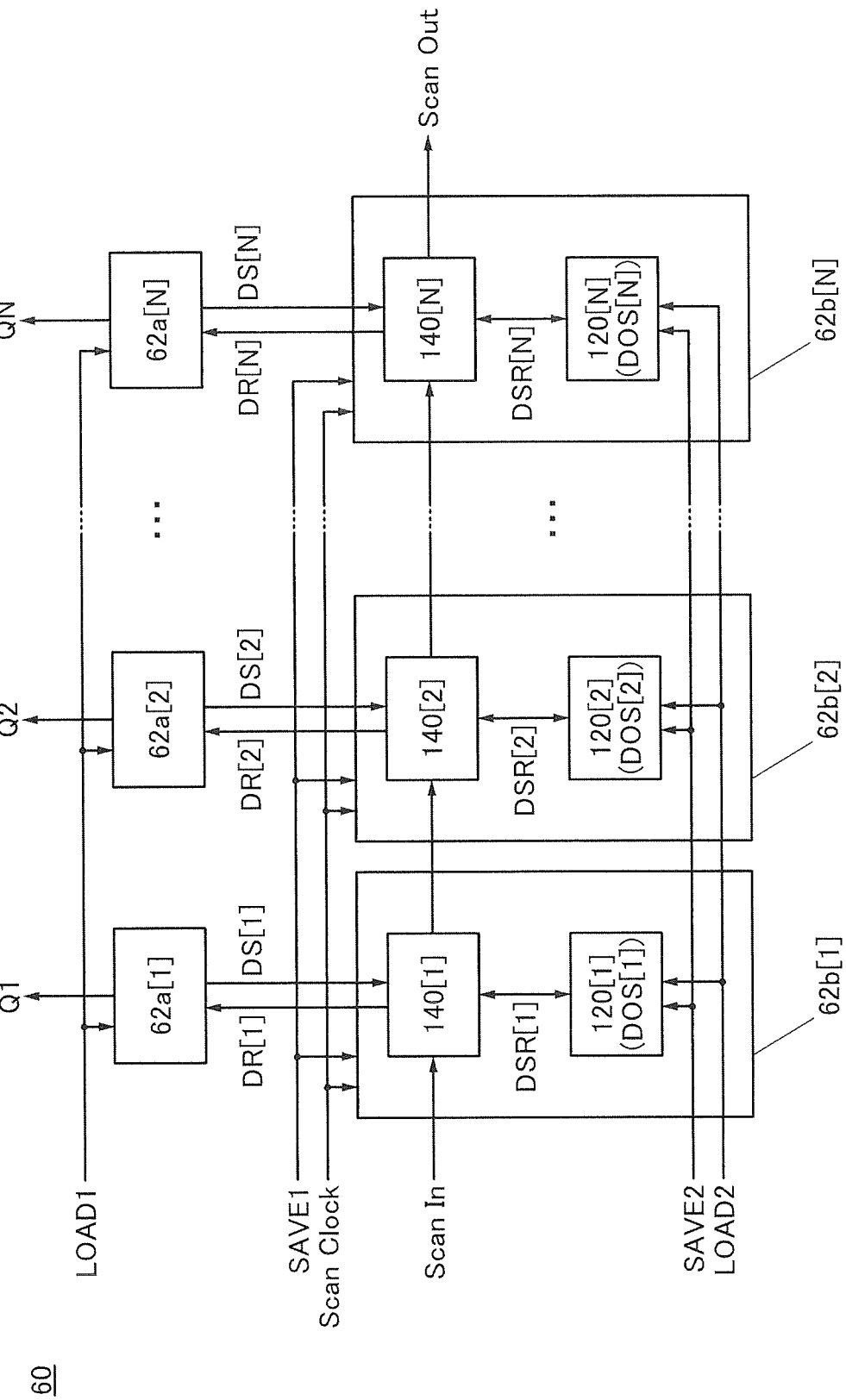
FIG. 7 illustrates a configuration example of a memory device.

Next, an operation example of the memory circuit 60 is described. FIG. 7 simply shows a structure of the memory circuit 60 shown in FIG. 6. Described here is a case where the memory circuit 60 includes N registers 62a (62a[1] to 62a[N], N is an integer of 2 or more), N retention circuits 120 (120[1] to 120[N]), and N flip-flop circuits 140 (140[1] to 140[N]).

In FIG. 7, data DR indicates data output from the flip-flop circuit 140 to the register 62a, data DS indicates data output from the register 62a to the flip-flop circuit 140, data DSR indicates data input and output between the flip-flop circuit 140 and the retention circuit 120, and data DOS indicates data stored in the retention circuit 120. In addition, data Q1 to QN are output from the registers 62a[1] to 62a[N]. The data Q1 to QN correspond to parameters output from the memory circuit 60.

Figure 8:
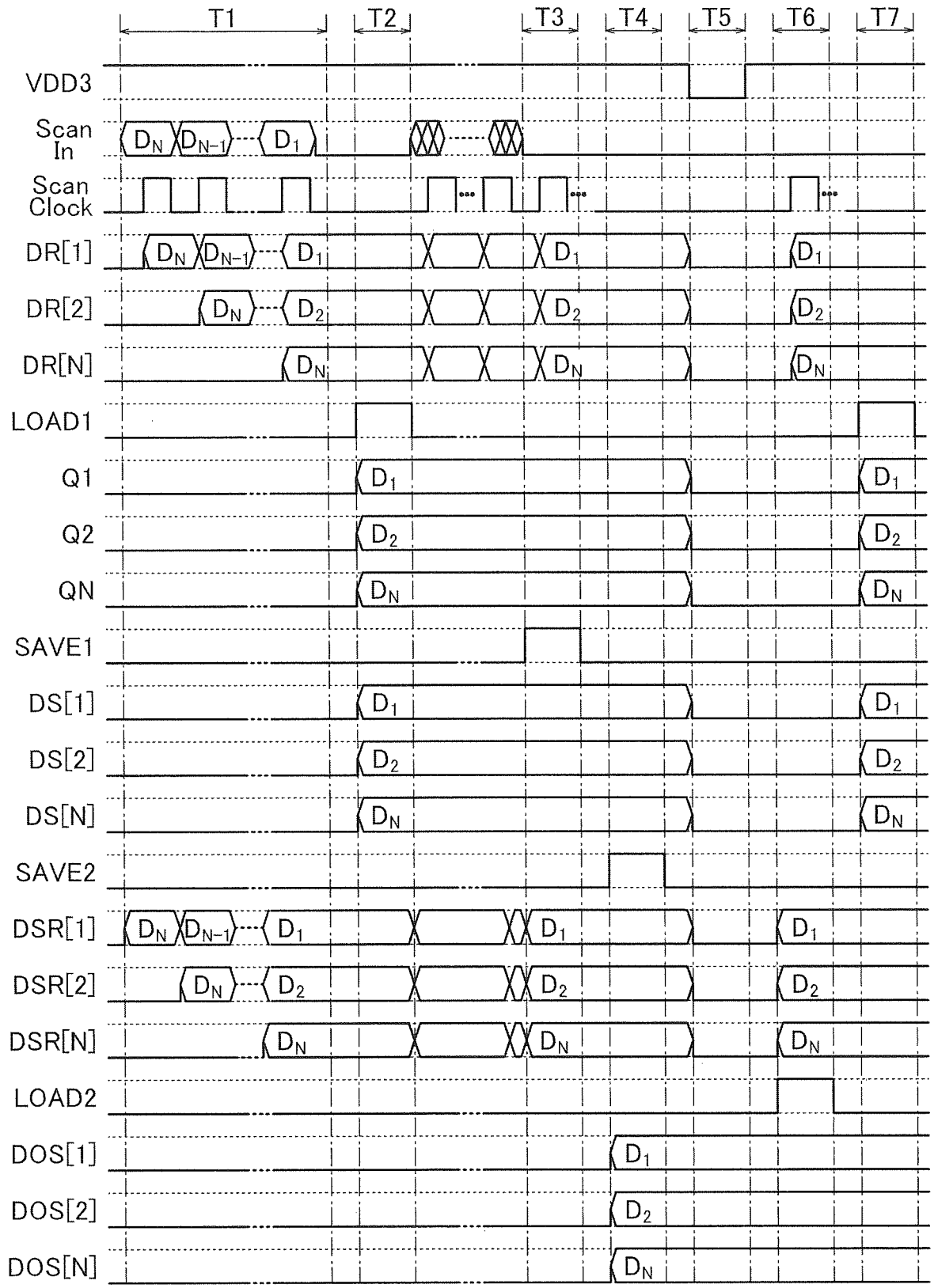
FIG. 8 is a timing chart.

FIG. 8 is a timing chart showing the operation example of the memory circuit 60 illustrated in FIG. 7. Described as an example is a case where data $D_1$ to $D_N$ are stored in the flip-flop circuits 140[1] to 140[N].

First, in a period T1, the data $D_N$ to $D_1$ are sequentially input as the data Scan In, and the data $D_1$ to $D_N$ are stored in the flip-flop circuits 140[1] to 140[N]. As a result, the data $D_1$ to $D_N$ are output as the data DR[1] to DR[N] and the data DSR[1] to DSR[N].

Next, in a period T2, the signal LOAD1 becomes high level. Thus, the data $D_1$ to $D_N$ output as the data DR[1] to DR[N] are stored in the registers 62a[1] to 62a[N]. As a result, the data $D_1$ to $D_N$ are output as the data Q1 to QN and the data DS[1] to DS[N]. The data sequentially input as the data Scan In are output at one time as the data Q1 to QN. Thus, the parameters output from the memory circuit 60 are changed at one time.

Next, in a period T3, a signal SAVE1 becomes high level. Thus, the data $D_1$ to $D_N$ output as the data DS[1] to DS[N] are stored in the flip-flop circuits 140[1] to 140[N]. As a result, the data $D_1$ to $D_N$ are output as the data DR[1] to DR[N] and the data DSR[1] to DSR[N].

Note that as shown in FIG. 8, even when the data Scan In changes and the data stored in the flip-flop circuits 140[1] to 140[N] is changed in a period between the period T2 and the period T3, the data Q1 to QN are not changed. Owing to the operation in the period T3, the data stored in the flip-flop circuits 140[1] to 140[N] can be overwritten with the data Q1 to QN, and the data stored in the registers 62a[1] to 62a[N] can be consistent with the data stored in the flip-flop circuits 140[1] to 140[N]. As a result, the data can be saved with the consistency of the data maintained even when data saving which is described later is performed while the data stored in the flip-flop circuits 140[1] to 140[N] is updated. Moreover, recovery of the saved data can be performed at high speed.

Next, in a period T4, the signal SAVE2 becomes high level. Thus, the data $D_1$ to $D_N$ output as the data DSR[1] to DSR[N] are stored in the retention circuits 120[1] to 120[N]. In other words, the data stored in the flip-flop circuits 140[1] to 140[N] are saved in the retention circuits 120[1] to 120[N]. As a result, the data DOS[1] to DOS[N] become the data $D_1$ to $D_N$. Specifically, the potentials of the electrodes of the capacitors C1 and C2 in FIG. 6 become potentials corresponding to the data $D_1$ to $D_N$.

Next, in a period T5, the supply of a power supply potential VDD3 to the memory circuit 60 is stopped, so that data output from the registers 62a, the retention circuits 120, and the flip-flop circuits 140 is stopped. Note that the data DOS[1] to DOS[N] stored in the retention circuits 120 are retained even in the period during which power supply to the memory circuit 60 is stopped. Specifically, the potentials corresponding to the data $D_1$ to $D_N$ are retained in the capacitors C1 and C2 in FIG. 6.

Next, in a period T6, power supply to the memory circuit 60 is resumed and the signal LOAD2 becomes high level. At that time, the data $D_1$ to $D_N$ retained in the retention circuits 120 are output as the data DSR[1] to DSR[N] and stored in the flip-flop circuits 140[1] to 140[N]. In other words, the data saved in the retention circuits 120[1] to 120[N] is recovered in the flip-flop circuits 140[1] to 140[N]. As a result, the data $D_1$ to $D_N$ are output as the data DR[1] to DR[N].

Next, in a period T7, the signal LOAD1 becomes high level. Thus, the data $D_1$ to $D_N$ output as the data DR[1] to DR[N] are stored in the registers 62a[1] to 62a[N]. As a result, the data $D_1$ to $D_N$ are output as the data Q1 to QN and the data DS[1] to DS[N]. Then, the data recovered from the retention circuits 120[1] to 120[N] is output to the outside as the data Q1 to QN.

As described above, the memory circuit 60 can change the output to the outside at one time in accordance with the sequentially input data. In addition, the memory circuit 60 can retain the saved data in the period during which power supply is stopped.

<Display Portion>

Figure 9A:
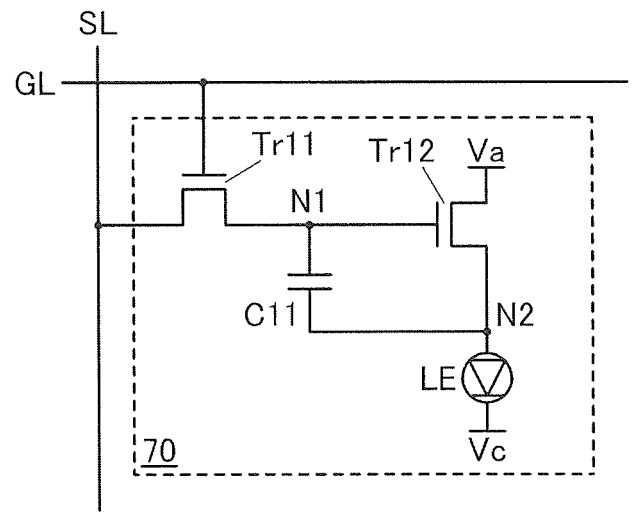
FIGS. 9A to 9C each illustrate a configuration example of a pixel.
Figure 9B:
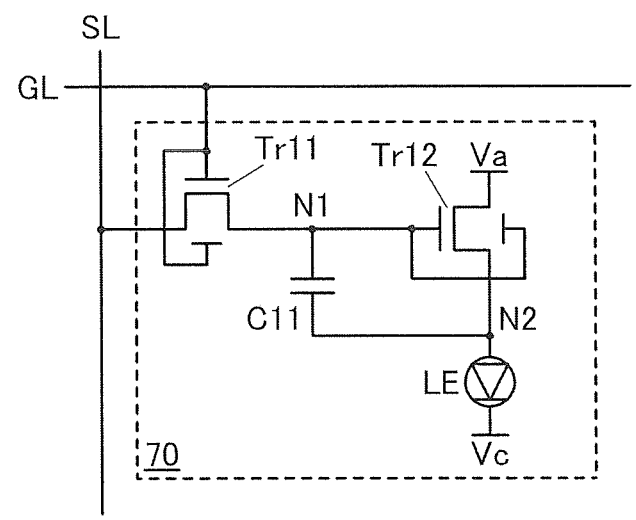
Figure 9C:
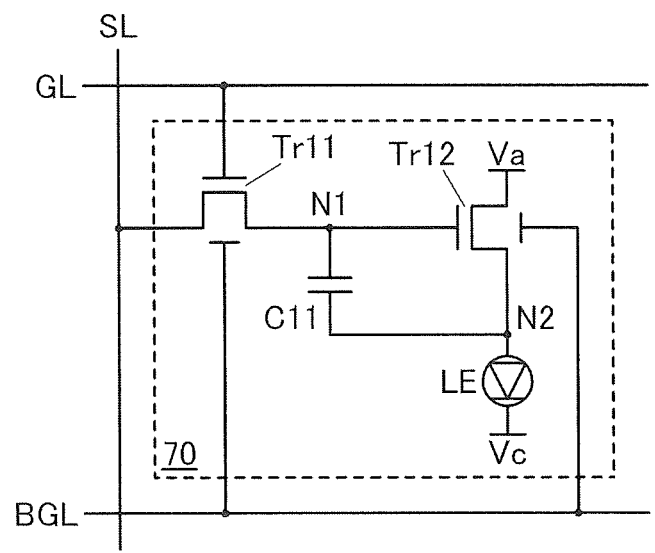

Next, a configuration example of the display portion 11 is described. FIGS. 9A to 9C illustrate configuration examples of a pixel 70 that can be provided in the display portion 11. The display portion 11 includes a plurality of pixels 70. The plurality of pixels 70 display the respective gray levels, whereby an image is displayed on the display portion 11.

Configuration Example

The pixel 70 in FIG. 9A includes transistors Tr11 and Tr12, the light-emitting element LE, and a capacitor C11. Although the transistors Tr11 and Tr12 are described as being n-channel transistors, the polarities of the transistors can be set freely.

A gate of the transistor Tr11 is connected to a wiring GL. One of a source and a drain of the transistor Tr11 is connected to a gate of the transistor Tr12 and one electrode of the capacitor C11. The other of the source and the drain of the transistor Tr11 is connected to a wiring SL. One of a source and a drain of the transistor Tr12 is connected to the other electrode of the capacitor C11 and one electrode of the light-emitting element LE. The other of the source and the drain of the transistor Tr12 is connected to a wiring to which the potential Va is supplied. The other electrode of the light-emitting element LE is connected to a wiring to which the potential Vc is supplied. A node which is connected to the one of the source and the drain of the transistor Tr11, the gate of the transistor Tr12, and the one electrode of the capacitor C11 is referred to as a node N1. A node which is connected to the one of the source and the drain of the transistor Tr12 and the other electrode of the capacitor C11 is referred to as a node N2.

Here, the case where the potential Va is a high power supply potential and the potential Vc is a low power supply potential is described. The capacitor C11 functions as a storage capacitor for retaining the potential of the node N2.

Note that a source of a transistor in this specification and the like means a source region that is part of a semiconductor layer functioning as a channel formation region, a source electrode connected to the semiconductor layer, or the like. Similarly, a drain of a transistor means a drain region that is part of the semiconductor layer, a drain electrode connected to the semiconductor layer, or the like. A gate of a transistor means a gate electrode or the like.

The terms "source" and "drain" of a transistor interchange with each other depending on the conductivity type of the transistor or levels of potentials supplied to the terminals. In general, in an n-channel transistor, a terminal to which a lower potential is supplied is called "source", and a terminal to which a higher potential is supplied is called "drain". In a p-channel transistor, a terminal to which a lower potential is supplied is called "drain", and a terminal to which a higher potential is supplied is called "source". In this specification, although the connection relationship of the transistors is described assuming that the source and the drain are fixed in some cases for convenience, actually, the terms of the source and the drain interchange with each other depending on the relationship of the potentials.

The wiring GL transmits a signal for selecting the pixel 70 (this signal is hereinafter also referred to as a selection signal). The wiring SL transmits a video signal (the signal SD) that is output from the signal generation portion 12. The potential of the wiring SL corresponds to the video signal.

The transistor Tr11 controls supply of the potential of the wiring SL to the node N1. Specifically, the potential of the wiring GL is controlled to turn on the transistor Tr11, whereby the potential of the wiring SL is supplied to the node N1 and is written to the pixel 70. Then, the potential of the wiring GL is controlled to turn off the transistor Tr11, whereby the potential of the node N1 is retained.

The amount of current flowing between the source and the drain of the transistor Tr12 is controlled in accordance with the voltage between the nodes N1 and N2. The light-emitting element LE emits light with a luminance that depends on the amount of flowing current. Accordingly, the gray level of the pixel 70 can be controlled.

As long as the transistor Tr12 operates in a saturation region and the potential of the gate of the transistor Tr12 is constant, a change in the potential Va does not change the current flowing in the transistor Tr12. In other words, a change in the potential Va does not change the current flowing in the light-emitting element LE, i.e., does not change the luminance. Therefore, when the potential Va is lowered in the range where the light-emitting elements LE in all the pixels 70 included in the display portion 11 provide a desired luminance, or specifically, in the range where the light-emitting element LE of the pixel 70 to provide the highest luminance can provide the desired luminance, the power consumption can be reduced without changing the image displayed on the display portion 11. Here, the potential written in the pixels 70 does not need to be changed and thus, additional image processing accompanying a change in image data, for example, is unnecessary, which can effectively reduce the power consumption.

The above operations are performed for the wirings GL one by one, whereby an image for a first frame can be displayed.

The selection of any of the wirings GL may be performed by either progressive scan or interlaced scan. The supply of video signals to the wirings SL may be performed by dot sequential driving in which video signals are sequentially supplied to the wirings SL, or line sequential driving in which video signals are concurrently supplied to the wirings SL. Alternatively, supply of video signals may be performed for every set of wirings SL.

Next, in a second frame period, an image is displayed by an operation similar to that of a first frame period. Thus, the image displayed on the display portion 11 is rewritten. Note that the image rewriting is performed at a rate high enough to prevent a change in an image due to the rewriting from being recognized by a viewer of the display portion 11. In the case where a moving image is displayed on the display portion 11, image rewriting is preferably performed greater than or equal to 60 times per second, for example. Accordingly, a smooth moving image can be displayed.

On the other hand, for example, in the case of displaying a still image or a moving image which does not change for a certain period or changes within a predetermined range on the display portion 11, it is preferable not to rewrite the image and to keep the image of the previous frame. In this way, power consumption associated with image rewriting can be reduced.

When the frequency of image rewriting is reduced, the potential of the node N1 is preferably retained for a long time. Thus, an OS transistor is preferably used as the transistor Tr11, in which case the potential of the node N1 can be retained for an extremely long time, and the display state of an image can be maintained even when the frequency of image rewriting is reduced. The frequency of the image rewriting is more than or equal to once every day and less than 0.1 times every second, preferably more than or equal to once every hour and less than once every second, more preferably more than or equal to once every 30 seconds and less than once every second, for example.

Note that to maintain a display state is to keep the amount of change in an image within a predetermined range. This predetermined range can be set appropriately, and is preferably set such that a user viewing displayed images can recognize the displayed images as the same image.

Reducing the frequency of image rewriting leads to a reduction in flickers in displaying an image. Accordingly, eyestrain of a viewer of the display portion 11 can be reduced.

Note that the transistor Tr11 is not necessarily the OS transistor. For example, a transistor whose channel formation region is formed in part of a substrate containing a single-crystal semiconductor other than a metal oxide may be used. Examples of such a substrate include a single-crystal silicon substrate and a single-crystal germanium substrate. In addition, a transistor whose channel formation region is formed in a film containing a material other than a metal oxide can be used as the transistor Tr11. Examples of a material other than a metal oxide include silicon, germanium, silicon germanium, silicon carbide, gallium arsenide, aluminum gallium arsenide, indium phosphide, gallium nitride, and an organic semiconductor. Each of the above materials may be a single-crystal semiconductor or a non-single-crystal semiconductor such as an amorphous semiconductor, a microcrystalline semiconductor, or a polycrystalline semiconductor.

Examples of a material that can be used for channel formation regions of the transistor Tr12 and a transistor described below are the same as examples of a material for the transistor Tr11.

A transistor included in the pixel 70 may include a pair of gates. The pixel 70 illustrated in FIG. 9B is different from that in FIG. 9A in that the transistors Tr11 and Tr12 each include a pair of gates. Note that when a transistor includes a pair of gates, one of the pair of gates is referred to as a first gate, a front gate, or simply a gate in some cases, and the other thereof is referred to as a second gate or a back gate in some cases.

The transistors Tr11 and Tr12 illustrated in FIG. 9B each include a back gate connected to a front gate. In this case, the back gate is supplied with the same potential as the front gate, resulting in an increase in the on-state current of the transistors. In particular, the transistor Tr11 is used for writing of a video signal; therefore, when the configuration illustrated in FIG. 9B is employed, a video signal can be written in the pixel 70 at high speed.

The back gates of the transistors Tr11 and Tr12 illustrated in FIG. 9C are connected to a wiring BGL. The wiring BGL supplies a predetermined potential to the back gate. The threshold voltages of the transistors Tr11 and Tr12 can be controlled by controlling the potential of the wiring BGL. In particular, the transistor Tr11 is used to retain the potential of the node N1; thus, the threshold voltage of the transistor Tr11 may be shifted to the positive side by controlling the potential of the wiring BGL, in order to reduce the off-state current of the transistor Tr11. Note that the potential supplied to the wiring BGL may be either a fixed potential or a varied potential.

The wiring BGL may be provided for each of the transistors Tr11 and Tr12. Alternatively, the wiring BGL may be shared by all or part of the pixels 70 included in the display portion 11.

Modification Example

Figure 10A:
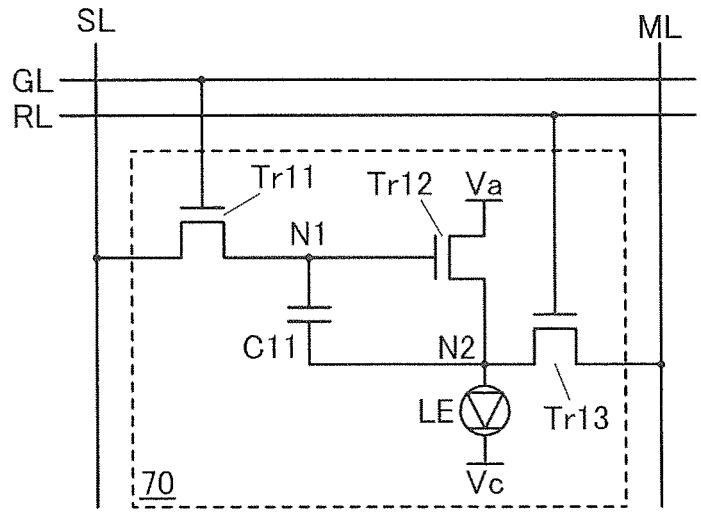
FIGS. 10A to 10C each illustrate a configuration example of a pixel.

FIG. 10A illustrates a modification example of the pixel 70. The pixel 70 illustrated in FIG. 10A is different from that in FIG. 9A in including a transistor Tr13. A gate of the transistor Tr13 is connected to a wiring RL, one of a source and a drain thereof is connected to the node N2, and the other of the source and the drain is connected to a wiring ML. When the transistor Tr13 is turned on by controlling the potential of the wiring RL, the potential of the node N2 can be reset.

The value of current supplied to the light-emitting element LE is affected by the characteristics of the transistor Tr12. Thus, when the pixel 70 displays a gray level, the characteristics of the transistor Tr12 are preferably examined by outputting a signal including the information on the characteristics of the transistor Tr12. Here, when the transistor Tr13 is turned on by controlling the potential of the wiring RL, the current flowing in the transistor Tr12 can be output to the wiring ML. The value of this current gives the information on the characteristics of the transistor Tr12.

Figure 10B:
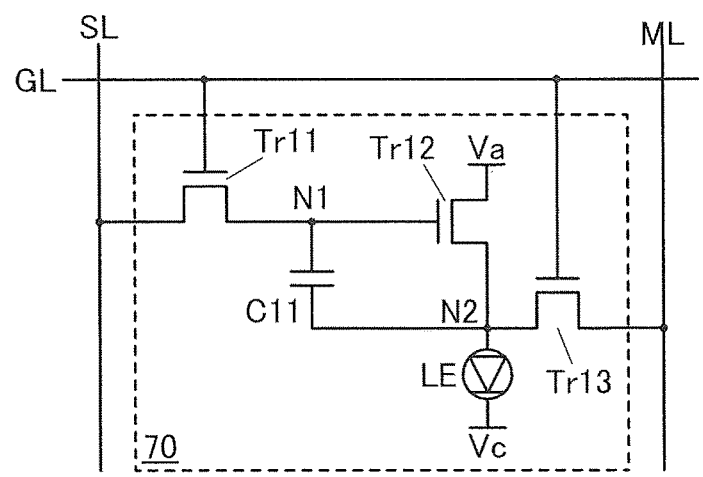

An element included in the pixel 70 can share a predetermined wiring with another element. The pixel 70 illustrated in FIG. 10B is different from that illustrated in FIG. 10A in that the gate of the transistor Tr13 is connected to the wiring GL. That is, the gate of the transistor Tr11 and the gate of the transistor Tr13 are connected to the same wiring. In this case, the conduction of the transistor Tr11 and that of the transistor Tr13 are controlled at the same time by the potential of the wiring GL.

Figure 10C:
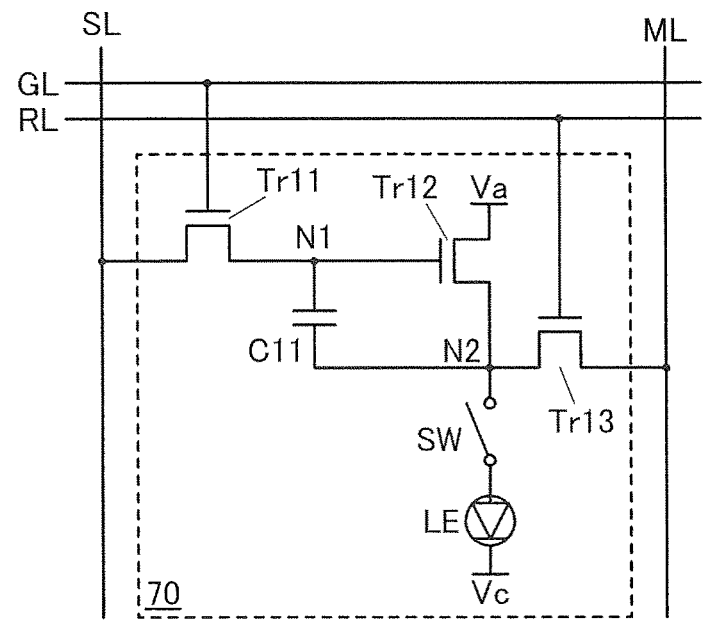

Another element can be provided in the pixel 70 as appropriate. For example, as illustrated in FIG. 10C, a switch SW can be provided between the transistor Tr12 and the light-emitting element LE. In that case, for example, the switch SW is off in a period during which the characteristics of the transistor Tr12 are read out, whereby the value of current flowing in the transistor Tr12 can be accurately transmitted to the wiring ML.

Figure 11A:
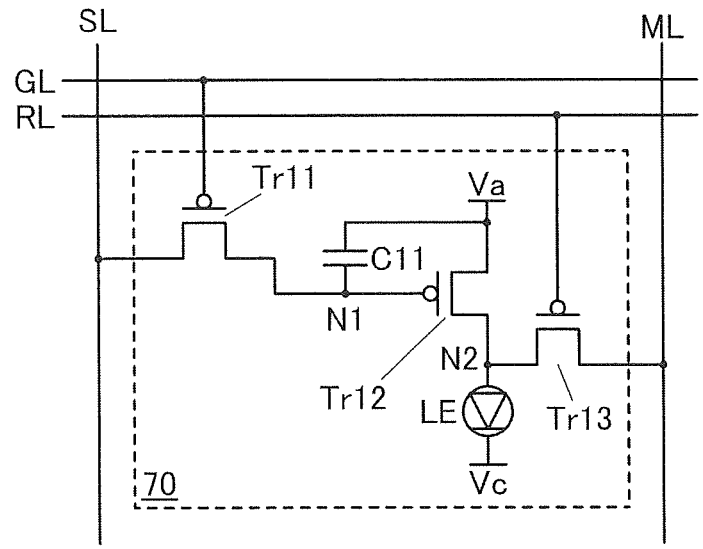
FIGS. 11A and 11B each illustrate a configuration example of a pixel.

The polarity of the transistor, the orientation of the light-emitting element, the potential of the wiring, and the like in the pixel 70 can be changed as appropriate. The pixel 70 illustrated in FIG. 11A is different from that illustrated in FIG. 10A in the polarity of the transistors Tr11, Tr12, and Tr13, that is, the transistors Tr11, Tr12, and Tr13 are p-channel transistors. In addition, one electrode of the capacitor C11 is connected to the gate of the transistor Tr12 and the other electrode is connected to the wiring to which the potential Va is supplied.

Figure 11B:
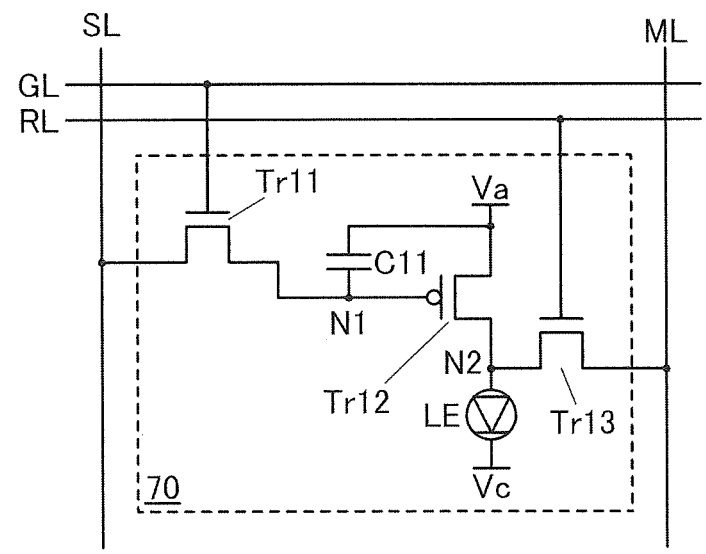

Transistors having different polarities may be provided in the pixel 70. For example, as illustrated in FIG. 11B, the transistors Tr11 and Tr13 can be n-channel transistors and the transistor Tr12 can be a p-channel transistor. Note that a connection relationship between the capacitor C11 and other components in FIG. 11B is the same as that in FIG. 11A.

The above-described configurations of the pixel 70 can be employed in the display portion 11 illustrated in FIG. 1.

As described above, in one embodiment of the present invention, the voltage applied to the light-emitting element LE can be controlled in accordance with the display conditions of the image displayed on the display portion 11. Thus, the power consumption of the display portion 11 can be reduced. Furthermore, in one embodiment of the present invention, parameters can be output from the memory circuit 60 to the image processing circuit 30 and the power supply circuit 50 at the same time. This prevents image distortion in switching the voltage applied to the light-emitting element LE, and enables the display portion 11 to display a highly viewable image.

Furthermore, in one embodiment of the present invention, the use of an OS transistor in the display portion 11 or the signal generation portion 12 reduces the power consumption of the display system 10.

This embodiment can be combined with any of the other embodiments as appropriate.

Embodiment 2

In this embodiment, a different operation example and a different configuration example of the display system described in the above embodiment are described.

Operation Example

Figure 12:
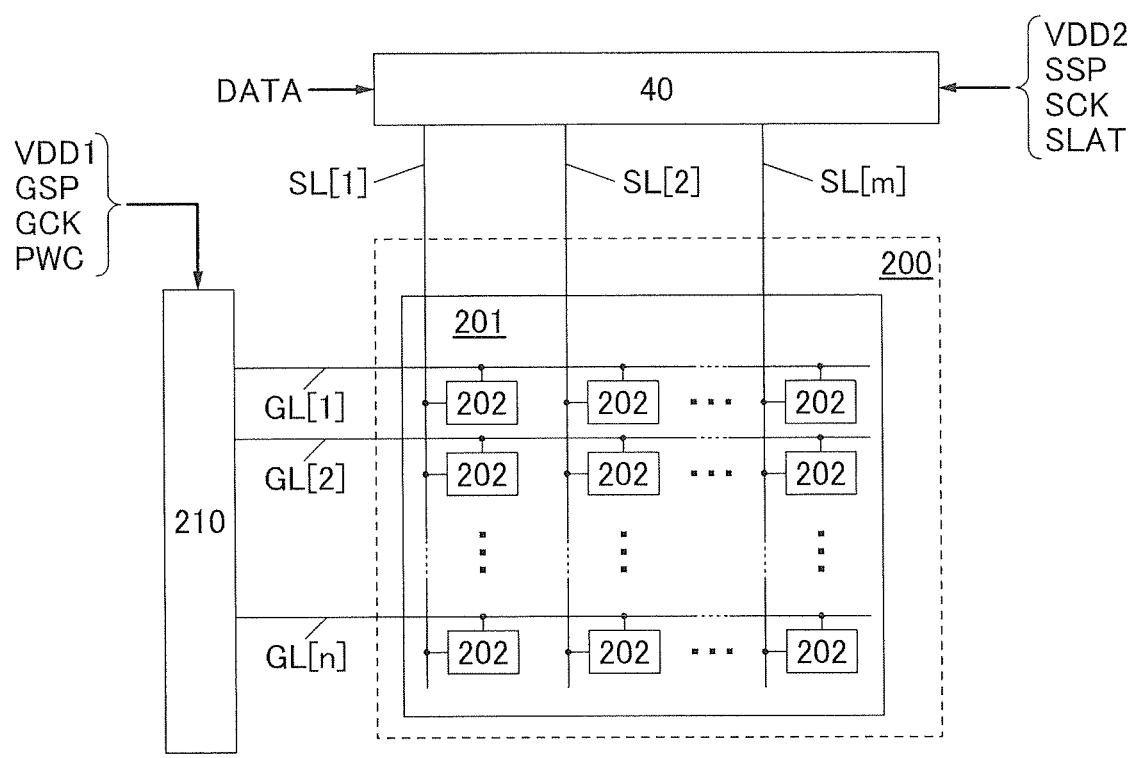
FIG. 12 illustrates a configuration example of a pixel portion and a driver circuit.

First of all, an operation example of the display portion 11 in which power supply is controlled in accordance with whether there is a change in an image is described. FIG. 12 illustrates a pixel portion 200 and a driver circuit 210 that are included in the display portion 11 and the driver circuit 40 that is included in the signal generation portion 12. The pixel portion 200 includes a pixel group 201. The pixel group 201 includes a plurality of pixels 202. The pixel 202 includes a display element and displays a predetermined gray level. The plurality of pixels 202 each display a predetermined gray level, whereby a predetermined image is displayed on the pixel portion 200.

In the configuration illustrated in FIG. 12, the pixel group 201 includes m columns and n rows (m and n are each an integer of 2 or more) of pixels 202. The pixel 202 in an i-th column and a j-th row (i is an integer of 1 or more and m or less, and j is an integer of 1 or more and n or less) is connected to a wiring SL[i] and a wiring GL[j]. Wirings GL[1] to GL[n] are connected to the driver circuit 210. Wirings SL[1] to SL[m] are connected to the driver circuit 40.

The driver circuit 210 supplies selection signals to the pixel portion 200. Specifically, the driver circuit 210 supplies selection signals to the wirings GL that are connected to the pixels 202, and the wirings GL each transmit the selection signal output from the driver circuit 210.

The driver circuit 40 generates video signals and supplies the video signals to the pixel portion 200. Specifically, the driver circuit 40 supplies video signals to the wirings SL that are connected to the pixels 202. The video signals supplied to the wirings SL are written to the pixels 202 selected by the driver circuit 210. As a result, an image is displayed on the pixel portion 200.

Here, an OS transistor is preferably used in the pixel 202. In that case, the frequency of rewriting a video signal into the pixel 202 can be considerably reduced in a period during which the image displayed on the pixel portion 200 does not change, leading to reduced power consumption. The frequency of writing a video signal is more than or equal to once every day and less than 0.1 times every second, preferably more than or equal to once every hour and less than once every second, more preferably more than or equal to once every 30 seconds and less than once every second, for example.

A power supply potential VDD1, a start pulse GSP, a clock signal GCK, and a signal PWC are supplied to the driver circuit 210. In the period during which the power supply potential VDD1 is supplied, the driver circuit 210 generates selection signals for the pixels 202 that are provided in rows of the pixel group 201 and supplies the selection signals to the corresponding wirings GL. Specifically, the driver circuit 210 includes an n-stage shift register and the shift register is supplied with the start pulse GSP and the clock signal GCK. Then, logical AND of an output signal from each stage of the shift register and the signal PWC is output to the wirings GL[1] to GL[n] as the selection signals for the pixels 202 that are connected to rows of the pixel group 201. The pulse width of the selection signal depends on the pulse width of the signal PWC.

The driver circuit 40 is supplied with a power supply potential VDD2, a start pulse SSP, a clock signal SCK, a latch signal SLAT, and image data DATA. In the period during which the power supply potential VDD2 is supplied, the driver circuit 40 generates video signals for the pixels 202 that are provided in columns of the pixel group 201 with the use of the start pulse SSP, the clock signal SCK, the image data DATA, and the latch signal SLAT, and supplies the video signals to the corresponding wirings SL. Specifically, the driver circuit 40 includes an m-stage shift register, a first latch and a second latch that correspond to each stage and that can retain a plurality of bits of data, and a D/A converter circuit. When the shift register is supplied with the start pulse SSP and the clock signal SCK, output signals of the stages of the shift register are generated sequentially as selection signals, and the image data DATA is sequentially stored in the first latches in the corresponding columns. After the image data DATA is stored in the first latches in the columns, the data in the first latches is stored in the second latches in response to the latch signal SLAT. Then, the D/A converter circuit generates video signals that are analog signals corresponding to the data in the second latches.

Figure 13:
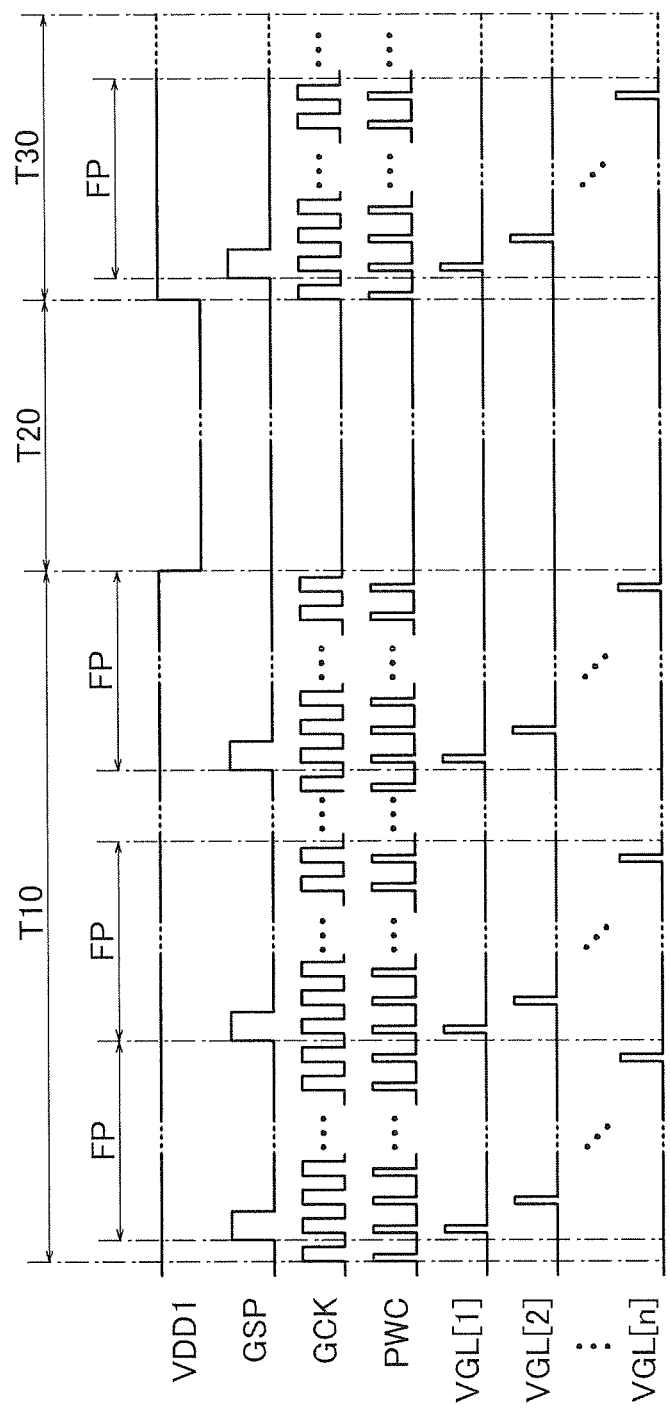
FIG. 13 is a timing chart.

FIG. 13 is a timing chart showing an operation example of the driver circuit 210 illustrated in FIG. 12. In FIG. 13, a video signal is supplied to the wiring SL in a period T10, the supply of the video signal is stopped in a period T20, and the supply of the video signal resumes in a period T30. Note that a period FP included in each of the period T10 and the period T30 denotes one frame period. Potentials VGL[1] to VGL[n] are respectively the potentials of the wirings GL[1] to GL[n].

First, in the period T10, the driver circuit 210 is supplied with the power supply potential VDD1, the start pulse GSP, the clock signal GCK, and the signal PWC, and the driver circuit 210 generates selection signals. Then, the selection signals are sequentially supplied to the wirings GL[1] to GL[n] and the potentials VGL[1] to VGL[n] sequentially become high level.

Video signals are supplied from the driver circuit 40 to the pixels 202 that are connected to the wirings GL supplied with the selection signals. Thus, the image displayed on the pixel group 201 is updated.

Next, in the period T20, supply of the power supply potential VDD1 to the driver circuit 210 is stopped, so that the operation of the driver circuit 210 is stopped. In addition, supply of the start pulse GSP, the clock signal GCK, and the signal PWC to the driver circuit 210 is stopped. Accordingly, in the period T20, no selection signal is generated and the pixel group 201 maintains the latest display state. As described above, operation of the driver circuit 210 is stopped in a period during which no video signal is supplied, so that power consumption can be reduced.

Then, in the period T30, supply of the power supply potential VDD1 to the driver circuit 210 is resumed and the start pulse GSP, the clock signal GCK, and the signal PWC are supplied. As a result, the driver circuit 210 resumes generating selection signals.

Figure 14:
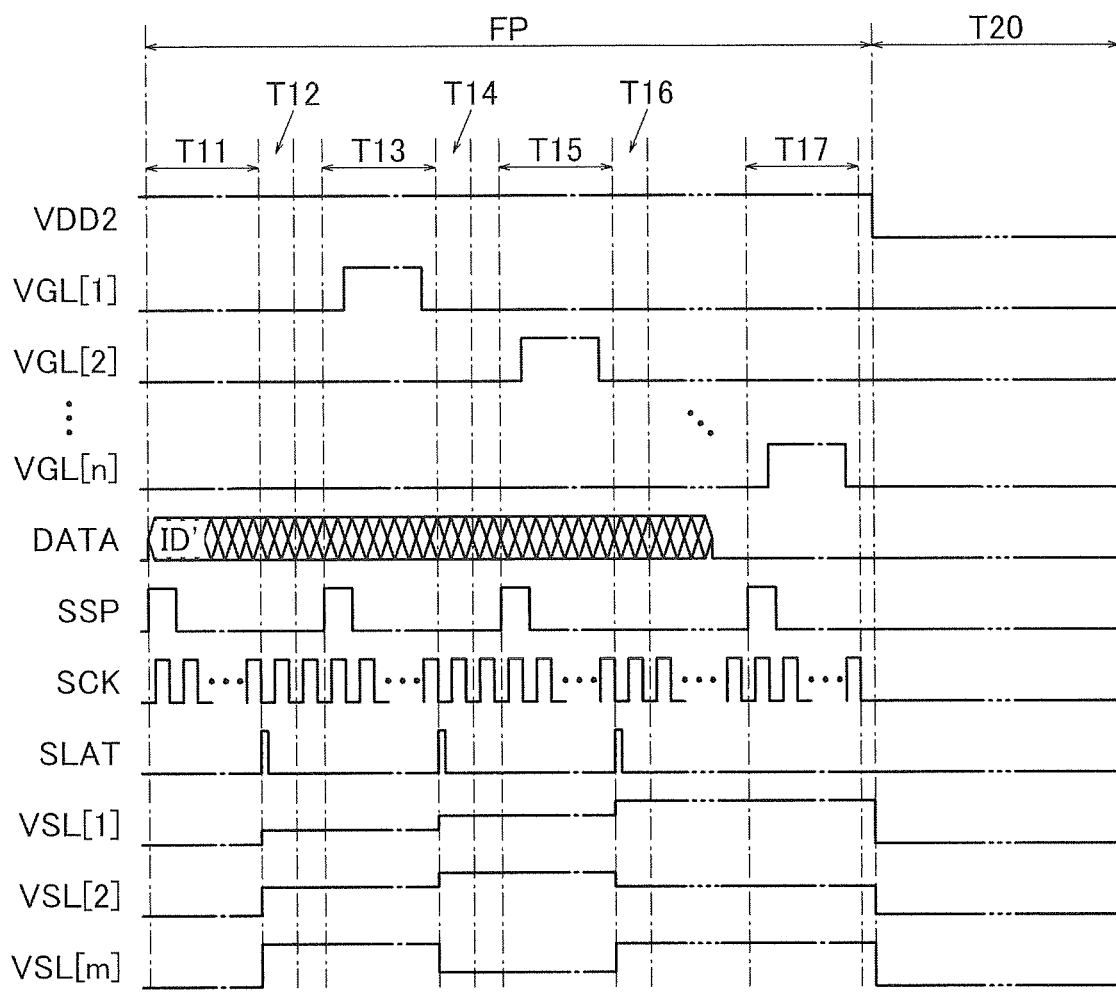
FIG. 14 is a timing chart.

Note that the operation state of the driver circuit 40 can also be controlled in accordance with whether a video signal is supplied. FIG. 14 is a timing chart showing an operation example of the driver circuit 40 illustrated in FIG. 12. Note that potentials VSL[1] to VSL[m] are respectively the potentials of the wirings SL[1] to SL[m].

In the period FP during which the pixel 202 is selected, the driver circuit 40 is supplied with the power supply potential VDD2, the start pulse SSP, the clock signal SCK, and the latch signal SLAT. In the period FP, the driver circuit 40 generates and outputs video signals.

First, in a period T11, the data ID' is supplied from the image processing circuit 30 (see FIG. 1 or the like) as the image data DATA. Then, on the basis of the start pulse SSP, the clock signal SCK, and the data ID', image data for the pixels 202 in the row that is connected to the wiring GL[1] is sequentially stored in the first latches in the columns.

Next, in a period T12, the latch signal SLAT becomes high level. Accordingly, the image data stored in the first latches in the columns in the period T11 is stored in the second latches in the columns, video signals generated by the D/A converter circuits in the columns are supplied to the wirings SL[1] to SL[m], and the potentials VSL[1] to VSL[m] become potentials corresponding to the video signals.

Next, in a period T13, the potential VGL[1] becomes high level, so that the pixels 202 in the row that is connected to the wiring GL[1] are supplied with the potentials VSL[1] to VSL[m]. Thus, the gray levels of the pixels 202 in the row that is connected to the wiring GL[1] are updated. In the period T13, on the basis of the start pulse SSP, the clock signal SCK, and the data ID', image data for the pixels 202 in the row that is connected to the wiring GL[2] is sequentially stored in the first latches in the columns.

Next, in a period T14, the latch signal SLAT becomes high level. Accordingly, the image data stored in the first latches in the columns in the period T13 is stored in the second latches in the columns, video signals generated by the D/A converter circuits in the columns are supplied to the wirings SL[1] to SL[m], and the potentials VSL[1] to VSL[m] become potentials corresponding to the video signals.

Next, in a period T15, the potential VGL[2] becomes high level, so that the pixels 202 in the row that is connected to the wiring GL[2] are supplied with the potentials VSL[1] to VSL[m]. Thus, the gray levels of the pixels 202 in the row that is connected to the wiring GL[2] are updated. In the period T15, on the basis of the start pulse SSP, the clock signal SCK, and the data ID', image data for the pixels 202 in the row that is connected to the wiring GL[3] (not illustrated) is sequentially stored in the first latches in the columns.

Next, in a period T16, the latch signal SLAT becomes high level. Accordingly, the image data stored in the first latches in the columns in the period T15 is stored in the second latches in the columns, video signals generated by the D/A converter circuits in the columns are supplied to the wirings SL[1] to SL[m], and the potentials VSL[1] to VSL[m] become potentials corresponding to the video signals.

By repeating similar operations, video signals are supplied to the pixels 202 in the rows connected to the wirings GL[4] to GL[n]. In a period T17, video signals are supplied to the pixels 202 in the row connected to the wiring GL[n]. Thus, the image displayed on the pixel group 201 is updated.

In the period T20 during which supply of video signals is stopped, supply of the power supply potential VDD2 to the driver circuit 40 is stopped, so that the operation of the driver circuit 40 is stopped. In addition, supply of the start pulse SSP, the clock signal SCK, and the latch signal SLAT to the driver circuit 40 is stopped. As described above, operation of the driver circuit 40 is stopped in a period during which no video signal is supplied, so that power consumption can be reduced.

The operation of the driver circuit 40 in the period T30 is similar to that in the period T10. Note that in the period T20, operation of both the driver circuit 40 and the driver circuit 210 may be stopped or alternatively, operation of either the driver circuit 40 or the driver circuit 210 may be stopped. Although FIG. 14 illustrates line sequential driving in which video signals are supplied to all the wirings SL at one time, dot sequential driving in which video signals are sequentially supplied to the wirings SL or a method in which supply of video signals is performed for every set of wirings SL may be employed.

As described above, by stopping the operation of the driver circuit 40 or the driver circuit 210 in the period during which the image displayed on the pixel portion 200 does not change, power consumption by the display system can be reduced.

Configuration Example

Figure 15:
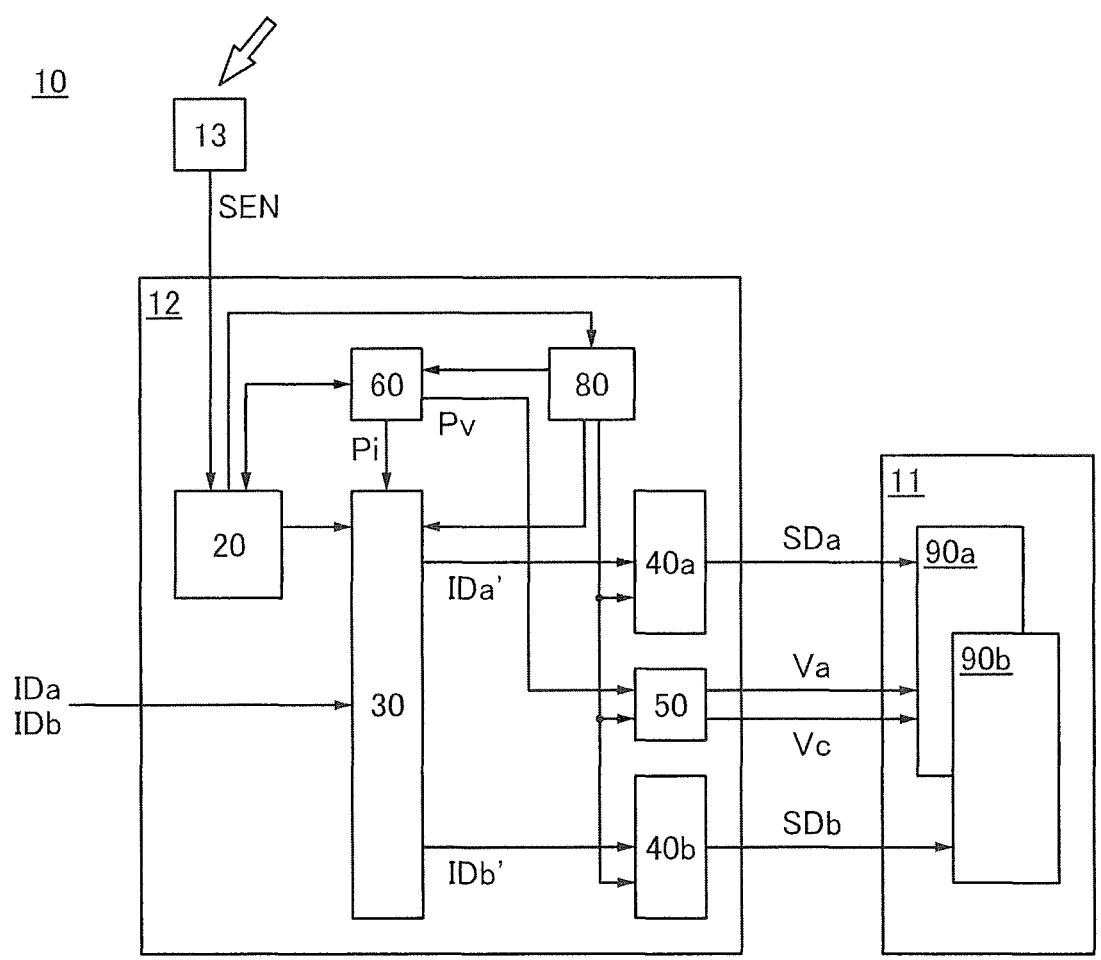
FIG. 15 illustrates a configuration example of a display system.

Next, another configuration example of the display portion 11 is described. FIG. 15 illustrates a configuration example of the display system 10. The display portion 11 illustrated in FIG. 15 is different from that in FIG. 1 in that an image is displayed using a plurality of display units 90. As an example, FIG. 15 illustrates a configuration where the display portion 11 includes two display units 90 (90a and 90b) and the signal generation portion 12 includes two driver circuits 40 (40a and 40b).

The signal generation portion 12 illustrated in FIG. 15 generates a video signal to be supplied to the display unit 90a and a video signal to be supplied to the display unit 90b. Specifically, two kinds of image data (IDa and IDb) is input to the signal generation portion 12. The image processing circuit 30 performs image processing on the data IDa to generate data IDa' and performs image processing on the data IDb to generate data IDb'. Note that the data IDa and the data IDb are corrected with the use of the data Pi input from the memory circuit 60.

The driver circuit 40a generates a video signal (SDa) on the basis of the data IDa' and outputs the video signal to the display unit 90a. The driver circuit 40b generates a video signal (SDb) on the basis of the data IDb' and outputs the video signal to the display unit 90b. Then, the display unit 90a displays an image on the basis of the signal SDa input from the signal generation portion 12, and the display unit 90b displays an image on the basis of the signal SDb input from the signal generation portion 12.

To display an image, both the display unit 90a and the display unit 90b may be used, or alternatively, one of them may be used. When both of them are used, the display unit 90a and the display unit 90b may display one image, or alternatively, the display unit 90a and the display unit 90b may display the respective images. Note that the number of the display units 90 provided in the display portion 11 may be three or more.

Figure 16:
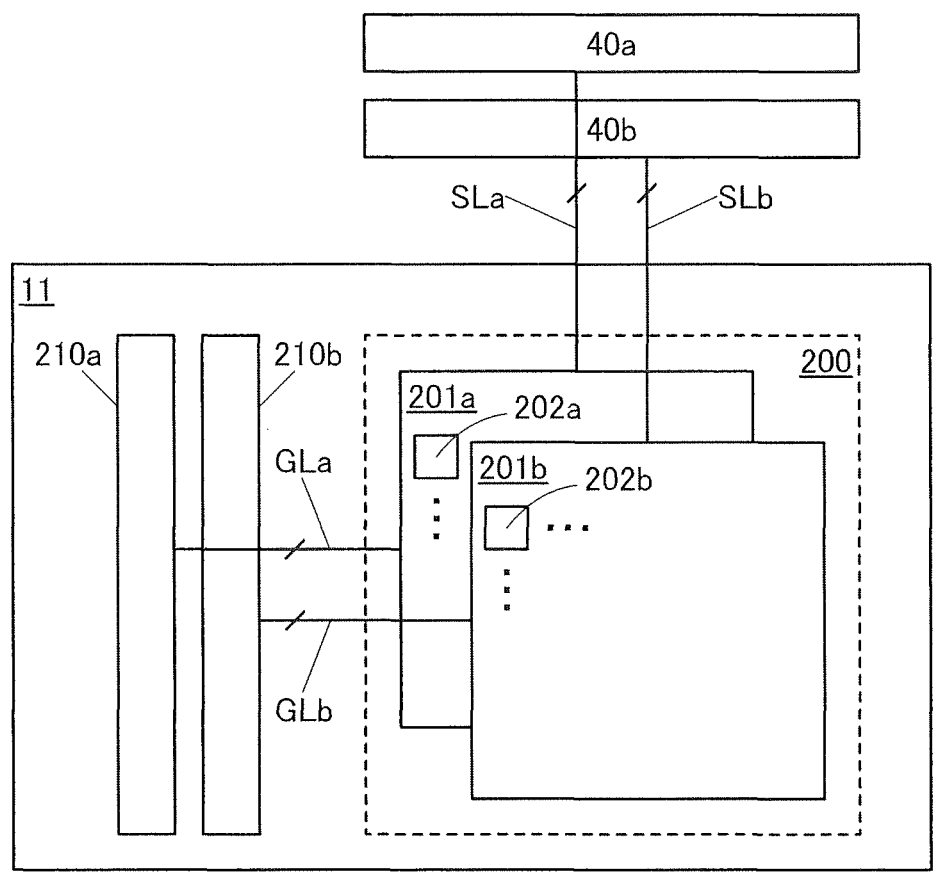
FIG. 16 illustrates a configuration example of a display portion.

FIG. 16 illustrates a specific configuration example of the display portion 11 that includes two display units 90. The display portion 11 illustrated in FIG. 16 includes the pixel portion 200 and driver circuits 210a and 210b. The pixel portion 200 includes a pixel group 201a including a plurality of pixels 202a and a pixel group 201b including a plurality of pixels 202b. The display units 90a and 90b in FIG. 15 respectively correspond to the unit including the pixel group 201a and the driver circuit 210a and the unit including the pixel group 201b and the driver circuit 210b.

The pixels 202a and 202b each include a display element and display a predetermined gray level. The plurality of pixels 202a or the plurality of pixels 202b each display a predetermined gray level, whereby a predetermined image is displayed on the pixel portion 200. The kind and characteristics of the display elements included in the pixels 202a may be the same as or different from those of the display elements included in the pixels 202b. The circuit configuration of the pixels 202a may be the same as or different from that of the pixels 202b.

Examples of the display element include a liquid crystal element and a light-emitting element. As the liquid crystal element, a transmissive liquid crystal element, a reflective liquid crystal element, a transflective liquid crystal element, or the like can be used. As the display element, a micro electro mechanical systems (MEMS) shutter element, an optical interference type MEMS element, or a display element using a microcapsule method, an electrophoretic method, an electrowetting method, an Electronic Liquid Powder (registered trademark) method, or the like can be used, for example. Examples of the light-emitting element are similar to those of the light-emitting element LE in Embodiment 1.

To display an image, both the pixel group 201a and the pixel group 201b may be used, or alternatively, one of them may be used. When both of them are used, the pixel group 201a and the pixel group 201b may display one image, or alternatively, the pixel group 201a and the pixel group 201b may display the respective images.

In the case where either one of the pixel groups 201a and 201b is used to display an image, the pixel group 201 which displays an image can be selected automatically or manually. Note that by providing different display elements in the pixels 202a and 202b, the characteristics, the quality, and the like of an image displayed by the pixel group 201a can be made different from those of an image displayed by the pixel group 201b. In this case, the pixel group 201 which displays an image can be selected in accordance with the surroundings, the content of a displayed image, and the like.

The driver circuit 210 supplies a selection signal to the pixel group 201. Specifically, the driver circuit 210a supplies a selection signal to wirings GLa that are connected to the pixels 202a, and the wirings GLa each transmit the selection signal output from the driver circuit 210a. The driver circuit 210b supplies a selection signal to wirings GLb that are connected to the pixels 202b, and the wirings GLb each transmit the selection signal output from the driver circuit 210b.

The pixel group 201 is connected to the driver circuit 40 of the signal generation portion 12. The driver circuit 40 generates a video signal and supplies the video signal to the pixel group 201. Specifically, the driver circuit 40a supplies video signals to wirings SLa connected to the pixels 202a, and the driver circuit 40b supplies video signals to wirings SLb connected to the pixels 202b. The video signals supplied to the wirings SLa and SLb are written to the pixels 202a and 202b selected by the driver circuits 210a and 210b. Accordingly, an image is displayed on the pixel portion 200.

Figure 17:
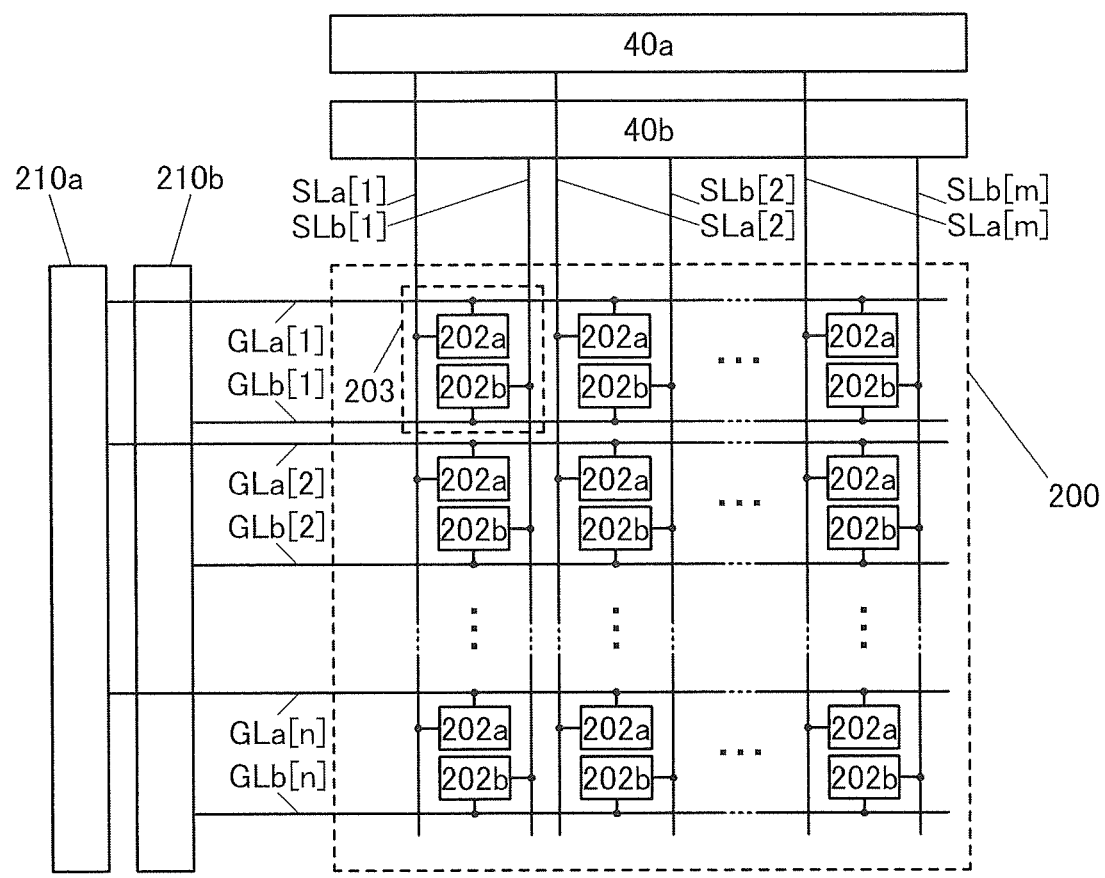
FIG. 17 illustrates a configuration example of a pixel portion.

FIG. 17 illustrates a configuration example of the pixel portion 200. The pixel portion 200 includes the pixels 202a and the pixels 202b arranged in m columns and n rows. The pixel 202a in the i-th column and the j-th row is connected to a wiring SLa[i] and a wiring GLa[j]. The pixel 202b in the i-th column and the j-th row is connected to a wiring SLb[i] and a wiring GLb[j]. Wirings GLa[1] to GLa[n] are connected to the driver circuit 210a, and wirings GLb[1] to GLb[m] are connected to the driver circuit 210b. Wirings SLa[1] to SLa[m] are connected to the driver circuit 40a, and wirings SLb[1] to SLb[m] are connected to the driver circuit 40b.

The pixels 202a and the pixels 202b are alternately provided in the direction in which the wirings SLa and SLb extend (the vertical direction), and the pixel 202a and the pixel 202b constitute a pixel unit 203. When the pixels 202a and the pixels 202b coexist in one pixel portion 200 in this manner, display by the pixels 202a and display by the pixels 202b can be performed in one region. In addition, when performed at the same time, the display by the pixels 202a and the display by the pixels 202b can be synthesized.

Here, OS transistors are preferably used in the pixels 202a and 202b. In that case, the frequency of rewriting video signals into the pixels 202a and 202b can be considerably reduced in a period during which the image displayed on the pixel portion 200 does not change, leading to reduced power consumption.

The display elements provided in the pixels 202a and 202b can be freely selected. For example, a transmissive liquid crystal element or a light-emitting element can be provided in the pixel 202a and a reflective liquid crystal element can be provided in the pixel 202b. In that case, the display portion 11 can display a vivid image with high color reproducibility (wide color gamut) and high contrast by using the pixel group 201a and can perform display consuming low power by using the pixel group 201b.

As an example, the case where the pixel 202a includes a light-emitting element and the pixel 202b includes a reflective liquid crystal element is described. Since the reflective liquid crystal element does not need a light source other than external light at the time of display, an image can be displayed with low power consumption. On the other hand, the light-emitting element operates at higher speed than the reflective liquid crystal element and thus allows displayed images to be switched quickly. For example, a still image that is a background, characters, and the like can be displayed by the reflective liquid crystal element, whereas a moving image and the like can be displayed by the light-emitting element. Accordingly, the power consumption can be reduced and high-quality images can be displayed. Such a structure is suitable for the case where the display portion 11 is used for a teaching material such as a textbook, a notebook, or the like.

When an image is displayed using reflected light from a liquid crystal element and light emission from a light-emitting element, the image can be corrected by controlling the luminance of the light-emitting element. For example, correction such as dimming or toning can be performed by changing the luminance of the light-emitting element in accordance with a change in the intensity of the external light, whereby the viewability of the image displayed on the display portion 11 can be improved.

As illustrated in FIG. 15, the signal generation portion 12 can include a switch circuit 80. The switch circuit 80 controls power supply to the image processing circuit 30, the driver circuit 40, the power supply circuit 50, and the memory circuit 60. Whether power is supplied is determined on the basis of the control signal input from the controller 20. In the period during which the image processing circuit 30, the driver circuit 40, the power supply circuit 50, or the memory circuit 60 is not used, the controller 20 controls the conduction of the switch circuit 80 to stop power supply to the image processing circuit 30, the driver circuit 40, the power supply circuit 50, or the memory circuit 60. Thus, the power consumption of the signal generation portion 12 can be reduced.

Figure 18A:
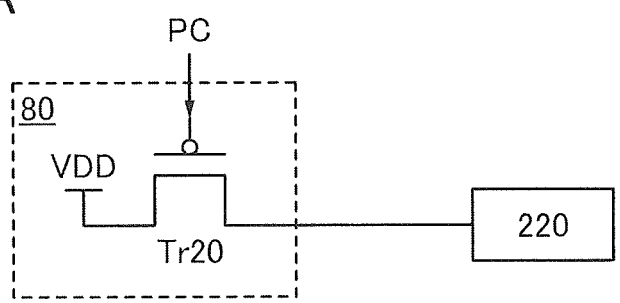
FIGS. 18A and 18B each illustrate a configuration example of a switch circuit.

FIG. 18A illustrates a configuration example of the switch circuit 80. The switch circuit 80 includes a transistor Tr20. A gate of the transistor Tr20 is connected to a terminal to which a control signal (signal PC) is input from the controller 20, one of a source and a drain of the transistor Tr20 is connected to a circuit 220, and the other of the source and the drain is connected to a wiring to which a high power supply potential VDD is supplied. Although the transistor Tr20 is a p-channel transistor in the description here, the transistor Tr20 may be an n-channel transistor. The power supply potential supplied to the transistor Tr20 may be a low power supply potential VSS (e.g., a ground potential).

The circuit 220 is provided in the signal generation portion 12 and power supply to the circuit 220 is controlled by the switch circuit 80. The circuit 220 corresponds to, for example, the image processing circuit 30, the driver circuit 40a or 40b, the power supply circuit 50, the memory circuit 60, or the like in FIG. 15.

When a low-level potential is supplied from the controller 20 as the signal PC, the transistor Tr20 is turned on and the power supply potential VDD is supplied to the circuit 220. In this manner, power is supplied to the circuit 220. In contrast, when a high-level potential is supplied from the controller 20 as the signal PC, the transistor Tr20 is turned off and the supply of the power supply potential VDD to the circuit 220 is stopped. As a result, power supply to the circuit 220 is stopped.

Figure 18B:
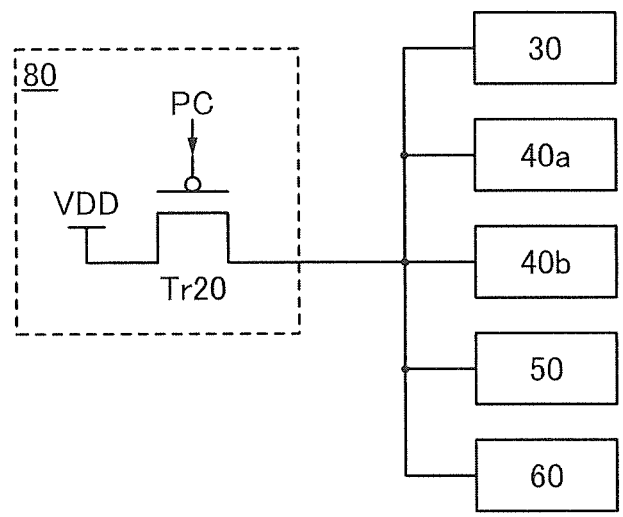

Note that one transistor Tr20 in the switch circuit 80 may control power supply to a plurality of circuits. For example, as illustrated in FIG. 18B, power supply to the image processing circuit 30, the driver circuits 40a and 40b, the power supply circuit 50, and the memory circuit 60 may be collectively controlled with the use of the transistor Tr20.

Note that an OS transistor is preferably used as the transistor Tr20. In that case, current leakage can be extremely small in the period during which the transistor Tr20 is off, and power consumption can be reduced more effectively. Note that the transistor Tr20 is not necessarily the OS transistor.

The OS transistor used as the transistor Tr20 may have a back gate.

As described above, the display system 10 can perform display using a plurality of display units 90. For example, the display unit 90a can include the light-emitting element in Embodiment 1 the voltage application to which is controlled, and the display unit 90b can include a reflective liquid crystal element. In that case, the light-emitting element the voltage application to which is controlled can be used to perform display when the intensity of the external light is lower than a predetermined level; the reflective liquid crystal element can be used to perform display when the intensity of the external light is higher than or equal to the predetermined level. In this manner, a display system can be provided in which power consumption is reduced and viewability is ensured.

This embodiment can be combined with any of the other embodiments as appropriate.

Embodiment 3

In this embodiment, a more specific configuration example of the display system described in the above embodiment is described.

<Configuration Example of Display System>

Figure 19:
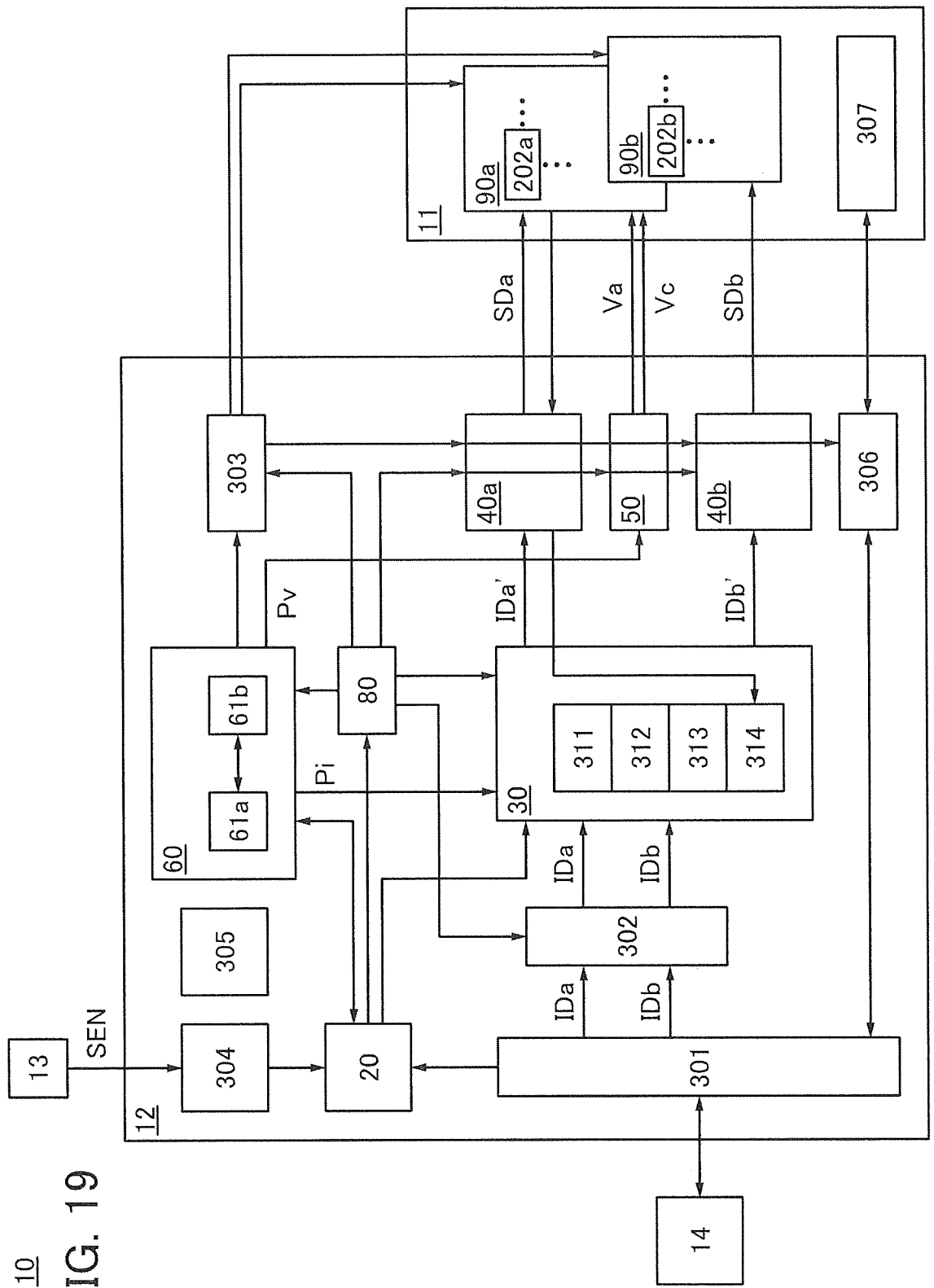
FIG. 19 illustrates a configuration example of a display system.

FIG. 19 illustrates a specific example of the display system 10. The signal generation portion 12 in FIG. 19 includes, in addition to the circuits illustrated in FIG. 15, an interface 301, a frame memory 302, a timing controller 303, a sensor controller 304, a clock generation circuit 305, and a touch sensor controller 306. The image processing circuit 30 includes a dimming circuit 311, a toning circuit 312, and a gamma correction circuit 313. The memory circuit 60 includes the register portions 61a and 61b illustrated in FIG. 5.

The display portion 11 includes the display unit 90a including the pixels 202a and the display unit 90b including the pixels 202b. As an example, the case where the pixel 202a includes a light-emitting element and the pixel 202b includes a reflective liquid crystal element is described here. In addition, the display portion 11 may include a touch sensor unit 307 having a function of obtaining information on whether touch operation is performed, touch position, or the like. In the case where the display portion 11 does not include the touch sensor unit 307, the touch sensor controller 306 may be omitted.

Although the display portion 11 includes a plurality of display units 90 in the configuration described here, the configuration illustrated in FIG. 19 can also be used in the case where the display portion 11 includes one display unit 90. In that case, each of image data input to the signal generation portion 12 and a video signal output from the signal generation portion 12 is of one kind.

The signal generation portion 12 communicates with a host 14. The communication between the signal generation portion 12 and the host 14 is performed via the interface 301. Image data, various control signals, and the like are transmitted from the host 14 to the signal generation portion 12. Information on whether touch operation is performed, touch position, and the like, which is obtained by the touch sensor controller 306, is transmitted from the signal generation portion 12 to the host 14. Note that the circuits in the signal generation portion 12 are appropriately selected in accordance with the standard of the host 14, the specifications of the display portion 11, or the like. The host 14 corresponds to a processor that controls the operation of the signal generation portion 12, for example, and can be formed using a central processing unit (CPU), a graphics processing unit (GPU), or the like.

The frame memory 302 stores image data input to the signal generation portion 12. Specifically, the frame memory 302 stores the data ID and outputs it to the image processing circuit 30.

In the case where the image data input from the host 14 to the signal generation portion 12 is compressed, compressed data is stored in the frame memory 302. The compressed data output from the frame memory 302 is decompressed by a decoder and then output to the image processing circuit 30. The decoder can be provided between the frame memory 302 and the interface 301.

The timing controller 303 generates timing signals to be used in the driver circuit 40, the touch sensor controller 306, the driver circuits 210a and 210b included in the display units 90a and 90b (see FIG. 16), and the like. A parameter used for generating the timing signal is stored in the memory circuit 60. By changing the parameter input to the timing controller 303, the waveform of the timing signal generated by the timing controller 303 can be controlled.

The sensor controller 304 generates a control signal on the basis of the signal SEN and outputs it to the controller 20. The controller 20 controls operation of the image processing circuit 30, the memory circuit 60, and the switch circuit 80 on the basis of the input control signal. The clock generation circuit 305 generates a clock signal used in the signal generation portion 12.

The touch sensor controller 306 controls the operation of the touch sensor unit 307. A signal including touch information detected by the touch sensor unit 307 is processed in the touch sensor controller 306 and transmitted to the host 14 through the interface 301. The host 14 can generate image data reflecting the touch information and transmit it to the signal generation portion 12. The signal generation portion 12 may have a function of reflecting the touch information in the image data. The touch sensor controller 306 may be provided in the touch sensor unit 307.

The image processing circuit 30 corrects the data ID with the use of the dimming circuit 311, the toning circuit 312, and the gamma correction circuit 313. The dimming circuit 311 corrects the data ID to correct the luminance. The toning circuit 312 corrects the data ID to correct tone. The gamma correction circuit 313 performs gamma correction on the data ID. The magnitude of the correction by the dimming circuit 311, the toning circuit 312, and the gamma correction circuit 313 can be controlled by changing the parameters input to these circuits.

The parameters to be used in the dimming circuit 311, the toning circuit 312, and the gamma correction circuit 313 are stored in the memory circuit 60. At the time of correction, the parameters stored in the memory circuit 60 are output to the dimming circuit 311, the toning circuit 312, and the gamma correction circuit 313. Here, the controller 20 can make the memory circuit 60 store parameters based on display conditions and make the memory circuit 60 output the parameters to the dimming circuit 311, the toning circuit 312, and the gamma correction circuit 313. Thus, the image processing circuit 30 performs correction in accordance with the display conditions.

Note that the image processing circuit 30 may include a memory device for storing the parameters input from the memory circuit 60. The memory device preferably includes an OS transistor, in which case the parameters can be retained even in the period during which power supply to the image processing circuit 30 is stopped, and image processing can be resumed immediately after resumption of power supply.

The switch circuit 80 controls power supply to the image processing circuit 30, the driver circuits 40a and 40b, the power supply circuit 50, the memory circuit 60, the frame memory 302, and the timing controller 303. Whether power is supplied to these circuits is determined on the basis of the control signal output from the controller 20. The control signal is generated by the controller 20 in accordance with whether there is a change in the image displayed on the display portion 11.

When the driver circuit 40a has a function of detecting current flowing in the light-emitting element provided in the pixel 202a, the image processing circuit 30 may include an EL correction circuit 314. The EL correction circuit 314 adjusts the luminance of the light-emitting element in accordance with the current flowing in the light-emitting element.

The image processing circuit 30 may include another processing circuit such as an RGB-RGBW conversion circuit depending on the specifications of the display portion 11. The RGB-RGBW conversion circuit converts image data of red, green, and blue (RGB) into image signals of red, green, blue, and white (RGBW). That is, in the case where the display portion 11 includes pixels of four colors of RGBW, power consumption can be reduced by displaying a white (W) component in the image data using the white (W) pixel. Note that in the case where the display portion 11 includes pixels of four colors of RGBY, an RGB-RGBY (red, green, blue, and yellow) conversion circuit can be used, for example.

Figure 20:
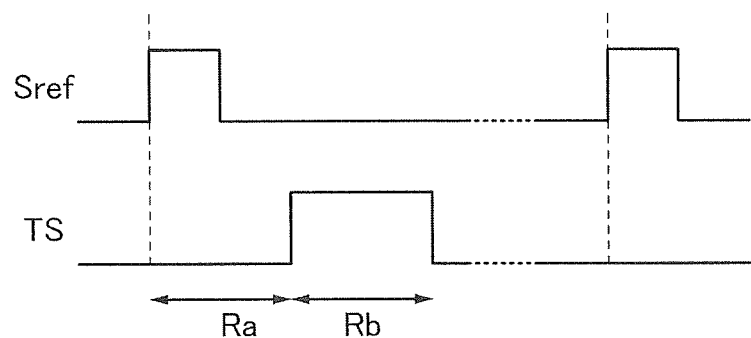
FIG. 20 illustrates an operation example of a timing controller.

The timing controller 303 can generate a timing signal with the use of the parameters stored in the memory circuit 60. FIG. 20 illustrates an operation example of the timing controller 303 generating a timing signal. A signal Sref is a reference signal input to the timing controller 303 and a signal TS is the timing signal generated by the timing controller 303.

Using the reference signal Sref as the reference, the timing controller 303 sets the timing when the signal TS becomes high level from low level and the timing when the signal TS becomes low level from high level, thereby changing the waveform of the signal TS. These timings are set using the parameters input from the memory circuit 60. In FIG. 20, Ra is a parameter for defining the period during which the signal TS is low level after the reference signal Sref becomes high level. Rb is a parameter for defining the period during which the signal TS keeps on being high level after the period corresponding to Ra. By changing the parameter input from the memory circuit 60, the waveform of the timing signal generated by the timing controller 303 can be changed.

Note that parameters other than the above-described parameters can also be stored in the memory circuit 60. Examples of the parameters that can be stored in the memory circuit 60 include data in the EL correction circuit 314, the sensitivity of the touch sensor controller 306, and the luminance of an image, the tone of the image, and energy-saving details (e.g., time duration before display is dimmed or turned off) that are set by the user.

<Configuration Example of Frame Memory>

Next, a configuration example of the frame memory 302 is described. FIG. 21A shows a configuration example of the memory device 350 that can be used in the frame memory 302. The memory device 350 includes a control portion 351, a cell array 352, and a peripheral circuit 353. The peripheral circuit 353 includes a sense amplifier circuit 354, a driver circuit 355, a main amplifier 356, and an input/output circuit 357.

The control portion 351 has a function of controlling the memory device 350. For example, the control portion 351 has a function of controlling the driver circuit 355, the main amplifier 356, and the input/output circuit 357.

A plurality of wirings WL and CSEL are connected to the driver circuit 355. The driver circuit 355 generates signals output to the plurality of wirings WL and CSEL.

The cell array 352 includes a plurality of memory cells 358. The memory cells 358 are connected to wirings WL, LBL (or LBLB), and BGL. The wiring WL is a word line. The wirings LBL and LBLB are local bit lines. Although a folded-bit-line method is employed for the configuration of the cell array 352 in the example of FIG. 21A, an open-bit-line method can also be employed.

FIG. 21B illustrates a configuration example of the memory cell 358. The memory cell 358 includes a transistor MW1 and a capacitor CS1. The memory cell 358 has a circuit configuration similar to that of a memory cell for a dynamic random access memory (DRAM). The transistor MW1 in this example is a transistor having a back gate. The back gate of the transistor MW1 is connected to a wiring BGL. A potential Vbg is input to the wiring BGL.

The transistor MW1 is an OS transistor. The use of the OS transistor in the memory cell 358 can inhibit leakage of charge from the capacitor CS1 owing to the extremely low off-state current of the OS transistor; thus, the frequency of refresh operation of the memory device 350 of the frame memory 302 can be reduced. The memory device 350 of the frame memory 302 can retain image data for a long time even when power supply is stopped. Moreover, by setting the potential Vbg to a negative potential, the threshold voltage of the transistor MW1 can be shifted to the positive potential side and thus the retention time of the memory cell 358 can be increased.

Here, an off-state current refers to a current that flows between a source and a drain of a transistor in an off state. The off-state current of an OS transistor normalized on the channel width can be, for example, lower than or equal to $10 \times 10^{-21}$ A/μm (10 zA/μm) with a source-drain voltage of 10 V at room temperature (approximately 25° C.). It is preferable that the off-state current of the OS transistor used as the transistor MW1 be lower than or equal to $1 \times 10^{-18}$ A, lower than or equal to $1 \times 10^{-21}$ A, or lower than or equal to $1 \times 10^{-24}$ A at room temperature (approximately 25° C.). Alternatively, the off-state current is preferably lower than or equal to $1 \times 10^{-15}$ A, lower than or equal to $1 \times 10^{-18}$ A, or lower than or equal to $1 \times 10^{-21}$ A at 85° C.

A channel formation region of the OS transistor is preferably formed using a metal oxide containing at least one of indium (In) and zinc (Zn). Typical examples of the metal oxide include In oxide, Zn oxide, In—Zn oxide, and In-M-Zn oxide (element M is Al, Ti, Ga, Y, Zr, La, Ce, Nd, or Hf). A reduction in impurities serving as electron donors, such as hydrogen, and a reduction in oxygen vacancies can make a metal oxide i-type (intrinsic) or substantially i-type. Such a metal oxide can be referred to as a highly purified metal oxide. The carrier density of the metal oxide can be, for example, lower than $8 \times 10^{15}$ cm$^{-3}$, preferably lower than $1 \times 10^{11}$ cm$^{-3}$, further preferably lower than $1 \times 10^{10}$ cm$^{-3}$ and higher than or equal to $1 \times 10^{-9}$ cm$^{-3}$.

The metal oxide has a large energy gap. Electrons are unlikely to be excited, and the effective mass of a hole is large. Thus, an avalanche breakdown and the like are less likely to occur in some cases in an OS transistor than in a Si transistor. Since hot-carrier degradation or the like due to the avalanche breakdown is inhibited, the OS transistor has high drain withstand voltage and can be driven at high drain voltage. Thus, when the OS transistor is used as the transistor MW1, the range of potentials to be retained in the capacitor CS1 can be widened.

The transistors included in the circuits other than the memory cell 358 may be transistors other than the OS transistor. For example, a transistor in which a channel formation region is formed in part of a substrate that contains a single-crystal semiconductor other than a metal oxide may be used. Examples of this kind of substrate include a single-crystal silicon substrate and a single-crystal germanium substrate. In addition, a transistor whose channel formation region is formed in a film containing a semiconductor material other than a metal oxide can also be used as the transistor Tr20. For example, a transistor in which an amorphous silicon film, a microcrystalline silicon film, a polycrystalline silicon film, a single-crystal silicon film, an amorphous germanium film, a microcrystalline germanium film, a polycrystalline germanium film, or a single-crystal germanium film is used for its semiconductor layer can be used. For example, when the transistor included in the circuits other than the memory cell 358 is a Si transistor formed over a silicon wafer, the cell array 352 can be stacked over the sense amplifier circuit 354. As a result, the circuit area of the memory device 350 can be reduced.

The cell array 352 is stacked over the sense amplifier circuit 354. The sense amplifier circuit 354 includes a plurality of sense amplifiers SA. The sense amplifiers SA are connected to adjacent wirings LBL and LBLB (a pair of local bit lines), wirings GBL and GBLB (a pair of global bit lines), and the plurality of wirings CSEL. The sense amplifiers SA have a function of amplifying the potential difference between the wirings LBL and LBLB.

In the sense amplifier circuit 354, one wiring GBL is provided for four wirings LBL, and one wiring GBLB is provided for four wirings LBLB. However, the configuration of the sense amplifier circuit 354 is not limited to the configuration example of FIG. 21A.

The main amplifier 356 is connected to the sense amplifier circuit 354 and the input/output circuit 357. The main amplifier 356 has a function of amplifying the potential difference between the wirings GBL and GBLB. The main amplifier 356 is not necessarily provided.

The input/output circuit 357 has a function of outputting a potential corresponding to write data to the wirings GBL and GBLB or the main amplifier 356 and a function of reading the potentials of the wirings GBL and GBLB or an output potential of the main amplifier 356 and outputting the potential(s) to the outside as data. The sense amplifier SA from which data is read and the sense amplifier SA to which data is written can be selected using the signal of the wiring CSEL. Therefore, there is no need to provide a selection circuit such as a multiplexer in the input/output circuit 357. Thus, the input/output circuit 357 can have a simple circuit configuration and a small occupied area.

When including the OS transistor as described above, the frame memory 302 can retain image data even in the period during which power supply is stopped. Accordingly, at the time of resumption of power supply to the frame memory 302, generation of a video signal can start before image data is input from the host 14 (see FIG. 19). As a result, power gating that enables quick start can be performed.

Note that the memory device 350 in FIGS. 21A and 21B can be provided in the image processing circuit 30 in FIG. 19. In that case, the parameters to be used in the dimming circuit 311, the toning circuit 312, and the gamma correction circuit 313 can be stored in the memory device 350 provided in the image processing circuit 30. In addition, even in the period during which power supply to the image processing circuit 30 is stopped, the parameters can be retained in the memory device 350 provided in the image processing circuit 30.

This embodiment can be combined with any of the other embodiments as appropriate.

Embodiment 4

In this embodiment, structure examples of a display device that can be used for the display system described in the above embodiment will be described.

Figure 22A:
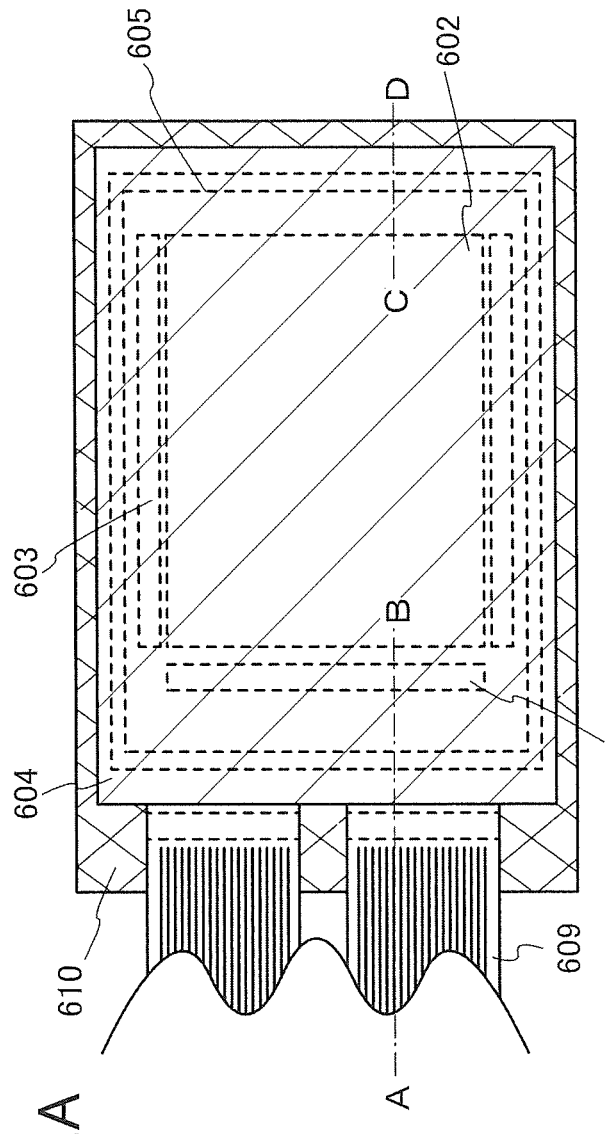
FIGS. 22A and 22B illustrate a structure example of a display device.
Figure 22B:
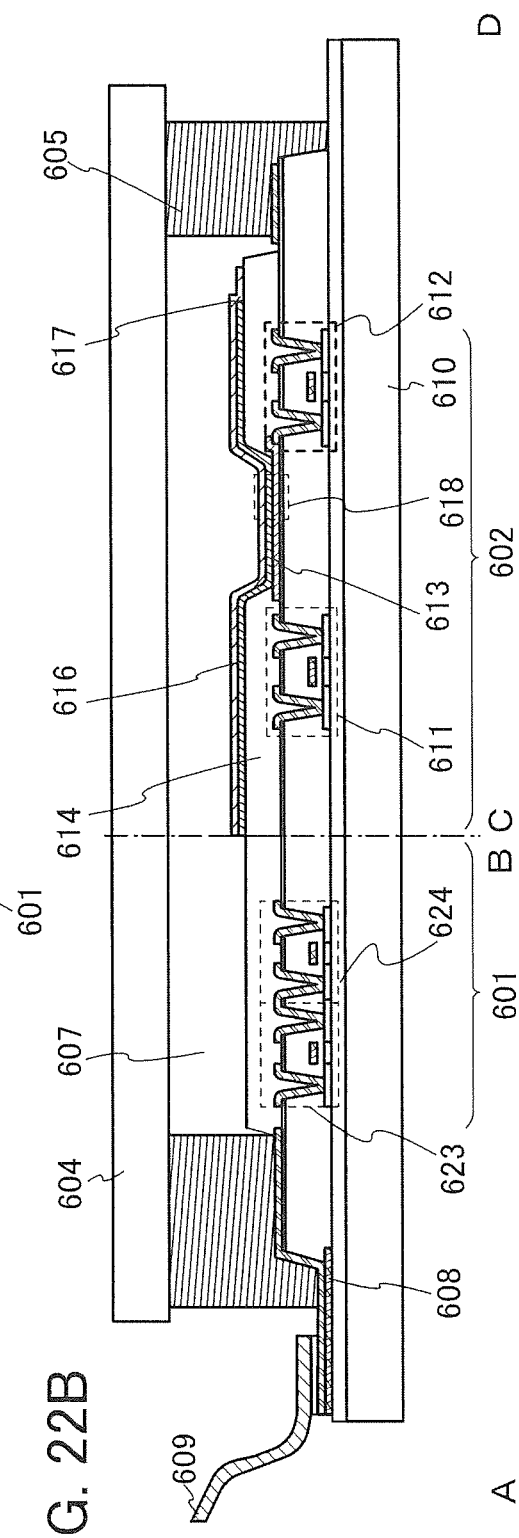

FIGS. 22A and 22B illustrate a structure example of a display device that can be used in the display portion 11 in the above embodiment. Note that FIG. 22A is a top view of the display device and FIG. 22B is a cross-sectional view taken along the lines A-B and C-D in FIG. 22A. The display device includes a driver circuit portion (source line driver circuit) 601, a pixel portion 602, and a driver circuit portion (gate line driver circuit) 603, which control light emission of a light-emitting element and are illustrated with dotted lines. Furthermore, reference numeral 604 denotes a sealing substrate and reference numeral 605 denotes a sealant. A portion surrounded by the sealant 605 is a space 607.

Note that a lead wiring 608 is a wiring for transmitting signals to be input to the source line driver circuit 601 and the gate line driver circuit 603 and for receiving a video signal, a clock signal, a start signal, a reset signal, and the like from a flexible printed circuit (FPC) 609 functioning as an external input terminal. Although only the FPC is illustrated here, a printed wiring board (PWB) may be attached to the FPC. The display device in this specification includes, in its category, not only the display device itself but also the display device provided with the FPC or the PWB.

Next, a cross-sectional structure is described with reference to FIG. 22B. The driver circuit portion and the pixel portion are formed over an element substrate 610. Here, the source line driver circuit 601, which is the driver circuit portion, and one pixel of the pixel portion 602 are illustrated.

In the source line driver circuit 601, a CMOS circuit is formed in which an n-channel FET 623 and a p-channel FET 624 are combined. The driver circuit may be formed using various circuits such as a CMOS circuit, a PMOS circuit, or an NMOS circuit. Although a driver-integrated type where the driver circuit is formed over the substrate is described in this embodiment, a driver circuit is not necessarily formed over a substrate; a driver circuit may be formed outside a substrate.

The pixel portion 602 includes a plurality of pixels including a switching FET 611, a current controlling FET 612, and a first electrode 613 electrically connected to a drain of the current controlling FET 612. One embodiment of the present invention is not limited to this structure. The pixel portion may include three or more FETs and a capacitor in combination.

The kind and crystallinity of a semiconductor used for the FETs are not particularly limited; an amorphous semiconductor or a crystalline semiconductor may be used. Examples of the semiconductor used for the FETs include Group 13 semiconductors, Group 14 semiconductors, compound semiconductors, metal oxides, and organic semiconductor materials. Metal oxides are particularly preferable. Examples of the metal oxide include an In—Ga oxide and an In-M-Zn oxide (M is Al, Ga, Y, Zr, La, Ce, or Nd). Note that a metal oxide that has an energy gap of 2 eV or more, preferably 2.5 eV or more, further preferably 3 eV or more is preferably used, in which case the off-state current of the transistors can be reduced.

Note that an insulator 614 is formed so as to cover an end portion of the first electrode 613. The insulator 614 can be formed using a positive photosensitive acrylic resin film here.

In order to improve the coverage, the insulator 614 is formed to have a curved surface with curvature at its upper or lower end portion. For example, in the case where a positive photosensitive acrylic resin is used for a material of the insulator 614, only the upper end portion of the insulator 614 preferably has a curved surface with a curvature radius (0.2 µm to 3 µm). Moreover, either a negative photosensitive resin or a positive photosensitive resin can be used for the insulator 614.

An EL layer 616 and a second electrode 617 are formed over the first electrode 613. The EL layer 616 preferably contains an organometallic complex. The organometallic complex is preferably used as an emission center substance in a light-emitting layer.

The sealing substrate 604 is attached using the sealant 605 to the element substrate 610; thus, a light-emitting element 618 is provided in the space 607 surrounded by the element substrate 610, the sealing substrate 604, and the sealant 605. The space 607 is filled with filler, and may be filled with an inert gas (e.g., nitrogen or argon) or the sealant 605. It is preferable that the sealing substrate 604 be provided with a recessed portion and a drying agent be provided in the recessed portion, in which case deterioration due to the influence of moisture can be suppressed.

An epoxy resin or glass frit is preferably used for the sealant 605. A material used for them is desirably a material that transmits as little moisture or oxygen as possible. As the element substrate 610 and the sealing substrate 604, a glass substrate, a quartz substrate, or a plastic substrate formed of fiber reinforced plastic (FRP), polyvinyl fluoride (PVF), polyester, an acrylic resin, or the like can be used.

In this embodiment, a transistor or a light-emitting element can be formed using any of a variety of substrates, for example. The type of a substrate is not limited to a certain type. As the substrate, a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, a base material film, or the like can be used. As examples of a glass substrate, a barium borosilicate glass substrate, an alumino-borosilicate glass substrate, a soda lime glass substrate, and the like can be given. Examples of the flexible substrate, the attachment film, the base material film, or the like are as follows: plastic typified by polyethylene terephthalate (PET), polyethylene naphthalate (PEN), and polyether sulfone (PES). Another example is a synthetic resin such as an acrylic resin. Alternatively, polytetrafluoroethylene (PTFE), polypropylene, polyester, polyvinyl fluoride, polyvinyl chloride, or the like can be used. Alternatively, polyamide, polyimide, aramid, an epoxy resin, an inorganic film formed by evaporation, paper, or the like can be used. Specifically, the use of semiconductor substrates, single crystal substrates, SOI substrates, or the like enables the manufacture of small-sized transistors with a small variation in characteristics, size, shape, or the like and with high current capability. A circuit using such transistors achieves lower power consumption of the circuit or higher integration of the circuit.

Alternatively, a flexible substrate may be used as the substrate, and the transistor or the light-emitting element may be provided directly on the flexible substrate. Still alternatively, a separation layer may be provided between a substrate and the transistor or between the substrate and the light-emitting element. The separation layer can be used when part or the whole of a semiconductor device formed over the separation layer is separated from the substrate and transferred onto another substrate. In such a case, the transistor can be transferred to a substrate having low heat resistance or a flexible substrate as well. For the above separation layer, a stack including inorganic films, which are a tungsten film and a silicon oxide film, or an organic resin film of polyimide or the like formed over a substrate can be used, for example.

In other words, a transistor or a light-emitting element may be formed using one substrate, and then transferred to another substrate. Examples of the substrate to which the transistor or the light-emitting element is transferred include, in addition to the above-described substrates over which transistors can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, and a rubber substrate. When such a substrate is used, a transistor with excellent properties or a transistor with low power consumption can be formed, a device with high durability and high heat resistance can be provided, or a reduction in weight or thickness can be achieved.

FIGS. 23A and 23B each illustrate an example of a display device in which full color display is achieved by forming a light-emitting element exhibiting white light emission and using coloring layers (color filters) and the like. FIG. 23A illustrates a substrate 701, a base insulating film 702, a gate insulating film 703, gate electrodes 706, 707, and 708, a first interlayer insulating film 720, a second interlayer insulating film 721, a peripheral portion 742, a pixel portion 740, a driver circuit portion 741, first electrodes 724W, 724R, 724G, and 724B of light-emitting elements, a partition 725, an EL layer 728, a second electrode 729 of the light-emitting elements, a sealing substrate 731, a sealant 732, and the like.

In FIG. 23A, coloring layers (a red coloring layer 734R, a green coloring layer 734G, and a blue coloring layer 734B) are provided on a transparent base material 733. A black layer (a black matrix) 735 may be additionally provided. The transparent base material 733 provided with the coloring layers and the black layer is positioned and fixed to the substrate 701. Note that the coloring layers and the black layer are covered with an overcoat layer. In FIG. 23A, light emitted from some of the light-emitting layers does not pass through the coloring layers, while light emitted from the others of the light-emitting layers passes through the coloring layers. Since light that does not pass through the coloring layers is white and light that passes through any one of the coloring layers is red, blue, or green, an image can be displayed using pixels of the four colors.

FIG. 23B illustrates an example in which the coloring layers (the red coloring layer 734R, the green coloring layer 734G, and the blue coloring layer 734B) are formed between the gate insulating film 703 and the first interlayer insulating film 720. As in this structure, the coloring layers may be provided between the substrate 701 and the sealing substrate 731.

Figure 24:
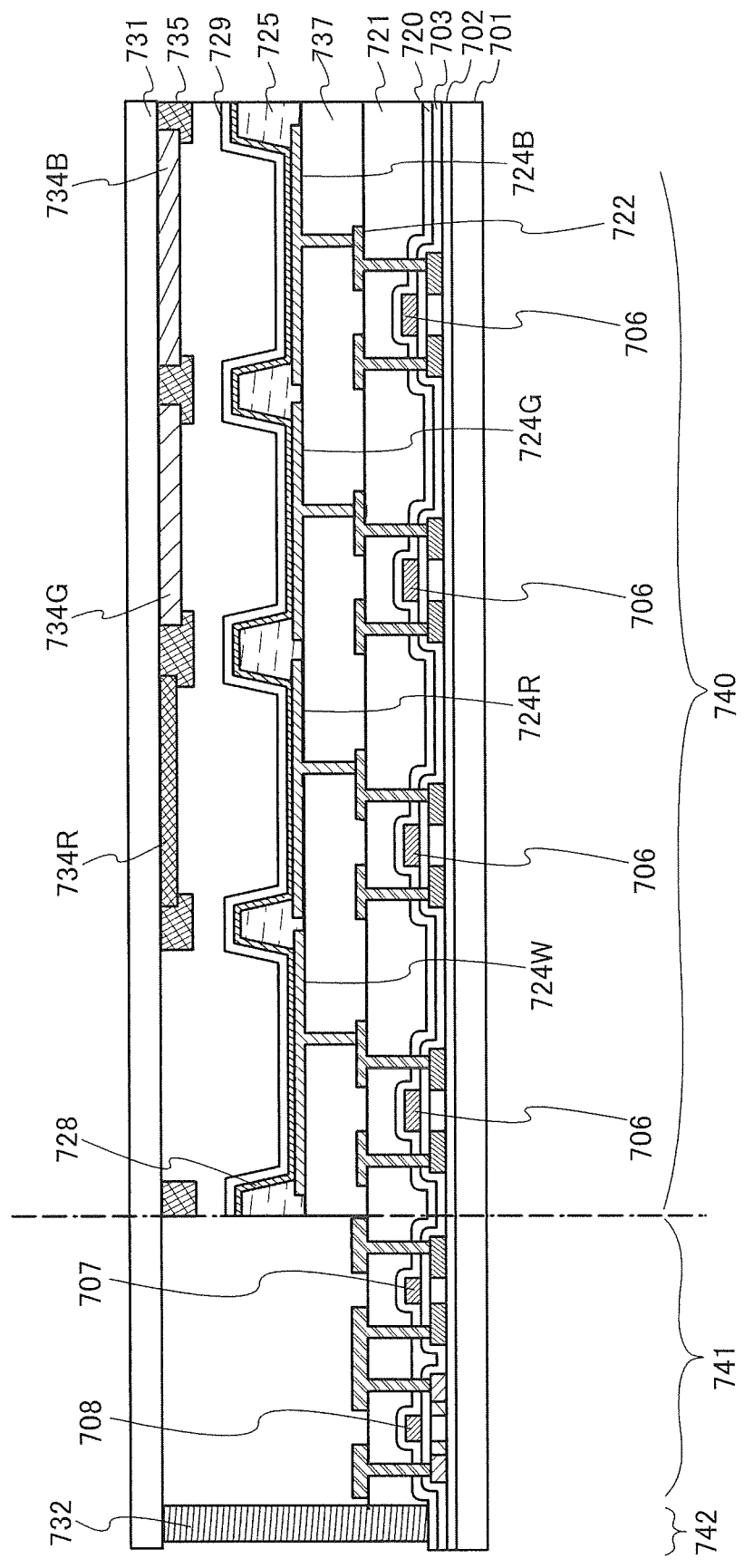
FIG. 24 illustrates a structure example of a display device.

The above-described display device has a structure in which light is extracted from the substrate 701 side where the FETs are formed (a bottom emission structure), but may have a structure in which light is extracted from the sealing substrate 731 side (a top emission structure). FIG. 24 is a cross-sectional view of a display device having a top emission structure. In that case, a substrate that does not transmit light can be used as the substrate 701. The process up to the step of forming of a connection electrode which connects the FET and the anode of the light-emitting element is performed in a manner similar to that of the display device having a bottom emission structure. Then, a third interlayer insulating film 737 is formed to cover an electrode 722. This insulating film may have a planarization function. The third interlayer insulating film 737 can be formed using a material similar to that of the second interlayer insulating film, or can be formed using any other various materials.

The first electrodes 724W, 724R, 724G, and 724B of the light-emitting elements each function as an anode here, but may each function as a cathode. Furthermore, in the case of the display device having a top emission structure as illustrated in FIG. 24, the first electrodes are preferably reflective electrodes. The EL layer 728 is formed to have a structure with which white light emission can be obtained.

In the case of a top emission structure as illustrated in FIG. 24, sealing can be performed with the sealing substrate 731 on which the coloring layers (the red coloring layer 734R, the green coloring layer 734G, and the blue coloring layer 734B) are provided. The sealing substrate 731 may be provided with the black layer (the black matrix) 735 which is positioned between pixels. The coloring layers (the red coloring layer 734R, the green coloring layer 734G, and the blue coloring layer 734B) and the black layer may be covered with the overcoat layer. Note that a light-transmitting substrate is used as the sealing substrate 731.

Although an example in which full color display is performed using four colors of red, green, blue, and white is shown here, there is no particular limitation and full color display using three colors of red, green, and blue or four colors of red, green, blue, and yellow may be performed.

This embodiment can be combined with any of the other embodiments as appropriate.

Embodiment 5

In this embodiment, a structure example of a display module including any of the display devices described in the above embodiments will be described.

Figure 25:
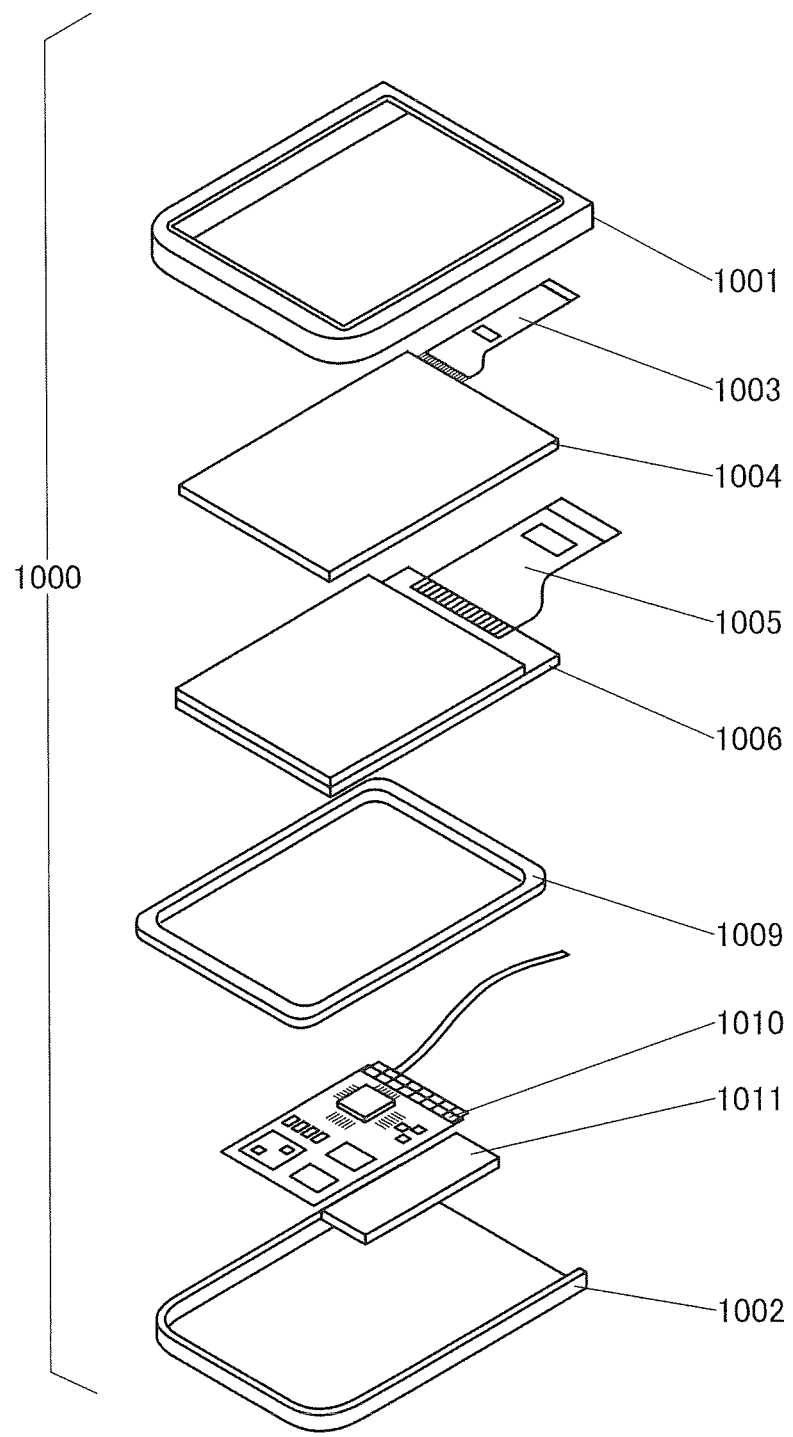
FIG. 25 illustrates a structure example of a display module.

In a display module 1000 illustrated in FIG. 25, a touch panel 1004 connected to an FPC 1003, a display device 1006 connected to an FPC 1005, a frame 1009, a printed circuit board 1010, and a battery 1011 are provided between an upper cover 1001 and a lower cover 1002.

The display device described in the above embodiment can be used as the display device 1006.

The shapes and sizes of the upper cover 1001 and the lower cover 1002 can be changed as appropriate in accordance with the sizes of the touch panel 1004 and the display device 1006.

The touch panel 1004 can be a resistive touch panel or a capacitive touch panel and may be formed to overlap with the display device 1006. Instead of providing the touch panel 1004, the display device 1006 can have a touch panel function.

The frame 1009 protects the display device 1006 and also functions as an electromagnetic shield for blocking electromagnetic waves generated by the operation of the printed circuit board 1010. The frame 1009 may also function as a radiator plate.

The printed circuit board 1010 is provided with a power supply circuit and a signal processing circuit for outputting a video signal and a clock signal. As a power source for supplying power to the power supply circuit, an external commercial power source or a power source using the battery 1011 provided separately may be used. The battery 1011 can be omitted in the case of using a commercial power source.

The display module 1000 may be additionally provided with a member such as a polarizing plate, a retardation plate, or a prism sheet.

This embodiment can be combined with any of the other embodiments as appropriate.

Embodiment 6

In this embodiment, a structure example of an OS transistor that can be used in the above embodiment will be described.

<Structure Example of Transistor>

FIG. 26A is a top view illustrating a structure example of a transistor. FIG. 26B is a cross-sectional view taken along line X1-X2 in FIG. 26A. FIG. 26C is a cross-sectional view taken along line Y1-Y2 in FIG. 26A. In some cases, the direction of line X1-X2 is referred to as a channel length direction, and the direction of line Y1-Y2 is referred to as a channel width direction. FIG. 26B illustrates a cross-sectional structure of the transistor in the channel length direction, and FIG. 26C illustrates a cross-sectional structure of the transistor in the channel width direction. Note that to clarify the device structure, FIG. 26A does not illustrate some components.

The semiconductor device of one embodiment of the present invention includes insulating layers 812 to 820, metal oxide films 821 to 824, and conductive layers 850 to 853. A transistor 801 is formed over an insulating surface. FIGS. 26A to 26C illustrate the case where the transistor 801 is formed over an insulating layer 811. The transistor 801 is covered with the insulating layer 818 and an insulating layer 819.

Note that the insulating layers, the metal oxide films, the conductive layers, and the like that constitute the transistor 801 may each be a single film, or a stack including a plurality of films. They can be formed by any of a variety of deposition methods such as a sputtering method, a molecular beam epitaxy (MBE) method, a pulsed laser ablation (PLA) method, a CVD method, an atomic layer deposition (ALD) method, and the like. Note that examples of CVD methods include a plasma-enhanced CVD method, a thermal CVD method, and a metal organic CVD method.

The conductive layer 850 includes a region that functions as a gate electrode of the transistor 801. A conductive layer 851 and a conductive layer 852 include regions that function as a source electrode and a drain electrode. The conductive layer 853 includes a region that functions as a back gate electrode. The insulating layer 817 includes a region that functions as a gate insulating layer on the gate electrode (front gate electrode) side, and an insulating layer that is a stack of the insulating layers 814 to 816 includes a region that functions as a gate insulating layer on the back gate electrode side. The insulating layer 818 functions as an interlayer insulating layer. The insulating layer 819 functions as a barrier layer.

The metal oxide films 821 to 824 are collectively referred to as an oxide layer 830. As illustrated in FIGS. 26B and 26C, the oxide layer 830 includes a region where the metal oxide film 821, the metal oxide film 822, and the metal oxide film 824 are stacked in this order. In addition, a pair of the metal oxide films 823 are positioned over the conductive layer 851 and the conductive layer 852. When the transistor 801 is on, a channel formation region is mainly formed in the metal oxide film 822 of the oxide layer 830.

The metal oxide film 824 covers the metal oxide films 821 to 823, the conductive layer 851, and the conductive layer 852. The insulating layer 817 is positioned between the metal oxide film 823 and the conductive layer 850. The conductive layers 851 and 852 each include a region that overlaps with the conductive layer 850 with the metal oxide film 823, the metal oxide film 824, and the insulating layer 817 positioned therebetween.

The conductive layers 851 and 852 are formed from a hard mask that is used in the formation of the metal oxide films 821 and 822. Thus, the conductive layers 851 and 852 do not include a region that is in contact with the side surfaces of the metal oxide films 821 and 822. For example, the metal oxide films 821 and 822 and the conductive layers 851 and 852 can be formed through the following steps. First, a conductive film is formed over a metal oxide film including a stack of two layers. The conductive film is processed (etched) into a desired shape so that a hard mask is formed. The hard mask is used to process the shape of the two-layered metal oxide film, forming the metal oxide films 821 and 822 that are stacked. Next, the hard mask is processed into a desired shape, forming the conductive layers 851 and 852.

Examples of insulating materials used for the insulating layers 811 to 818 include aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, and aluminum silicate. The insulating layers 811 to 818 are formed using a single-layer structure or a stacked-layer structure containing any of these insulating materials. The layers used for the insulating layers 811 to 818 may include a plurality of insulating materials.

In this specification and the like, oxynitride refers to a compound in which the oxygen content is higher than the nitrogen content, and nitride oxide refers to a compound in which the nitrogen content is higher than the oxygen content.

In order to suppress an increase in oxygen vacancies in the oxide layer 830, the insulating layers 816 to 818 preferably contain oxygen. More preferably, the insulating layers 816 to 818 are formed using an insulating film from which oxygen is released by heating (hereinafter such an insulating film is also referred to as an insulating film containing excess oxygen). When oxygen is supplied from the insulating film containing excess oxygen to the oxide layer 830, the oxygen vacancies in the oxide layer 830 can be compensated. Thus, the reliability and electrical characteristics of the transistor 801 can be improved.

The insulating layer containing excess oxygen is a film from which oxygen molecules at more than or equal to $1.0 \times 10^{18}$ molecules/cm$^3$ are released in thermal desorption spectroscopy (TDS) at a surface temperature of the film of higher than or equal to 100° C. and lower than or equal to 700° C., or higher than or equal to 100° C. and lower than or equal to 500° C. The amount of released oxygen molecules is preferably more than or equal to $3.0 \times 10^{20}$ atoms/cm$^3$.

The insulating film containing excess oxygen can be formed by performing treatment for adding oxygen to an insulating film. The treatment for adding oxygen can be performed by heat treatment under an oxygen atmosphere, an ion implantation method, an ion doping method, a plasma immersion ion implantation method, plasma treatment, or the like. As a gas for adding oxygen, an oxygen gas of $^{16}O_2$, $^{18}O_2$, or the like, a nitrous oxide gas, an ozone gas, or the like can be used.

The concentration of hydrogen in the insulating layers 812 to 819 is preferably low in order to prevent an increase in the concentration of hydrogen in the oxide layer 830. In particular, the concentration of hydrogen in the insulating layers 813 to 818 is preferably low. Specifically, the concentration of hydrogen is lower than or equal to $2 \times 10^{20}$ atoms/cm$^3$, preferably lower than or equal to $5\times10^{19}$ atoms/cm$^3$, more preferably lower than or equal to $1\times10^{19}$ atoms/cm$^3$, more preferably lower than or equal to $5\times10^{18}$ atoms/cm$^3$.

The hydrogen concentration is measured by secondary ion mass spectrometry (SIMS).

In the transistor 801, the oxide layer 830 is preferably surrounded by an insulating layer with oxygen and hydrogen barrier properties (hereinafter such an insulating layer is also referred to as a barrier layer). The use of such a structure prevents release of oxygen from the oxide layer 830 and entry of hydrogen into the oxide layer 830. Thus, the reliability and electrical characteristics of the transistor 801 can be improved.

For example, the insulating layer 819 functions as a barrier layer and at least one of the insulating layers 811, 812, and 814 functions as a barrier layer. The barrier layer can be formed using a material such as aluminum oxide, aluminum oxynitride, gallium oxide, gallium oxynitride, yttrium oxide, yttrium oxynitride, hafnium oxide, hafnium oxynitride, or silicon nitride.

A structure example of the insulating layers 811 to 818 is described. In this example, each of the insulating layers 811, 812, 815, and 819 functions as a barrier layer. The insulating layers 816 to 818 are oxide layers containing excess oxygen. The insulating layer 811 is formed using silicon nitride. The insulating layer 812 is formed using aluminum oxide. The insulating layer 813 is formed using silicon oxynitride. The insulating layers 814 to 816 functioning as the gate insulating layers on the back gate electrode side are formed using a stack including silicon oxide, aluminum oxide, and silicon oxide. The insulating layer 817 functioning as the gate insulating layer on the front gate side is formed using silicon oxynitride. The insulating layer 818 functioning as the interlayer insulating layer is formed using silicon oxide. The insulating layer 819 is formed using aluminum oxide.

Examples of a conductive material used for the conductive layers 850 to 853 include a metal such as molybdenum, titanium, tantalum, tungsten, aluminum, copper, chromium, neodymium, or scandium; and a metal nitride containing any of the above metals as its component (e.g., tantalum nitride, titanium nitride, molybdenum nitride, or tungsten nitride). A conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can be used.

A structure example of the conductive layers 850 to 853 is described. The conductive layer 850 is a single layer of tantalum nitride or tungsten. Alternatively, the conductive layer 850 is a stack including tantalum nitride, tantalum, and tantalum nitride. The conductive layer 851 is formed with a single layer of tantalum nitride, or a stack including tantalum nitride and tungsten. The structure of the conductive layer 852 is the same as that of the conductive layer 851. The conductive layer 853 is formed using tantalum nitride. The conductor is formed using tungsten.

In order to reduce the off-state current of the transistor 801, for example, the energy gap of the metal oxide film 822 is preferably large. The energy gap of the metal oxide film 822 is greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV.

The oxide layer 830 preferably exhibits crystallinity. At least the metal oxide film 822 preferably exhibits crystallinity. With the structure described above, the transistor 801 can have high reliability and favorable electrical characteristics.

As the oxide of the metal oxide film 822, for example, an In—Ga oxide, an In—Zn oxide, or an In-M-Zn oxide (M is Al, Ga, Y, or Sn) can be used. The metal oxide film 822 is not limited to the oxide layer containing indium. The metal oxide film 822 can be formed using a Zn—Sn oxide, a Ga—Sn oxide, or a Zn—Mg oxide, for example. The metal oxide films 821, 823, and 824 can be formed using an oxide that is similar to the oxide of the metal oxide film 822. In particular, each of the metal oxide films 821, 823 and 824 can be formed with a Ga oxide.

When an interface state is formed at the interface between the metal oxide film 822 and the metal oxide film 821, a channel formation region is formed also in the vicinity of the interface, which causes a change in the threshold voltage of the transistor 801. It is preferable that the metal oxide film 821 contain at least one of the metal elements contained in the metal oxide film 822 as its component. Accordingly, an interface state is unlikely to be formed at the interface between the metal oxide film 822 and the metal oxide film 821, and variations in the electrical characteristics of the transistor 801, such as the threshold voltage, can be reduced.

The metal oxide film 824 preferably contains at least one of the metal elements contained in the metal oxide film 822 as its component because interface scattering is unlikely to occur at the interface between the metal oxide film 822 and the metal oxide film 824, and carrier transfer is not inhibited. Thus, the field-effect mobility of the transistor 801 can be increased.

It is preferable that the metal oxide film 822 have the highest carrier mobility among the metal oxide films 821 to 824. Accordingly, a channel can be formed in the metal oxide film 822 that is apart from the insulating layers 816 and 817.

For example, in a metal oxide containing In such as an In-M-Zn oxide, carrier mobility can be increased by an increase in the In content. In the In-M-Zn oxide, the s orbital of heavy metal mainly contributes to carrier transfer, and when the indium content is increased, overlaps of the s orbitals of In atoms are increased; therefore, an oxide having a high content of indium has higher mobility than an oxide having a low content of indium. Therefore, an oxide having a high content of indium is used as the metal oxide film, so that carrier mobility can be increased.

Thus, for example, the metal oxide film 822 is formed using an In—Ga—Zn oxide, and the metal oxide films 821 and 823 are formed using a Ga oxide. For example, when the metal oxide films 821 to 823 are formed using an In-M-Zn oxide, the In content of the metal oxide film 822 is made higher than the In content of the metal oxide films 821 and 823. In the case where the In-M-Zn oxide is formed by a sputtering method, the In content can be changed by a change in the atomic ratio of metal elements of a target.

For example, it is preferable that the atomic ratio of metal elements of a target used for depositing the metal oxide film 822 be In:M:Zn=1:1:1, 3:1:2, or 4:2:4.1. For example, it is preferable that the atomic ratio of metal elements of a target used for depositing the metal oxide films 821 and 823 be In:M:Zn=1:3:2, or 1:3:4. The atomic ratio of an In-M-Zn oxide deposited using a target of In:M:Zn=4:2:4.1 is approximately In:M:Zn=4:2:3.

In order that the transistor 801 can have stable electrical characteristics, it is preferable to reduce the concentration of impurities in the oxide layer 830. In the metal oxide, hydrogen, nitrogen, carbon, silicon, and a metal element other than a main component are impurities. For example, hydrogen and nitrogen form donor states to increase the carrier density. In addition, silicon and carbon total impurity states in the metal oxide. The impurity states serve as traps and might cause the electrical characteristics of the transistor to deteriorate.

For example, the oxide layer 830 includes a region where the concentration of silicon is lower than or equal to $2\times10^{18}$ atoms/cm$^3$, preferably lower than or equal to $2\times10^{17}$ atoms/cm$^3$. The same applies to the concentration of carbon in the oxide layer 830.

The oxide layer 830 includes a region where the concentration of an alkali metal is lower than or equal to $1\times10^{18}$ atoms/cm$^3$, preferably lower than or equal to $2\times10^{16}$ atoms/cm$^3$. The same applies to the concentration of an alkaline earth metal in the metal oxide film 822.

The oxide layer 830 includes a region where the concentration of hydrogen is lower than $1\times10^{20}$ atoms/cm$^3$, preferably lower than $1\times10^{19}$ atoms/cm$^3$, more preferably lower than $5\times10^{18}$ atoms/cm$^3$, more preferably lower than $1\times10^{18}$ atoms/cm$^3$.

The above concentrations of the impurities in the metal oxide film 822 are measured by SIMS.

In the case where the metal oxide film 822 contains oxygen vacancies, donor states are formed by entry of hydrogen into sites of oxygen vacancies in some cases. The oxygen vacancy is a factor in decreasing the on-state current of the transistor 801. Note that sites of oxygen vacancies become more stable by entry of oxygen than by entry of hydrogen. Thus, by reducing oxygen vacancies in the metal oxide film 822, the on-state current of the transistor 801 can be increased in some cases. Consequently, preventing entry of hydrogen into sites of oxygen vacancies by a reduction in hydrogen in the metal oxide film 822 is effective in improving on-state current characteristics.

Hydrogen contained in a metal oxide reacts with oxygen bonded to a metal atom to be water, and thus causes an oxygen vacancy, in some cases. Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, the transistor 801 is likely to be normally-on when the metal oxide film 822 contains hydrogen because the metal oxide film 822 includes a channel formation region. Accordingly, it is preferable that hydrogen in the metal oxide film 822 be reduced as much as possible.

FIGS. 26A to 26C illustrate an example in which the oxide layer 830 has a four-layer structure; however, one embodiment of the present invention is not limited thereto. For example, the oxide layer 830 can have a three-layer structure without the metal oxide film 821 or without the metal oxide film 823. Alternatively, the oxide layer 830 may include one or more metal oxide films that are similar to the metal oxide films 821 to 824 at two or more of the following positions: between given layers in the oxide layer 830, over the oxide layer 830, and below the oxide layer 830.

Figure 27:
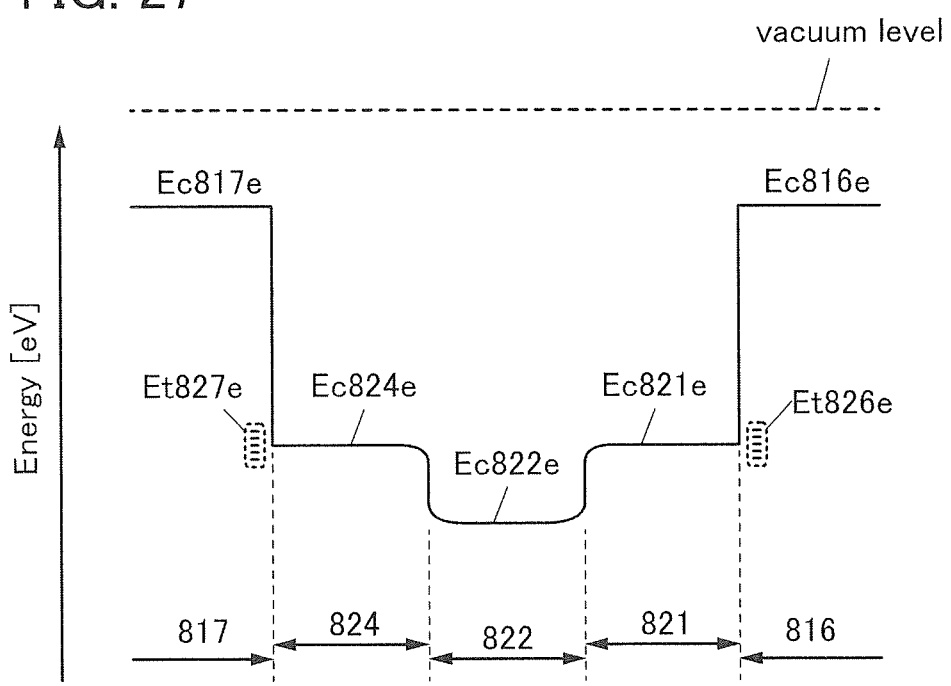
FIG. 27 illustrates an energy band structure.

Effects of the stack including the metal oxide films 821, 822, and 824 are described with reference to FIG. 27. FIG. 27 is a schematic diagram showing the energy band structure of a channel formation region of the transistor 801.

In FIG. 27, Ec816e, Ec821e, Ec822e, Ec824e, and Ec817e indicate the energy of the conduction band minimums of the insulating layer 816, the metal oxide film 821, the metal oxide film 822, the metal oxide film 824, and the insulating layer 817, respectively.

Here, the energy difference between the vacuum level and the conduction band minimum (the difference is also referred to as electron affinity) corresponds to a value obtained by subtracting an energy gap from the energy difference between the vacuum level and the valence band maximum (the difference is also referred to as an ionization potential). The energy gap can be measured using a spectroscopic ellipsometer (UT-300 manufactured by HORIBA JOBIN YVON S.A.S.). The energy difference between the vacuum level and the valence band maximum can be measured using an ultraviolet photoelectron spectroscopy (UPS) device (VersaProbe manufactured by ULVAC-PHI, Inc.).

Since the insulating layers 816 and 817 are insulators, Ec816e and Ec817e are closer to the vacuum level than Ec821e, Ec822e, and Ec824e (i.e., the insulating layers 816 and 817 have lower electron affinities than the metal oxide films 821, 822, and 824).

The metal oxide film 822 has a higher electron affinity than the metal oxide films 821 and 824. For example, the difference in electron affinity between the metal oxide films 822 and 821 and the difference in electron affinity between the metal oxide films 822 and 824 are each greater than or equal to 0.07 eV and less than or equal to 1.3 eV, preferably greater than or equal to 0.1 eV and less than or equal to 0.7 eV, more preferably greater than or equal to 0.15 eV and less than or equal to 0.4 eV. Note that the electron affinity refers to an energy difference between the vacuum level and the conduction band minimum.

When voltage is applied to the gate electrode (the conductive layer 850) of the transistor 801, a channel is mainly formed in the metal oxide film 822 having the highest electron affinity among the metal oxide films 821, 822, and 824.

An indium gallium oxide has a small electron affinity and a high oxygen-blocking property. Therefore, the metal oxide film 824 preferably includes an indium gallium oxide. The gallium atomic ratio [Ga/(In+Ga)] is, for example, higher than or equal to 70%, preferably higher than or equal to 80%, more preferably higher than or equal to 90%.

In some cases, there is a mixed region of the metal oxide films 821 and 822 between the metal oxide films 821 and 822. Furthermore, in some cases, there is a mixed region of the metal oxide films 824 and 822 between the metal oxide films 824 and 822. Because the mixed region has a low interface state density, a region with a stack formed with the metal oxide films 821, 822, and 824 has a band structure where energy at each interface and in the vicinity of the interface is changed continuously (continuous junction).

Electrons transfer mainly through the metal oxide film 822 in the oxide layer 830 having such an energy band structure. Therefore, even when an interface state exists at the interface between the metal oxide film 821 and the insulating layer 812 or the interface between the metal oxide film 824 and the insulating layer 813, electron transfer in the oxide layer 830 is less likely to be inhibited and the on-state current of the transistor 801 can be increased.

Although trap states Et826e and Et827e due to impurities or defects might be formed in the vicinity of the interface between the metal oxide film 821 and the insulating layer 816 and the vicinity of the interface between the metal oxide film 824 and the insulating layer 817 as illustrated in FIG. 27, the metal oxide film 822 can be separated from the trap states Et826e and Et827e owing to the existence of the metal oxide films 821 and 824.

Note that when a difference between Ec821e and Ec822e is small, an electron in the metal oxide film 822 might reach the trap state Et826e by passing over the difference in energy. Since the electron is trapped at the trap state Et826e, negative fixed charge is generated at the interface with the insulating film, causing the threshold voltage of the transistor to be shifted in a positive direction. The same applies to the case where a difference in energy between Ec822e and Ec824e is small.

Each of the difference in energy between Ec821e and Ec822e and the difference in energy between Ec824e and Ec822e is preferably greater than or equal to 0.1 eV, more preferably greater than or equal to 0.15 eV so that a change in the threshold voltage of the transistor 801 can be reduced and the transistor 801 can have favorable electrical characteristics.

Note that the transistor 801 does not necessarily include a back gate electrode.

<Metal Oxide>

Next, a metal oxide that can be used in the OS transistor is described. In particular, the details of a metal oxide and a cloud-aligned composite (CAC)-OS are described below.

A CAC-OS or a CAC metal oxide has a conducting function in part of the material and has an insulating function in another part of the material; as a whole, the CAC-OS or the CAC metal oxide has a function of a semiconductor. In the case where the CAC-OS or the CAC metal oxide is used in a channel formation region of a transistor, the conducting function allows electrons (or holes) serving as carriers to flow, and the insulating function prevents electrons serving as carriers from flowing. By the complementary action of the conducting function and the insulating function, the CAC-OS or the CAC metal oxide can have a switching function (on/off function). In the CAC-OS or CAC-metal oxide, separation of the functions can maximize each function.

The CAC-OS or the CAC metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. The conductive regions are observed to be coupled in a cloud-like manner with their boundaries blurred, in some cases.

Furthermore, in the CAC-OS or the CAC metal oxide, the conductive regions and the insulating regions each have a size greater than or equal to 0.5 nm and less than or equal to 10 nm, preferably greater than or equal to 0.5 nm and less than or equal to 3 nm and are dispersed in the material, in some cases.

The CAC-OS or the CAC metal oxide includes components having different bandgaps. For example, the CAC-OS or the CAC metal oxide includes a component having a wide gap due to the insulating region and a component having a narrow gap due to the conductive region. In the case of such a composition, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS or the CAC metal oxide is used in a channel formation region of a transistor, high current drive capability in the on state of the transistor, that is, a high on-state current and high field-effect mobility, can be obtained.

In other words, the CAC-OS or the CAC-metal oxide can be called a matrix composite or a metal matrix composite.

The CAC-OS has, for example, a composition in which elements included in a metal oxide are unevenly distributed. The unevenly distributed elements each have a size greater than or equal to 0.5 nm and less than or equal to 10 nm, preferably greater than or equal to 1 nm and less than or equal to 2 nm, or a similar size. Note that in the following description of a metal oxide, a state in which one or more metal elements are unevenly distributed and regions including the metal element(s) are mixed is referred to as a mosaic pattern or a patch-like pattern. The regions each have a size greater than or equal to 0.5 nm and less than or equal to 10 nm, preferably greater than or equal to 1 nm and less than or equal to 2 nm, or a similar size.

Note that a metal oxide preferably contains at least indium. In particular, indium and zinc are preferably contained. In addition, one or more of aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC-OS, an In—Ga—Zn oxide with the CAC composition (such an In—Ga—Zn oxide may be particularly referred to as CAC-IGZO) has a composition in which materials are separated into indium oxide (InO$_{X1}$, where X1 is a real number greater than 0) or indium zinc oxide (In$_{X2}$Zn$_{Y2}$O$_{Z2}$, where X2, Y2, and Z2 are real numbers greater than 0), and gallium oxide (GaO$_{X3}$, where X3 is a real number greater than 0), gallium zinc oxide (Ga$_{X4}$Zn$_{Y4}$O$_{Z4}$, where X4, Y4, and Z4 are real numbers greater than 0), or the like, and a mosaic pattern is formed. Then, InO$_{X1}$ or In$_{X2}$Zn$_{Y2}$O$_{Z2}$ forming the mosaic pattern is evenly distributed in the film. This composition is also referred to as a cloud-like composition.

That is, the CAC-OS is a composite metal oxide with a composition in which a region including GaO$_{X3}$ as a main component and a region including In$_{X2}$Zn$_{Y2}$O$_{Z2}$ or InO$_{X1}$ as a main component are mixed. Note that in this specification, for example, when the atomic ratio of In to an element M in a first region is greater than the atomic ratio of In to an element M in a second region, the first region has higher In concentration than the second region.

Note that a compound including In, Ga, Zn, and O is also known as IGZO. Typical examples of IGZO include a crystalline compound represented by InGaO$_3$(ZnO)$_{m1}$ (m1 is a natural number) and a crystalline compound represented by In$_{(1+x0)}$Ga$_{(1-x0)}$O$_3$(ZnO)$_{m0}$ (−1≤x0≤1; m0 is a given number).

The above crystalline compounds have a single crystal structure, a polycrystalline structure, or a c-axis-aligned crystalline (CAAC) structure. Note that the CAAC structure is a crystal structure in which a plurality of IGZO nanocrystals have c-axis alignment and are connected in the a-b plane direction without alignment.

On the other hand, the CAC-OS relates to the material composition of a metal oxide. In a material composition of a CAC-OS including In, Ga, Zn, and O, nanoparticle regions including Ga as a main component are observed in part of the CAC-OS and nanoparticle regions including In as a main component are observed in part thereof. These nanoparticle regions are randomly dispersed to form a mosaic pattern. Therefore, the crystal structure is a secondary element for the CAC-OS.

Note that in the CAC-OS, a stacked-layer structure including two or more films with different compositions is not included. For example, a two-layer structure of a film including In as a main component and a film including Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases.

In the case where one or more of aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions including the selected metal element(s) as a main component(s) are observed in part of the CAC-OS and nanoparticle regions including In as a main component are observed in part thereof, and these nanoparticle regions are randomly dispersed to form a mosaic pattern in the CAC-OS.

The CAC-OS can be formed by a sputtering method under conditions where a substrate is not heated intentionally, for example. In the case of forming the CAC-OS by a sputtering method, one or more selected from an inert gas (typically, argon), an oxygen gas, and a nitrogen gas may be used as a deposition gas. The ratio of the flow rate of an oxygen gas to the total flow rate of the deposition gas at the time of deposition is preferably as low as possible, and for example, the flow ratio of an oxygen gas is preferably higher than or equal to 0% and lower than 30%, more preferably higher than or equal to 0% and low than or equal to 10%.

The CAC-OS is characterized in that no clear peak is observed in measurement using θ/2θ scan by an out-of-plane method, which is an X-ray diffraction (XRD) measurement method. That is, X-ray diffraction shows no alignment in the a-b plane direction and the c-axis direction in a measured region.

In an electron diffraction pattern of the CAC-OS which is obtained by irradiation with an electron beam with a probe diameter of 1 nm (also referred to as a nanometer-sized electron beam), a ring-like region with a high luminance and a plurality of bright spots in the ring-like region are observed. Therefore, the electron diffraction pattern indicates that the crystal structure of the CAC-OS includes a nanocrystal (nc) structure with no alignment in plan-view and cross-sectional directions.

For example, an energy dispersive X-ray spectroscopy (EDX) mapping image confirms that an In—Ga—Zn oxide with the CAC composition has a structure in which a region including $GaO_{X3}$ as a main component and a region including $In_{X2}Zn_{Y2}O_{Z2}$ or $InO_{X1}$ as a main component are unevenly distributed and mixed.

The CAC-OS has a structure different from that of an IGZO compound in which metal elements are evenly distributed, and has characteristics different from those of the IGZO compound. That is, in the CAC-OS, regions including $GaO_{X3}$ or the like as a main component and regions including $In_{X2}Zn_{Y2}O_{Z2}$ or $InO_{X1}$ as a main component are separated to form a mosaic pattern.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through regions including $In_{X2}Zn_{Y2}O_{Z2}$ or $InO_{X1}$ as a main component, the conductivity of an oxide semiconductor is exhibited. Accordingly, when regions including $In_{X2}Zn_{Y2}O_{Z2}$ or $InO_{X1}$ as a main component are distributed in an oxide semiconductor like a cloud, high field-effect mobility ($\mu$) can be achieved.

In contrast, the insulating property of a region including $GaO_{X3}$ or the like as a main component is higher than that of a region including $In_{X2}Zn_{Y2}O_{Z2}$ or $InO_{X1}$ as a main component. In other words, when regions including $GaO_{X3}$ or the like as a main component are distributed in an oxide semiconductor, leakage current can be suppressed and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby high on-state current ($I_{on}$) and high field-effect mobility ($\mu$) can be achieved.

A semiconductor element including a CAC-OS has high reliability. Thus, the CAC-OS is suitably used in a variety of semiconductor devices.

This embodiment can be combined with any of the other embodiments as appropriate.

Embodiment 7

In this embodiment, electronic devices to which the semiconductor device, the display device, or the display system of one embodiment of the present invention can be applied will be described.

The display device of one embodiment of the present invention can achieve high visibility regardless of the intensity of external light. Therefore, the display device of one embodiment of the present invention can be favorably used in portable electronic devices, wearable electronic devices (wearable devices), e-book readers, and the like. FIGS. 28A to 28D illustrate examples of an electronic device including the display device of one embodiment of the present invention.

Figure 28A:
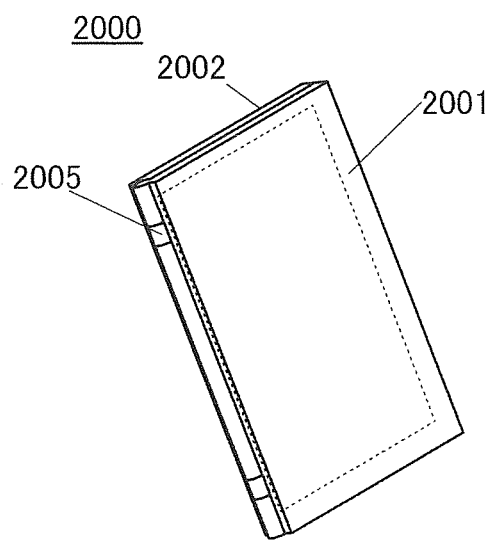
FIGS. 28A to 28D illustrate structure examples of electronic devices.
Figure 28B:
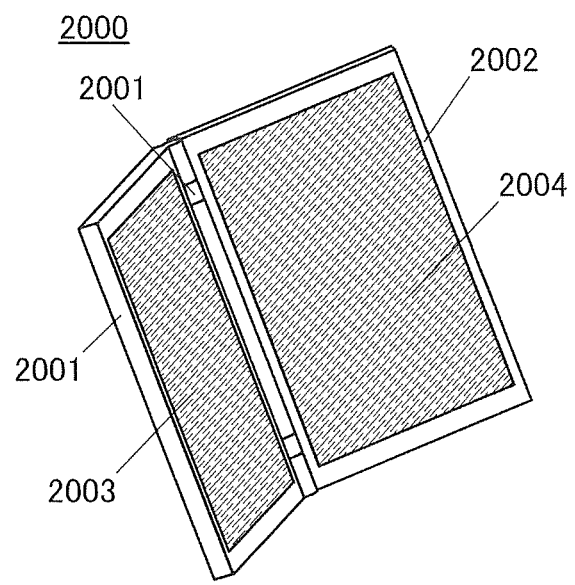

FIGS. 28A and 28B illustrate an example of a portable information terminal 2000. The portable information terminal 2000 includes a housing 2001, a housing 2002, a display portion 2003, a display portion 2004, a hinge portion 2005, and the like.

The housing 2001 and the housing 2002 are connected with the hinge portion 2005. The portable information terminal 2000 folded as in FIG. 28A can be changed into the state illustrated in FIG. 28B, in which the housing 2001 and the housing 2002 are opened.

For example, the portable information terminal 2000 can also be used as an e-book reader, in which the display portion 2003 and the display portion 2004 can each display text data. In addition, the display portion 2003 and the display portion 2004 can each display a still image or a moving image. Furthermore, the display portion 2003 may be provided with a touch panel.

In this manner, the portable information terminal 2000 has high versatility because it can be folded when carried.

Note that the housing 2001 and the housing 2002 may include a power switch, an operation button, an external connection port, a speaker, a microphone, and/or the like.

Note that the portable information terminal 2000 may have a function of identifying a character, a figure, or an image using a touch sensor provided in the display portion 2003. In that case, learning in the following mode becomes possible, for example: an answer is written with a finger, a stylus pen, or the like on an information terminal that displays a workbook or the like for studying mathematics or for learning language, and then the portable information terminal 2000 determines whether the answer is correct. The portable information terminal 2000 may have a function of performing speech interpretation. In that case, for example, the portable information terminal 2000 can be used in learning a foreign language. Such a portable information terminal is suitable for use as a teaching material such as a textbook, a notebook, or the like.

Figure 28C:
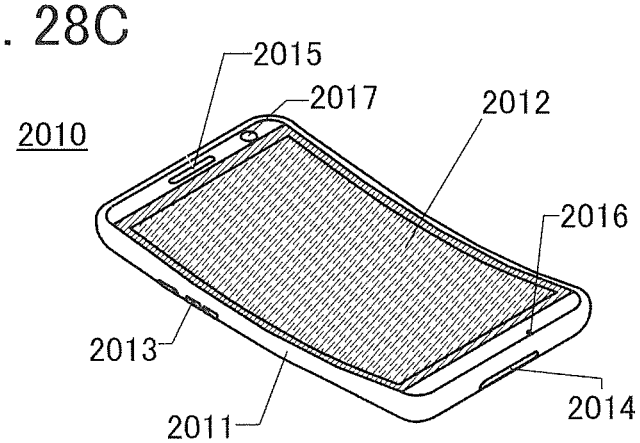

FIG. 28C illustrates an example of a portable information terminal. A portable information terminal 2010 illustrated in FIG. 28C includes a housing 2011, a display portion 2012, an operation button 2013, an external connection port 2014, a speaker 2015, a microphone 2016, a camera 2017, and the like.

The portable information terminal 2010 includes a touch sensor in the display portion 2012. Operations such as making a call and inputting a letter can be performed by touch on the display portion 2012 with a finger, a stylus, or the like.

With the operation button 2013, power on or off can be switched. In addition, types of images displayed on the display portion 2012 can be switched; for example, switching images from a mail creation screen to a main menu screen is performed.

When a sensing device such as a gyroscope sensor or an acceleration sensor is provided inside the portable information terminal 2010, the direction of display on the screen of the display portion 2012 can be automatically changed by determining the orientation of the portable information terminal 2010 (whether the portable information terminal 2010 is placed horizontally or vertically). Furthermore, the direction of display on the screen can be changed by touch on the display portion 2012, operation with the operation button 2013, sound input using the microphone 2016, or the like.

The portable information terminal 2010 functions as, for example, one or more of a telephone set, a notebook, and an information browsing system. For example, the portable information terminal 2010 can be used as a smartphone. The portable information terminal 2010 is capable of executing a variety of applications such as mobile phone calls, e-mailing, viewing and editing texts, music reproduction, reproducing a moving image, Internet communication, and computer games, for example.

Figure 28D:
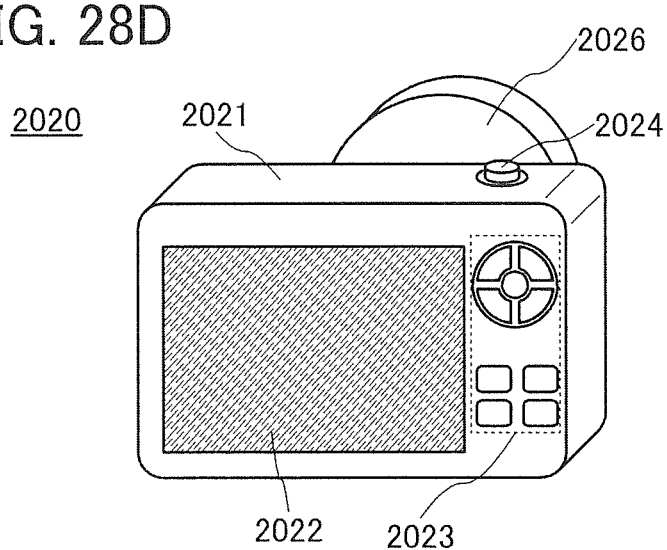

FIG. 28D illustrates an example of a camera. A camera 2020 includes a housing 2021, a display portion 2022, operation buttons 2023, a shutter button 2024, and the like. Furthermore, a detachable lens 2026 is attached to the camera 2020.

Although the lens 2026 of the camera 2020 here is detachable from the housing 2021 for replacement, the lens 2026 may be included in the housing.

Still and moving images can be taken with the camera 2020 at the press of the shutter button 2024. In addition, images can be taken at the touch of the display portion 2022 which serves as a touch panel.

Note that a stroboscope, a viewfinder, and the like can be additionally attached to the camera 2020. Alternatively, these components may be included in the housing 2021.

The display system described in the above embodiment can be provided in any of the electronic devices illustrated in FIGS. 28A to 28D. The electronic devices can incorporate a processor corresponding to the host 14 illustrated in FIG. 19.

This embodiment can be combined with any of the other embodiments as appropriate.

REFERENCE NUMERALS

10: display system, 11: display portion, 12: signal generation portion, 13: sensor portion, 14: host, 20: controller, 30: image processing circuit, 40: driver circuit, 50: power supply circuit, 51: converter circuit, 52: amplifier circuit, 60: memory circuit, 61: register portion, 62: register, 70: pixel, 80: switch circuit, 90: display unit, 120: retention circuit, 130: selector, 140: flip-flop circuit, 141: inverter, 146: inverter, 147: analog switch, 148: analog switch, 151: inverter, 153: inverter, 154: clocked inverter, 155: analog switch, 156: buffer, 200: pixel portion, 201: pixel group, 202: pixel, 203: pixel unit, 210: driver circuit, 220: circuit, 301: interface, 302: frame memory, 303: timing controller, 304: sensor controller, 305: clock generation circuit, 306: touch sensor controller, 307: touch sensor unit, 311: dimming circuit, 312: toning circuit, 313: gamma correction circuit, 314: EL correction circuit, 350: memory device, 351: control portion, 352: cell array, 353: peripheral circuit, 354: sense amplifier circuit, 355: driver circuit, 356: main amplifier, 357: input/output circuit, 358: memory cell, 601: source line driver circuit, 602: pixel portion, 603: gate line driver circuit, 604: sealing substrate, 605: sealant, 607: space, 608: lead wiring, 610: element substrate, 611: switching FET, 612: current controlling FET, 613: electrode, 614: insulator, 616: EL layer, 617: electrode, 618: light-emitting element, 623: FET, 624: FET, 701: substrate, 702: base insulating film, 703: gate insulating film, 706: gate electrode, 707: gate electrode, 708: gate electrode, 720: interlayer insulating film, 721: interlayer insulating film, 722: electrode, 724: first electrode, 725: partition, 728: EL layer, 729: second electrode, 731: sealing substrate, 732: sealant, 733: base material, 734: coloring layer, 737: interlayer insulating film, 740: pixel portion, 741: driver circuit portion, 742: peripheral portion, 801: transistor, 811: insulating layer, 812: insulating layer, 813: insulating layer, 814: insulating layer, 815: insulating layer, 816: insulating layer, 817: insulating layer, 818: insulating layer, 819: insulating layer, 820: insulating layer, 821: metal oxide film, 822: metal oxide film, 823: metal oxide film, 824: metal oxide film, 830: oxide layer, 850: conductive layer, 851: conductive layer, 852: conductive layer, 853: conductive layer, 1000: display module, 1001: upper cover, 1002: lower cover, 1003: FPC, 1004: touch panel, 1005: FPC, 1006: display device, 1009: frame, 1010: printed circuit board, 1011: battery, 2000: portable information terminal, 2001: housing, 2002: housing, 2003: display portion, 2004: display portion, 2005: hinge portion, 2010: portable information terminal, 2011: housing, 2012: display portion, 2013: operation button, 2014: external connection port, 2015: speaker, 2016: microphone, 2017: camera, 2020: camera, 2021: housing, 2022: display portion, 2023: operation button, 2024: shutter button, 2026: lens This application is based on Japanese Patent Application Serial No. 2016-237876 filed with Japan Patent Office on Dec. 7, 2016, the entire contents of which are hereby incorporated by reference.

The invention claimed is:

1. A semiconductor device comprising:

a signal generation portion comprising:

a power supply circuit;

an image processing circuit;

a memory device; and a controller; and a display portion comprising a light-emitting element, wherein the power supply circuit is configured to generate a potential to be supplied to the light-emitting element, wherein the image processing circuit is configured to perform image processing on image data, wherein the memory device is configured to sequentially store a first parameter and a second parameter, wherein the controller is configured to change the first parameter and the second parameter stored in the memory device, in accordance with a display condition of an image displayed on the display portion, wherein the power supply circuit is configured to generate the potential with use of the first parameter output from the memory device, and wherein the image processing circuit is configured to perform the image processing with use of the second parameter output from the memory device, wherein the first parameter and the second parameter are output from the memory device simultaneously.

2. The semiconductor device according to claim 1, wherein the memory device comprises a first register portion and a second register portion, wherein first data corresponding to the first parameter and second data corresponding to the second parameter are sequentially input to the second register portion, wherein the second register portion is configured to transmit the first data and the second data to the first register portion at one time, and wherein the first register portion is configured to output the first data to the power supply circuit and output the second data to the image processing circuit at one time.

3. The semiconductor device according to claim 2, wherein the second register portion comprises a transistor and a capacitor, wherein one of a source and a drain of the transistor is electrically connected to the capacitor, and wherein the transistor comprises a metal oxide in a channel formation region.

4. The semiconductor device according to claim 1, wherein the image processing circuit is configured to perform the image processing with use of a dimming circuit, a toning circuit, and a gamma correction circuit, and wherein the second parameter is used in the dimming circuit, the toning circuit, and the gamma correction circuit.

5. The semiconductor device according to claim 1, wherein the first parameter is changed in accordance with at least one of intensity of external light, content of an image displayed on the display portion, and setting by a user who views the image, and wherein the second parameter is changed in accordance with at least one of the intensity of the external light, the content of the image displayed on the display portion, and the setting by a user who views the image.

6. A display system comprising the semiconductor device according to claim 1, wherein the display portion comprises:

a first display unit comprising a first pixel; and a second display unit comprising a second pixel, wherein the first pixel comprises the light-emitting element, and wherein the second pixel comprises a reflective liquid crystal element.

7. An electronic device comprising:

the display system according to claim 6; and a host, wherein the host comprises a processor configured to control operation of the signal generation portion.

* * * * *